US011869405B2

(12) United States Patent
Jin et al.

(10) Patent No.: US 11,869,405 B2
(45) Date of Patent: Jan. 9, 2024

(54) DISPLAY PANEL AND DISPLAY DEVICE

(71) Applicant: Shanghai AVIC Optoelectronics Co., Ltd., Shanghai (CN)

(72) Inventors: Huijun Jin, Shanghai (CN); Tinghai Wang, Shanghai (CN); Dandan Qin, Shanghai (CN)

(73) Assignee: Shanghai Avic Optoelectronics Co., Ltd., Shanghai (CN)

( * ) Notice: Subject to any disclaimer, the term of this patent is extended or adjusted under 35 U.S.C. 154(b) by 0 days.

(21) Appl. No.: 18/103,678

(22) Filed: Jan. 31, 2023

(65) Prior Publication Data

US 2023/0177994 A1 Jun. 8, 2023

(30) Foreign Application Priority Data

Jun. 28, 2022 (CN) .......................... 202210750851.2

(51) Int. Cl.
*G09G 3/20* (2006.01)
*G11C 19/28* (2006.01)
*H01L 27/12* (2006.01)

(52) U.S. Cl.
CPC ............... *G09G 3/20* (2013.01); *G11C 19/28* (2013.01); *G09G 2310/0202* (2013.01); *G09G 2310/0286* (2013.01); *H01L 27/124* (2013.01)

(58) Field of Classification Search
None
See application file for complete search history.

(56) References Cited

U.S. PATENT DOCUMENTS

| | | | | |
|---|---|---|---|---|
| 11,238,805 B2* | 2/2022 | Feng | ..................... | G09G 3/3225 |
| 11,610,524 B2* | 3/2023 | Luo | ..................... | G11C 19/287 |
| 2022/0076618 A1* | 3/2022 | Lai | ..................... | G09G 3/3266 |
| 2022/0238056 A1* | 7/2022 | Liu | ..................... | G06F 3/0443 |
| 2023/0043196 A1* | 2/2023 | Xie | ..................... | G11C 19/28 |
| 2023/0107029 A1* | 4/2023 | Wang | ..................... | G11C 19/28 |
| | | | | 345/206 |

FOREIGN PATENT DOCUMENTS

| | | | |
|---|---|---|---|
| CN | 106409200 B | 1/2020 | |
| CN | 107967888 B | 1/2021 | |

\* cited by examiner

*Primary Examiner* — Matthew Yeung
(74) *Attorney, Agent, or Firm* — KDW Firm PLLC

(57) ABSTRACT

Provided display panel includes display region and non-display region. The display region includes display units arranged in array and scan signal lines. At least part display units in same row share respective scan signal line. The non-display region includes shift register circuit and connection lines. The shift register circuit includes cascaded shift register unit groups each including at least two shift register units each including signal input terminal, reset control terminal, and signal output terminal. Signal output terminal of first shift register unit in (i+1)-th shift register unit group electrically connected to signal input terminal of respective shift register unit in (i+2)-th shift register unit group through same connection line. Signal output terminal of second shift register unit in (i+1)-th shift register unit group electrically connected to reset control terminal of respective shift register unit in i-th shift register unit group through same connection line. i is positive integer.

25 Claims, 27 Drawing Sheets

DISPLAY PANEL AND DISPLAY DEVICE

CROSS-REFERENCE TO RELATED APPLICATION(S)

This application claims priority to Chinese Patent Application No. 202210750851.2 filed Jun. 28, 2022, the disclosure of which is incorporated herein by reference in its entirety.

TECHNICAL FIELD

The present disclosure relates the field of display technologies and, in particular, to a display panel and a display device.

BACKGROUND

Currently, a shift register circuit is disposed in a non-display region of a display panel. The shift register circuit includes shift register units corresponding to scan signal lines in a display region of the display panel. A scan signal is provided to each scan signal line through a respective shift register unit to scan display units in the display region of the display panel row by row.

However, in the related art, the shift register units in the shift register circuit are connected in a complicated manner, causing that a relatively large space is needed for placing connection lines among the shift register units, which adversely affects the narrow bezel of the display panel.

SUMMARY

The present disclosure provides a display device of a display panel to simplify the connection among shift register units in a shift register circuit, facilitating the narrow bezel of the display panel.

Embodiments of the present disclosure provide a display panel which includes a display region and a non-display region.

The display region includes multiple display units arranged in an array and multiple scan signal lines. At least two of the multiple display units in a same row share a respective scan signal line.

The non-display region includes a shift register circuit and multiple connection lines. The shift register circuit includes multiple cascaded shift register unit groups. Each shift register unit group includes at least two shift register units. A shift register unit includes a signal input terminal, a reset control terminal, and a signal output terminal.

Each shift register unit group includes a first shift register unit and a second shift register unit. Among any three consecutive shift register unit groups, a signal output terminal of a first shift register unit in an (i+1)-th shift register unit group is electrically connected to a signal input terminal of each shift register unit in an (i+2)-th shift register unit group through the same connection line. A signal output terminal of a second shift register unit in the (i+1)-th shift register unit group is electrically connected to a reset control terminal of each shift register unit in an i-th shift register unit group through the same connection line, where i is a positive integer.

The signal output terminal of each shift register unit is electrically connected to a respective scan signal line, and a scan signal enable level output from the signal output terminal of each shift register unit is sequentially shifted.

Embodiments of the present disclosure provide a display device including the preceding display panel.

BRIEF DESCRIPTION OF DRAWINGS

To illustrate technical solutions in embodiments of the present disclosure more clearly, drawings used in description of the embodiments will be briefly described below.

DETAILED DESCRIPTION

The solutions in embodiments of the present disclosure will be described clearly and completely in connection with the drawings in the embodiments of the present disclosure from which the solutions of the present disclosure will be better understood by those skilled in the art.

It is to be noted that the terms "first", "second" and the like in the description, claims, and drawings of the present disclosure are used to distinguish between similar objects and are not necessarily used to describe a particular order or sequence. It is to be understood that the data used in this way is interchangeable where appropriate so that the embodiments of the present disclosure described herein may also be implemented in a sequence not illustrated or described herein. In addition, terms "comprising", "including" and any other variations thereof are intended to encompass a non-exclusive inclusion. For example, a product or device that includes a series of structures or units not only includes the expressly listed structures or units but may also include other structures or units that are not expressly listed or are inherent to such product or device.

In the related art, each shift register unit of a shift register circuit disposed in a non-display region of a display panel sequentially provides a scan signal enable level to a respective scan signal line in a display region of the display panel. To satisfy the display requirements of the high-quality display panel, shift register units in the shift register circuit are not sequentially cascaded, but are cascaded at intervals so that before the scan signal enable level output from a previous shift register unit ends, a subsequent shift register unit is ready to output the scan signal enable level. The cascaded manner of the shift register units in the shift register circuit is up to the control manner of the shift register circuit.

Figure 1:
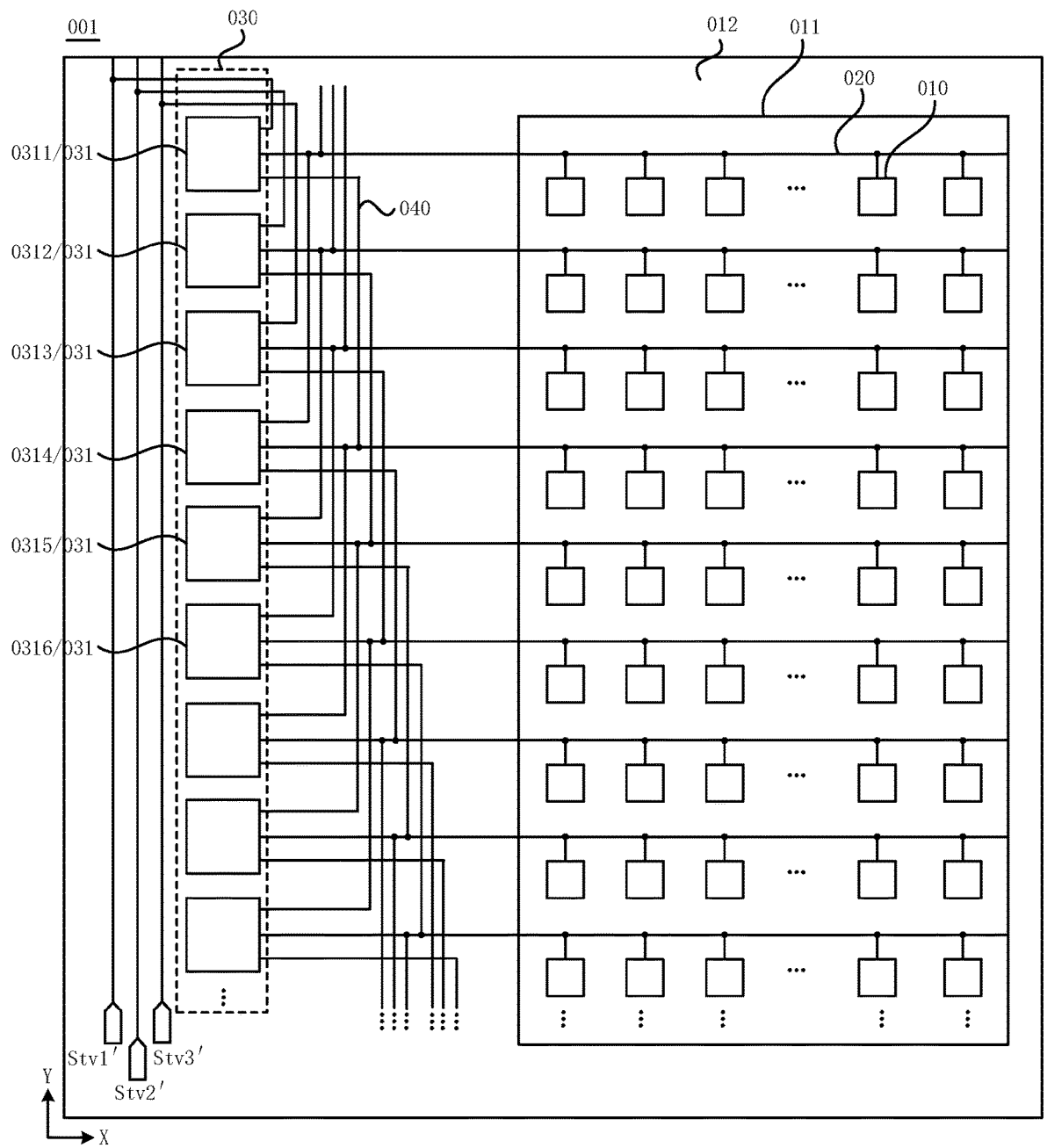
FIG. 1 is a schematic diagram of a display panel in the related art.

In an example, a case where shift register units in the shift register circuit are cascaded at an interval of two shift register units is taken as an example. FIG. 1 is a schematic diagram of a display panel in the related art. As shown in FIG. 1, in the related art, a display panel 001 includes a display region 011 and a non-display region 012. The display region 011 is provided with multiple display units 010 arranged in an array and multiple scan signal lines 020. The non-display region 012 is provided with a shift register circuit 030 and multiple connection lines 040. The shift register circuit 030 includes multiple shift register units 031. A signal input terminal of a first shift register unit 0311, a signal input terminal of a second shift register unit 0312, and a signal input terminal of a third shift register unit 0313 receive different start pulse signals Stv1', Stv2', and Stv3' through different connection lines, respectively. A signal output terminal of the first shift register unit 0311 is electrically connected to a signal input terminal of a fourth shift register unit 0314 through one connection line. A signal output terminal of the second shift register unit 0312 is electrically connected to a signal input terminal of a fifth shift register unit 0315 through one connection line. A signal output terminal of the third shift register unit 0313 is electrically connected to a signal input terminal of a sixth shift register unit 0316 through one connection line. Starting from the fourth shift register unit 0314, a signal output terminal of an i-th shift register unit 031$i$ is electrically connected to a reset control terminal of an (i−3)-th shift register unit 03$i$-3 and a signal input terminal of an (i+3)-th shift register unit through connection lines separately.

In this manner, in the related art, each shift register unit needs to be electrically connected to at least three connection lines. For three consecutive shift register units, nine connection lines need to be provided in the non-display region. For N shift register units, 3*N connection lines electrically connected to the shift register units need to be provided in the non-display region. Therefore, the non-display region is required to be provided with a relatively large amount of connection lines. To ensure that the connection lines do not affect each other, it is needed to consider the wiring manner of the large amount of connection lines, increasing the wiring complexity and adversely affecting the low cost of the display panel. Meanwhile, since a relatively large amount of connection lines need to be provided, a relatively large space is needed to arrange the connection lines in an arrangement direction X of the connection lines, making the non-display region have a relatively large size in the direction X, thereby making the display panel have a relatively large bezel size, and thus not facilitating the narrow bezel of the display panel.

Embodiments of the present disclosure provides a display panel. The display panel includes a display region and a non-display region. The display region includes multiple display units arranged in an array and multiple scan signal lines. At least two of the multiple display units in a same row share a respective scan signal line. The non-display region includes a shift register circuit and multiple connection lines. The shift register circuit includes multiple cascaded shift register unit groups. Each shift register unit group includes at least two shift register units. Each shift register unit includes a signal input terminal, a reset control terminal, and a signal output terminal. Each shift register unit group includes a first shift register unit and a second shift register unit. Among any three consecutive shift register unit groups, a signal output terminal of a first shift register unit in an (i+1)-th shift register unit group is electrically connected to a signal input terminal of each shift register unit in an (i+2)-th shift register unit group through the same connection line. A signal output terminal of a second shift register unit in the (i+1)-th shift register unit group is electrically connected to a reset control terminal of each shift register unit in an i-th shift register unit group through the same connection line. i is a positive integer. The signal output terminal of each shift register unit is also electrically connected to a respective scan signal line. A scan signal enable level output from the signal output terminal of each shift register unit is sequentially shifted.

According to the preceding solutions, in the shift register circuit in the non-display region, a signal output terminal of the first shift register unit in each shift register unit group is electrically connected to a signal input terminal of each shift register unit in a subsequent shift register unit group through one connection line. A signal output terminal of the second shift register unit in each shift register unit group is electrically connected to a reset control terminal of each shift register unit in a previous shift register unit group through one connection line. In this manner, in the same shift register unit group, a signal input terminal of each shift register unit is electrically connected to the same first shift register unit. In the same shift register unit group, a reset control terminal of each shift register unit is electrically connected to the same second shift register unit. Compared with that the shift register units in each shift register unit group is electrically connected to the shift register units in the previous shift register unit group or the subsequent shift register unit group in a one-to-one correspondence, the connection relationship among the shift register units in each shift register unit group can be simplified, facilitating simplifying the wiring manner of the connection lines in the non-display region while reducing the number of arranged connection lines, facilitating reducing the size of the area for the connection lines to be arranged in in the non-display region, and facilitating the narrow bezel of the display panel.

Figure 2:
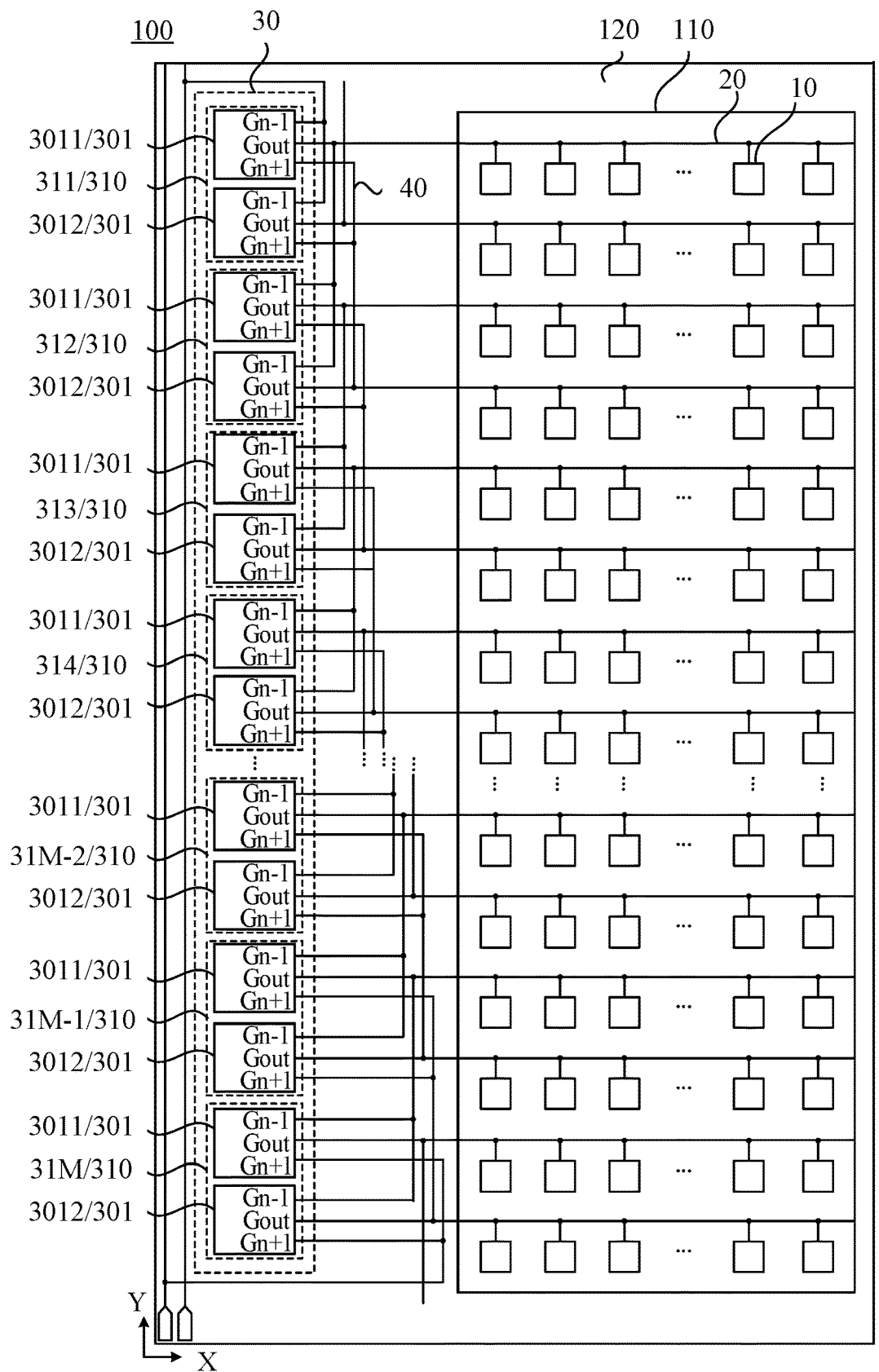
FIG. 2 is a schematic diagram of a display panel according to an embodiment of the present disclosure.

FIG. 2 is a schematic diagram of a display panel according to an embodiment of the present disclosure. As shown in FIG. 2, the display panel 100 includes a display region 110 and a non-display region 120. The display region 110 includes multiple display units 10 arranged in an array and multiple scan signal lines 20. At least two of the multiple display units 10 located in the same row share a respective scan signal line 20. That is, at least two of the multiple display units 10 located in the same row is electrically connected to the same scan signal line 20.

The display panel 100 may be a self-luminous display panel. In this case, a display unit 10 may include a pixel drive circuit and a light-emitting element. The pixel drive circuit may include at least one transistor. A scan signal transmitted through the scan signal line 20 can control ON or OFF of the at least one transistor in the pixel drive circuit to control the working process of the pixel drive circuit, making the pixel drive circuit drive the light-emitting element to emit light, and the display panel display corresponding images. The light-emitting element includes, but is not limited to, an organic light-emitting diode (OLED), a micro-LED, and a mini-LED display panel. The display panel 100 may also be a non-self-luminous display panel, such as a liquid crystal display panel. In this case, a backlight module is required to provide the display panel 100 with a light source and multiple data lines intersecting and insulated from the scan signal lines 20. The display unit 10 may include a pixel circuit, a pixel electrode, a common electrode, a liquid crystal layer, and a filter color resist. The pixel circuit may include a transistor. The scan signal transmitted through the scan signal line 20 may control ON or OFF of the transistor of the pixel circuit and can provide a data voltage to the pixel electrode when the transistor is on, making an electric field generated between the pixel electrode and the common electrode to drive liquid crystal molecules of the liquid crystal layer to twist, making the light source provided by the backlight module, after being transmitted through the liquid crystal layer, filtered by the filter color resist, thereby making each display unit 10 emit light of a specific color, and the display panel display corresponding images.

The non-display region 120 of the display panel 100 is provided with a shift register circuit 30 and multiple connection lines 40. The shift register circuit 30 includes multiple cascaded shift register unit groups 310. Each shift register unit group 310 includes at least two shift register units 301. A shift register unit 301 of the at least two shift register units 301 includes a signal input terminal Gn−1, a reset control terminal Gn+1, and a signal output terminal Gout. Each shift register unit group 310 includes a first shift register unit 3011 and a second shift register unit 3012. Among any three consecutive the multiple shift register unit groups 310, a signal output terminal Gout of a first shift register unit 3011 in an (i+1)-th shift register unit group is electrically connected to a signal input terminal Gn−1 of each shift register unit 301 in an (i+2)-th shift register unit group through the same connection line 40. A signal output terminal of a second shift register unit 3012 in the (i+1)-th shift register unit group is electrically connected to a reset control terminal Gn+1 of each shift register unit 301 in an i-th shift register unit group through the same connection line 40. i is a positive integer. The signal output terminal Gout of each shift register unit 301 is electrically connected to a respective scan signal line 20. A scan signal enable level output from the signal output terminal Gout of each shift register unit 301 is sequentially shifted.

In an example, the case where each shift register unit group 310 includes two shift register units 301, and the two shift register units 301 are a first shift register unit 3011 and a second shift register unit 3012 respectively is taken as an example. When i=1, the i-th shift register unit group is a first shift register unit group 311, the (i+1)-th shift register unit group is a second shift register unit group 312, and the (i+2)-th shift register unit group is a third shift register unit group 313. In this case, a signal output terminal Gout of a first shift register unit 3011 of the second shift register unit group 312 is electrically connected to signal input terminals Gn−1 of two shift register units 301 in the third shift register unit group 313 through the same connection line 40. A signal output terminal Gout of a second shift register unit 3012 of the second shift register unit group 312 is electrically connected to reset control terminals Gn+1 of two shift register units 301 in the first shift register unit group 311 through the same connection line 40. When i=2, the i-th shift register unit group is the second shift register unit group 312, the (i+1)-th shift register unit group is the third shift register unit group 313, and the (i+2)-th shift register unit group is a fourth shift register unit group 314. In this case, a signal output terminal Gout of a first shift register unit 3011 of the third shift register unit group 313 is electrically connected to signal input terminals Gn−1 of two shift register units 301 in the fourth shift register unit group 314 through the same connection line 40. A signal output terminal Gout of a second shift register unit 3012 of the third shift register unit group 313 is electrically connected to reset control terminals Gn+1 of two shift register units 301 of the second shift register unit group 312 through the same connection line 40. Same alike, the signal output terminal Gout of the first shift register unit 3011 in each shift register unit group 310 is electrically connected to signal input terminals Gn−1 of shift register units in a subsequent shift register unit group through one connection line 40. The signal output terminal Gout of the second shift register unit 3012 in each shift register unit group 310 is electrically connected to reset control terminals Gn+1 of shift register units in a previous shift register unit group through one connection line 40. In this way, it is feasible to simplify the connection relationship among the shift register units 301, thereby simplifying the structure of the shift register circuit 30, facilitating simplifying the structure of the display panel 100, reducing the design difficulty of the display panel 100, and facilitating the low cost of the display panel 100. Meanwhile, in the same shift register unit group 310, signal input terminals Gn−1 of the shift register units 301 are electrically connected to the same connection line 40. In the same shift register unit group 310, reset control terminals Gn+1 of the shift register units 301 are electrically connected to the same connection line 40. Therefore, it is not needed to provide the connection lines to the signal input terminal and the reset control terminal of each shift register unit, respectively, reducing the number of connection lines 40 provided in the non-display region 120, reducing the space occupied by the connection lines 40 in the non-display region 120, reducing the size of the non-display region 120, and in particular, significantly reducing the size of the non-display region 120 in the arrangement direction X of the connection lines 40, thereby facilitating the narrow bezel of the display panel 100.

It is to be understood that in the embodiments of the present disclosure, each shift register unit 301 includes at least the signal input terminal Gn−1, the reset control terminal Gn+1, and the signal output terminal Gout. In addition, each shift register unit 301 may also include other structures. On the premise that the embodiments of the present disclosure can be implemented, the structure of each shift register unit 301 is not limited.

Figure 3:
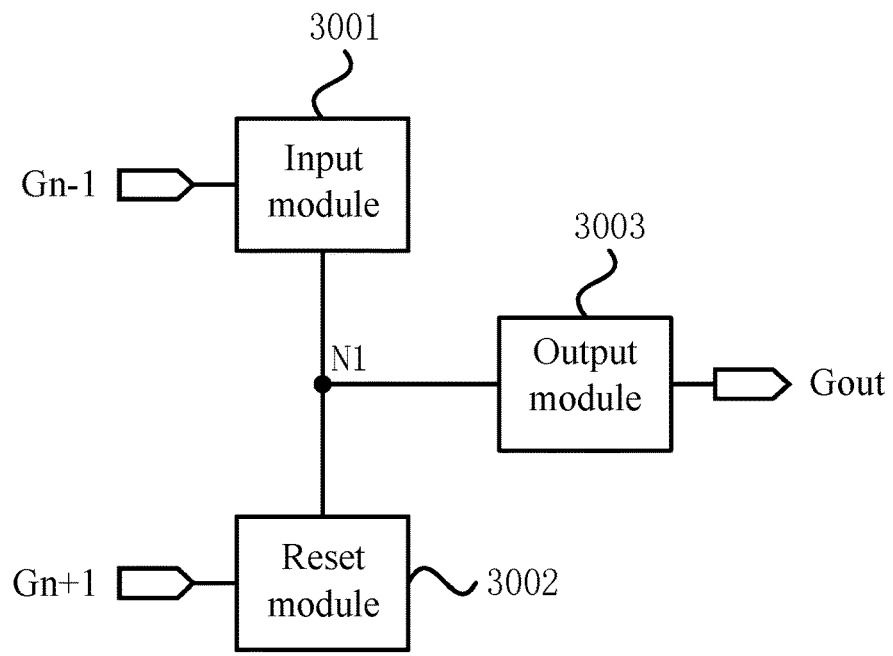
FIG. 3 is a schematic diagram of a shift register unit according to an embodiment of the present disclosure.
Figure 4:
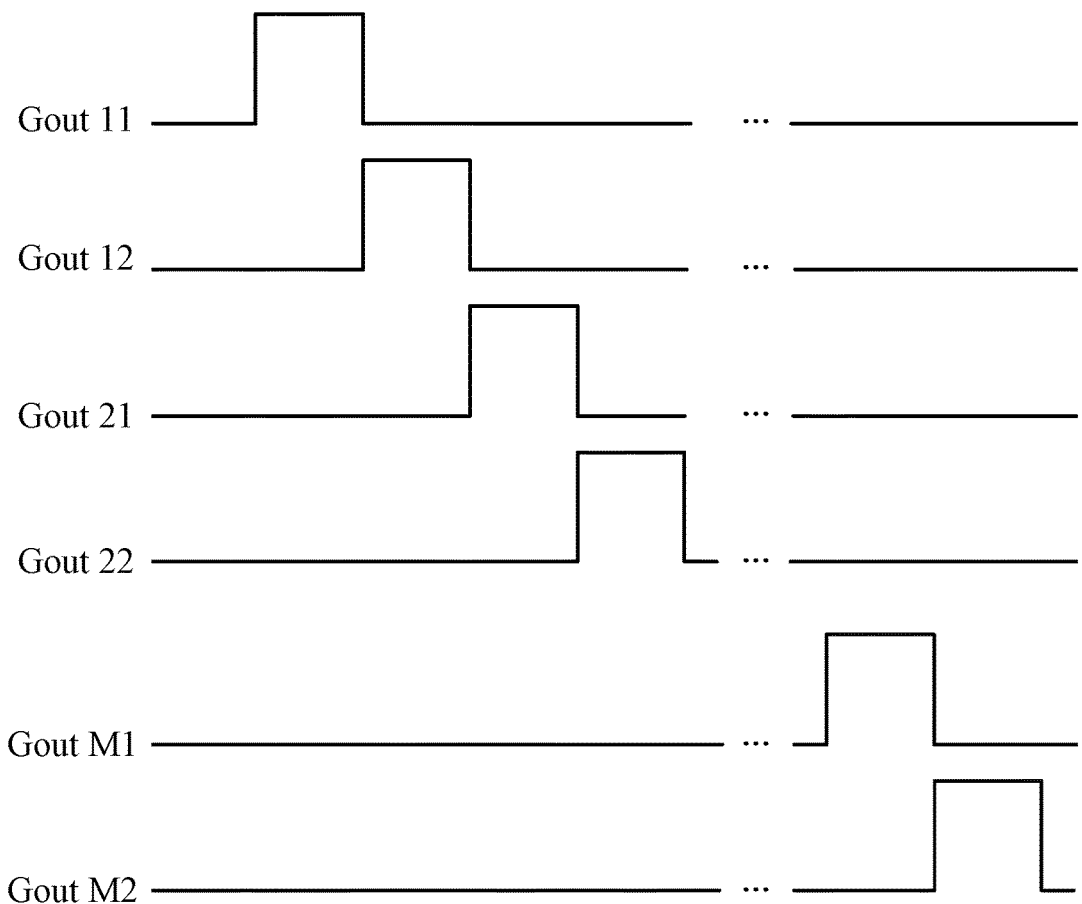
FIG. 4 is a timing diagram of a scan signal of a shift register circuit according to an embodiment of the present disclosure.

In an example, FIG. 3 is a schematic diagram of a shift register unit according to an embodiment of the present disclosure. FIG. 4 is a timing diagram of a scan signal of a shift register circuit according to an embodiment of the present disclosure. Referring to FIGS. 2, 3, and 4, the shift register unit 301 includes the signal input terminal Gn−1, the reset control terminal Gn+1, the signal output terminal Gout, an input module 3001, a reset module 3002, and an output module 3003. In the same shift register unit 301, the input module 3001 is electrically connected to both the signal input terminal Gn−1 and the output module 3003. The input module 3001 and the output module 3003 are both electrically connected to a first node N1. The reset module 3002 is electrically connected to both the reset control terminal Gn+1 and the output module 3003. The reset module 3002 and the output module 3003 are both electrically connected to the first node N1. The output module 3003 is also electrically to the signal output terminal Gout. In this case, a signal from the signal input terminal Gn−1 may control the input module 3001 to provide an enable level to the first node N1. A signal from the reset control terminal Gn+1 may control the reset module 3002 to provide a disable level to the first node N1. The output module 3003 may control, under the control of the enable level at the first node N1, a period of the scan signal enable level output from the signal output terminal Gout, and control, under the control of the disable level at the first node N1, a period of the scan signal disable level output from the signal output terminal Gout. That is, the signal input terminal Gn−1 can control the period of the scan signal enable level output from the signal output terminal Gout. The reset control terminal Gn+1 can control the period of the scan signal disable level output from the signal output terminal Gout. In this way, a scan signal output from the first shift register unit 3011 in the (i+1)-th shift register unit group 312 can control a period of the enable level of a scan signal output from each shift register unit 301 in the (i+2)-th shift register unit group 313. A scan signal output from the second shift register unit 3012 in the (i+1)-th shift register unit group 312 can control a period of the disable level of a scan signal output from each shift register unit 301 in the i-th shift register unit group 311. In this case, each shift register unit 301 in the shift register circuit 30 can provide the scan signal to the respective scan signal line 20 electrically connected to each shift register unit 301. The scan signal enable level (Gout11, Gout12, Gout21, Gout22, . . . , GoutM1, and GoutM2) output from each of signal output terminals Gout of the shift register units 301 is sequentially shifted. That is, in the shift register unit groups 310, the start time of the scan signal enable level (Gout11, Gout12) output from the shift register units 301 in the previous shift register unit group 311 is before the start time of the scan signal enable level (Gout21, Gout22) output from the shift register units 301 in the subsequent shift register unit group 312. The end time of the scan signal enable level (Gout11, Gout12) output from the shift register units 301 in the previous shift register unit group 311 may be before the end time of the scan signal enable level (Gout21, Gout22) output from the shift register units 301 in the subsequent shift register unit group 312. Meanwhile, the case where each shift register unit group 310 includes two shift register units 301. The two shift register units 301 are the first shift register unit 3011 and the second shift register unit 3012 respectively is taken as an example. In the same shift register unit group 310, the start time of the scan signal enable level (Gout11, Gout21, . . . , and GoutM1) output from first shift register units 3011 may be before the start time of the scan signal enable level (Gout12, Gout22, . . . , and GoutM2) output from second shift register units 3012. The end time of the scan signal enable level (Gout11, Gout21, . . . , and GoutM1) output from the first shift register units 3011 may be before the end time of the scan signal enable level (Gout12, Gout22, . . . , and GoutM2) output from the second shift register units 3012. In this way, when each shift register unit 301 sequentially provides the scan signal enable level to the respective scan signal line 20 electrically connected to each shift register unit 301, the scan signal transmitted through the scan signal line 20 can control the transistor in the display unit 10 to be turned on row by row to control the display units in each row to sequentially display and emit light.

When the transistor in the display unit 10 is an N-type transistor, the scan signal enable level output from the signal output terminal Gout of the shift register unit 301 is a high level. When the transistor in the display unit 10 is a P-type transistor, the scan signal enable level output from the signal output terminal Gout of the shift register unit 301 is a low level. For ease of description, in the embodiments of the present disclosure, the case where the scan signal enable level is a high level is taken as an example to describe the solutions in the embodiments of the present disclosure. It is to be understood that the above only shows the structure of the shift register unit 301 in an example. In the embodiments of the present disclosure, the structure of the shift register unit 301 is not limited thereto. On the premise that the shift register unit 301 includes the signal input terminal Gn−1, the reset control terminal Gn+1, and the signal output terminal Gout, and the scan signal enable level output from each shift register unit 301 can be sequentially shifted in the preceding connection mode, the structure of the shift register unit 301 is not limited in the embodiments of the present disclosure.

In addition, in the embodiments of the present disclosure, since each shift register unit group 310 includes the first shift register unit 3011 and the second shift register unit 3012, the above only shows the connection relationship between the first shift register unit 3011 and the second shift register unit 3012 in each shift register unit group 310 located between the first shift register unit group 311 and the last shift register unit group 31M and other shift register units in an example. The connection situation of the first shift register unit 3011 and the second shift register unit 3012 in each of the first shift register unit group 311 and the last shift register unit group 31M can be set according to actual requirements and is not limited in the embodiments of the present disclosure.

In an embodiment, referring to FIG. 2, a signal input terminal Gn−1 of each shift register unit 301 in the first shift register unit group 311 may receive a start pulse signal Stv1 through the same connection line 40. A signal output terminal Gout of the first shift register unit 3011 in the first shift register unit group 311 is electrically connected to signal input terminals Gn−1 of the shift register units 301 in the second shift register unit group 312 through the same connection line 40. A reset control terminal Gn+1 of each shift register unit 301 in the last shift register unit group 31M is configured to receive a reset pulse signal Stv2 through the same connection line 40. A signal output terminal Gout of the second shift register unit 3012 in the last shift register unit group 31M is electrically connected to reset control terminals Gn+1 of the shift register units 301 in the previous shift register unit group 31M-1. In this case, the start pulse signal Stv1 can control the period of the scan signal enable level output from each shift register unit 301 in the first shift register unit group 312. The reset pulse signal Stv2 can control the period of the scan signal disable level output from each shift register unit 301 in the last shift register unit group 31M. Meanwhile, the scan signal output from the first shift register unit 3011 in the first shift register unit group 312 can control the period of the scan signal enable level output from each shift register unit 301 in the second shift register unit group. The scan signal output from each shift register unit 301 in the last shift register unit group 31M can control the period of the scan signal disable level output from each shift register unit 301 in the previous shift register unit group 31M-1.

In addition, the signal input terminal Gn−1 of each shift register unit 301 in the first shift register unit group 311 is configured to receive the start pulse signal Stv1 through the same connection line 40. In this manner, the number of start pulse signals Stv1 provided to the shift register circuit 30 can be reduced. That is, the number of signal terminals in a driver chip (not shown in the figure) providing the start pulse signals Stv1 is reduced, thereby facilitating simplifying the structure of the driver chip, reducing the cost of the driver chip, and reducing the cost of the display panel. Similarly, the reset control terminal Gn+1 of each shift register unit 301 in the last shift register unit group 31M is configured to receive the reset pulse signal Stv2 through the same connection line 40 so that the number of reset pulse signals Stv2 provided to the shift register circuit 30 can be reduced. That is, the number of signal terminals in the driver chip providing the reset pulse signal Stv2 is reduced, thereby facilitating simplifying the structure of the driver chip, reducing the cost of the driver chip, and also facilitating the low cost of the display panel.

Figure 5:
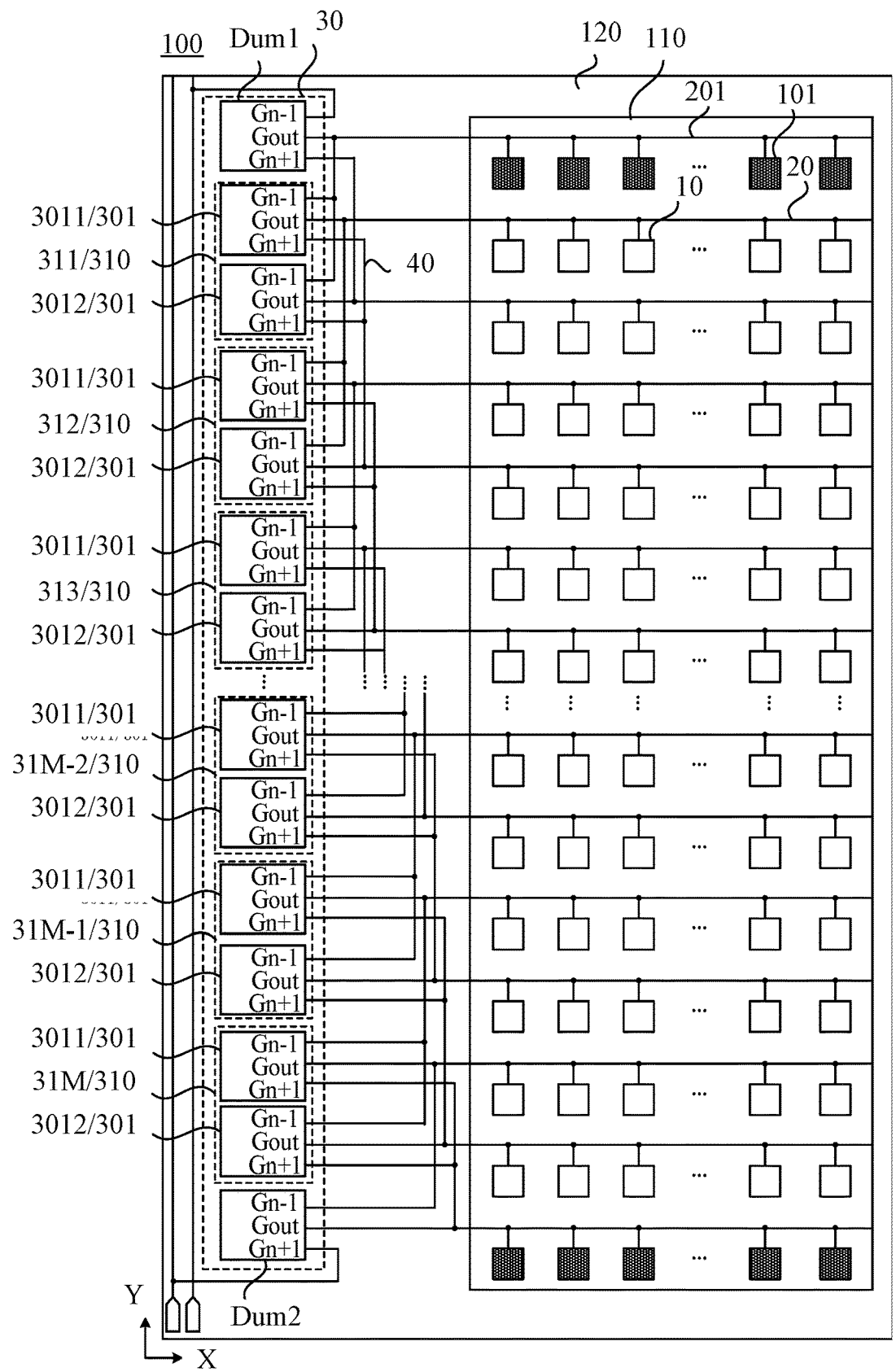
FIG. 5 is another schematic diagram of a display panel according to an embodiment of the present disclosure.

In another embodiment, FIG. 5 is another schematic diagram of a display panel according to an embodiment of the present disclosure. As shown in FIG. 5, the shift register circuit 30 may also include a first virtual shift unit Dum1 and a second virtual shift unit Dum2 In this case, a signal output terminal Gout of a first shift register unit 3011 in a first shift register unit group 311 is electrically connected to signal input terminals of shift register units 301 in a second shift register unit group 312 through the same connection line 40. A signal output terminal Gout of a second shift register unit 3012 of the first shift register unit group 311 is electrically connected to a reset control terminal Gn+1 of the first virtual shift unit Dum1 through the connection line 40. A signal output terminal Gout of a first shift register unit 3011 in a last shift register unit group 31M is electrically connected to a signal input terminal Gn−1 of the second virtual shift unit Dum2. A signal output terminal Gout of a second shift register unit 3012 in the last shift register unit group 31M is electrically connected to reset control terminals Gn+1 of shift register units 301 in a previous shift register unit 31M-1 through the same connection line 40. A signal input terminal Gn−1 of the first virtual shift unit Dum1 is configured to receive the start pulse signal Stv1 through the connection line 40. A reset control terminal Gn+2 of the second virtual shift unit Dum2 is configured to receive the reset pulse signal Stv2 through the connection line. A signal output terminal Gout of the first virtual shift unit Dum1 and a signal output terminal of the second virtual shift unit Dum2 are electrically connected to virtual signal lines 201 in the display region 110, respectively. In this case, the display region 110 may also be provided with virtual display units 101. The virtual display unit 101 has a structure similar to that of the display unit 10 capable of normally displaying and emitting light, however the virtual display unit 101 does not display and emit the light. The structure of the first virtual shift unit Dum1 or the second virtual shift unit Dum2 may be similar to the structure of the shift register unit 301, or may be similar to the structure of the shift register unit group 310. The structure of the first virtual shift unit Dum1 or the second virtual shift unit Dum2 can be designed according to actual requirements and is not limited in the embodiments of the present disclosure.

It is to be understood that although the display panel shown in FIG. 5 and the display panel shown in FIG. 2 have different structures, they have similar principles of displaying and emitting light. Similarities may be understood with reference to the preceding description and are not repeated herein. For ease of description, the case where a signal input terminal Gn−1 of each shift register unit 301 in the first shift register unit group 311 directly receives the start pulse signal Stv1 through the connection line 40, and a reset control terminal Gn+1 of each shift register unit 301 in the last shift register unit group 31M directly receives the reset pulse signal Stv2 through the connection line 40 is taken as an example to describe the solutions of the embodiments of the present disclosure.

Figure 6:
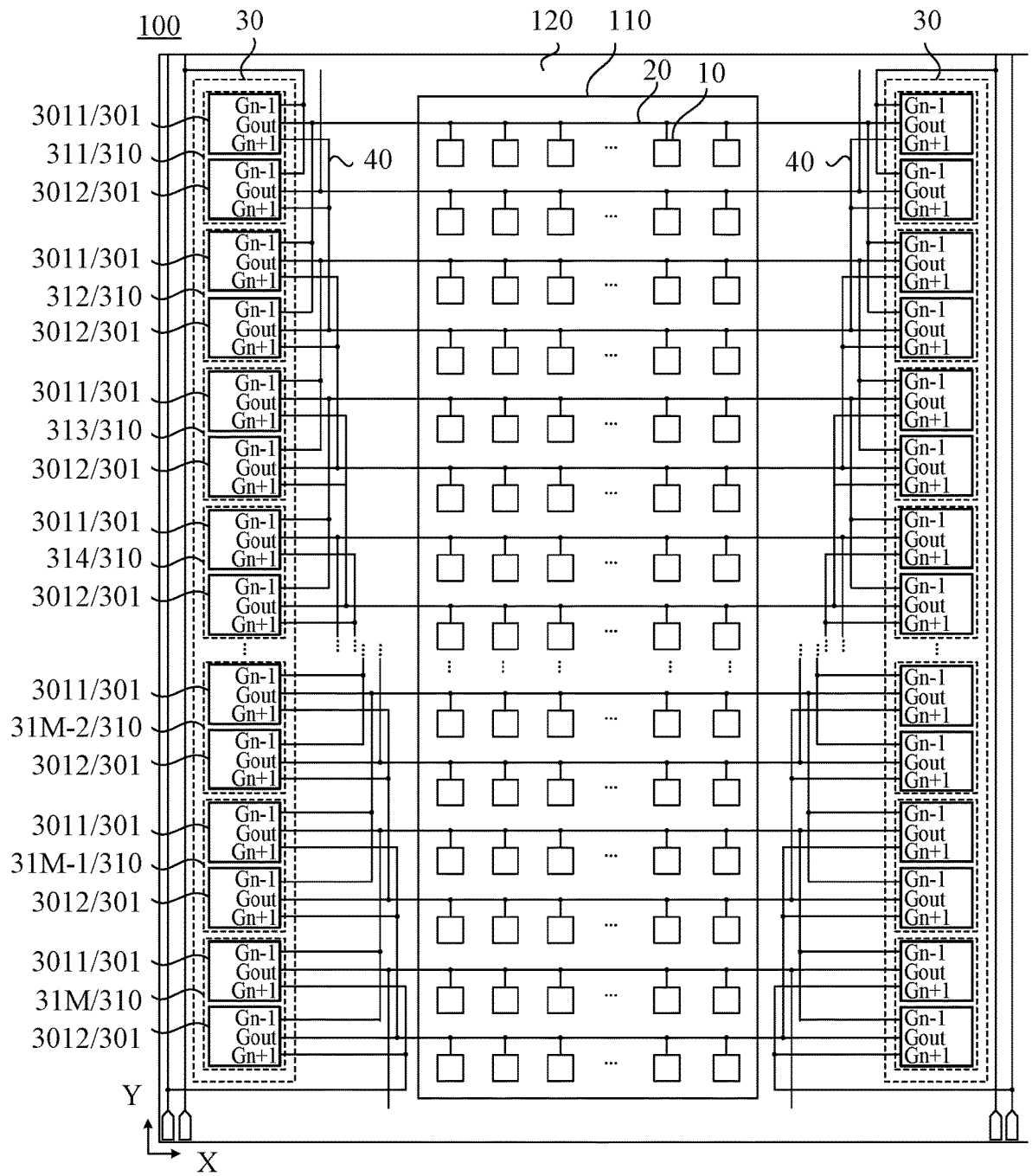
FIG. 6 is another schematic diagram of a display panel according to an embodiment of the present disclosure.

It is to be noted that the shift register circuit 30 is located on one side of the display region 110 shown in FIGS. 2 and 5. However, in the embodiments of the present disclosure, the arrangement of the shift register circuit 30 is not limited thereto. In an example embodiment, as shown in FIG. 6, the display panel 100 may include two shift register circuits 30. The two shift register circuits 30 are symmetrically disposed on two opposite sides of the display region 110. In this case, each scan signal line 20 may be electrically connected to two shift register units 301 located on two opposite sides of the display region 110 so that the two shift register units 301 can simultaneously provide scan signals to each scan signal line 20, thereby improving the drive capability of the scan signal transmitted through the scan signal line 20. Meanwhile, when the two shift register circuits 30 are symmetrically disposed on two opposite sides of the display region 110, it is feasible to make the non-display region 120 on two sides of the display region 110 have a symmetrical structure so that the display panel 100 has a symmetrical bezel structure, facilitating improving the aesthetics of the display panel 100. In another example embodiment, in the two shift register circuits respectively located on two opposite sides of the display region, shift register units of one shift register circuit may be electrically connected to scan signal lines electrically connected to display units in odd-th rows in a one-to-one correspondence; while shift register units of the other shift register circuit may be electrically connected to scan signal lines electrically connected to display units in even-th rows in a one-to-one correspondence. In this case, it is feasible to make the display panel have a symmetrical bezel structure, facilitating improving the aesthetics of the display panel.

For ease of description, the case where the shift register circuit is located on one side of the display region in the display panel is taken as an example to describe the solutions of the embodiments of the present disclosure.

It is to be understood that FIGS. 2, 5, and 6 only in an example show the case where each shift register unit group 310 includes only the first shift register unit 3011 and the second shift register unit 3012 to describe the embodiments of the present disclosure. However, in the embodiments of the present disclosure, each shift register unit group includes at least two shift register units. That is, the shift register unit group may include not only the first shift register unit and the second shift register unit, but also other shift register units. The arrangement of the shift register unit group can be designed according to actual situations and is not limited in the embodiments of the present disclosure.

Figure 7:
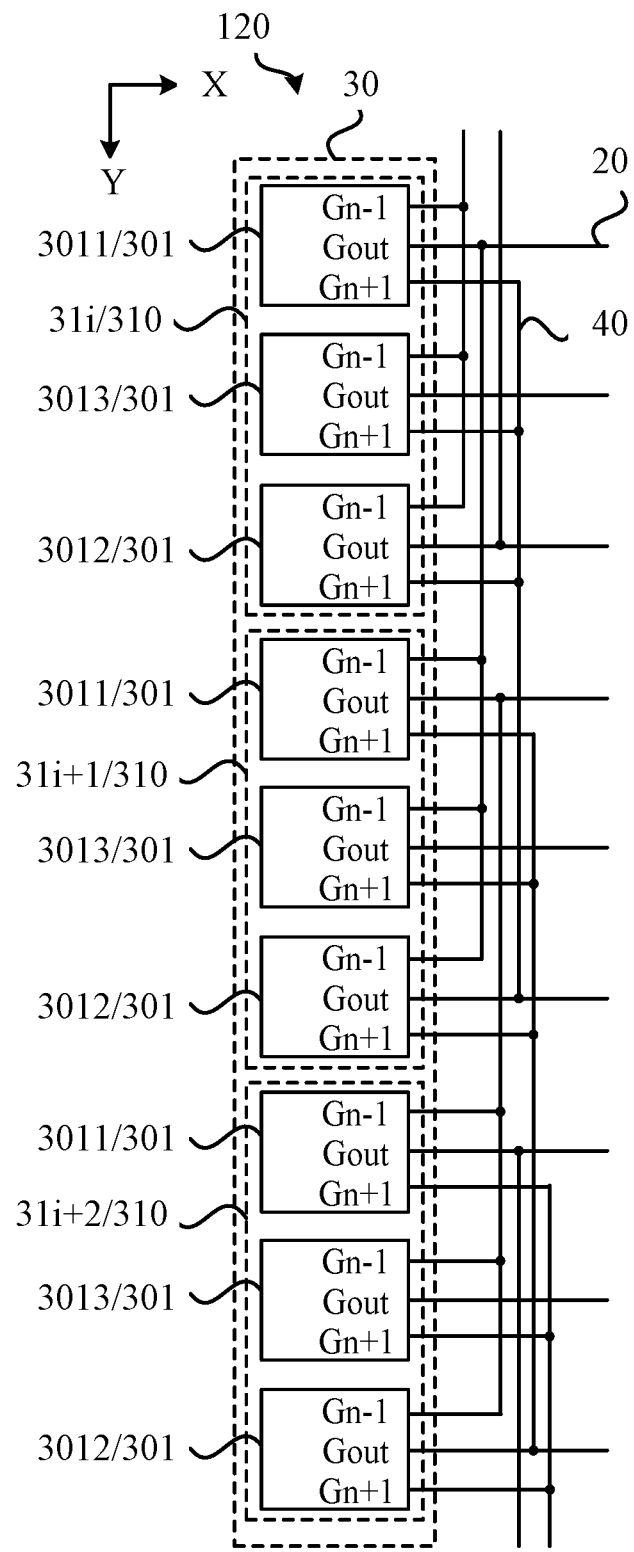
FIG. 7 is a partial schematic diagram of a non-display region in a display panel according to an embodiment of the present disclosure.

In an embodiment, FIG. 7 is a partial schematic diagram of a non-display region in a display panel according to an embodiment of the present disclosure. As shown in FIG. 7, the shift register unit group 310 also includes at least one third shift register unit 3013. A signal output terminal Gout of the at least one third shift register unit 3013 is electrically connected to a respective scan signal line 20 and is not electrically connected to a respective connection line 40.

In an example, the case where each shift register unit group 310 includes three shift register units 301 is taken as an example. Three shift register units 301 in the same shift register unit group 310 may be the first shift register unit 3011, the second shift register unit 3012, and the third shift register unit 3013, respectively. The signal output terminal Gout of the first shift register unit 3011 in the (i+1)-th shift register unit group 31i+1 is electrically connected to the scan signal line 20 and the connection line 40 and is electrically connected to signal input terminals Gn−1 of shift register units in the (i+2)-th shift register unit group through the connection line 40. The signal output terminal Gout of the second shift register unit 3012 in the (i+1)-th shift register unit group 31i+1 is electrically connected to the scan signal line 20 and the connection line 40 and is electrically connected to reset control terminals Gn+1 of shift register units 301 in the i-th shift register unit group 31i through the connection line 40. A signal output terminal of the third shift register unit 3013 in the (i+1)-th shift register unit group 31i+1 is electrically connected to only the scan signal line 20 and is electrically connected to neither the connection line 40 nor the other shift register units 301. In this way, each shift register unit group 310 may include a third shift register unit 3013 that is electrically connected to neither connection lines 40 nor other shift register units 301, reducing the total load amount of the load electrically connected to the signal output terminal Gout of the third shift register unit 3013, thereby making the third shift register unit 3013 have a higher drive capability to the display unit electrically connected to the third shift register unit 3013. In this way, each shift register unit group 310 may include at least one third shift register unit 3013 having a higher drive capability so that the display unit electrically connected to the third shift register unit 3013 can accurately display and emit light, facilitating improving the display effect of the display panel. Meanwhile, the third shift register unit 3013 is electrically connected to no connection lines 40, reducing the number of connection lines 40, thereby reducing the size of the non-display region 120, and facilitating the narrow bezel of the display panel 100.

Figure 8:
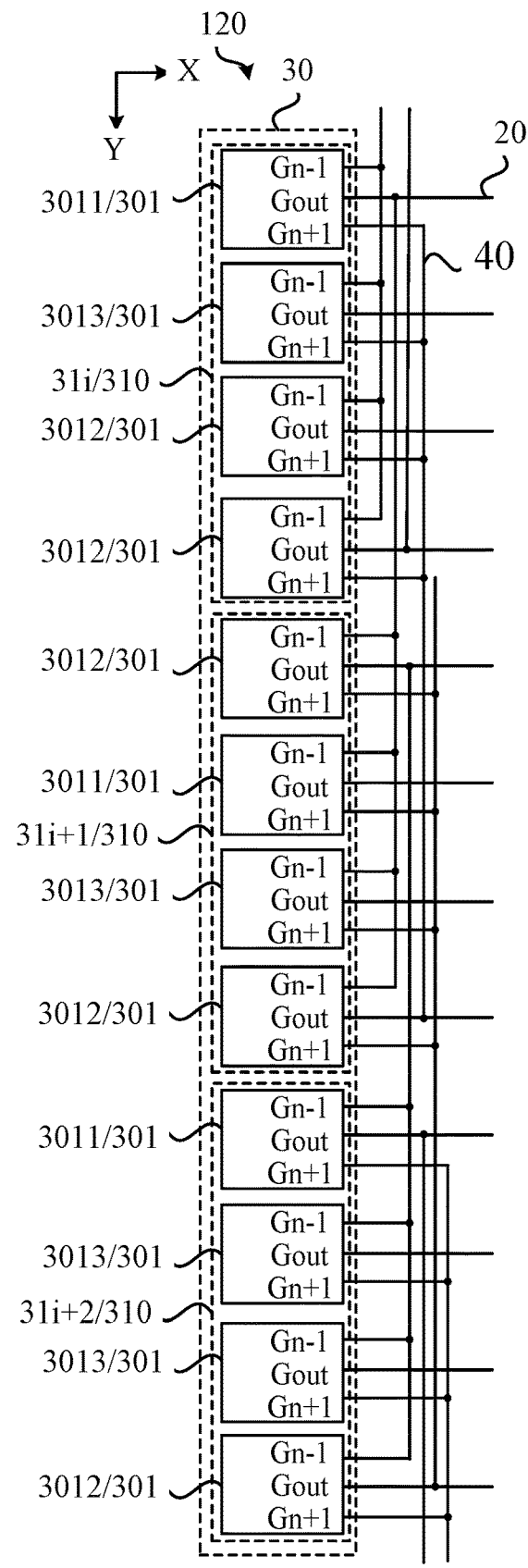
FIG. 8 is another partial schematic diagram of a non-display region in a display panel according to an embodiment of the present disclosure.

It is to be noted that FIG. 7 only in an example shows each shift register unit group 310 includes one third shift register unit 3013. However, in the embodiments of the present disclosure, each shift register unit group 310 may include one, two, or more third shift register units 3013. That is, in the same shift register unit group, the other shift register units 301 in addition to the first shift register unit 3011 and the second shift register unit 3012 may all be the third shift register units 3013. In an example, as shown in FIG. 8, when each shift register unit group 310 includes four shift register units 301. The four shift register units 301 may include one first shift register unit 3011, one second shift register unit 3012, and two third shift register units 3013. The number of shift register units provided in each shift register unit group 310 and the number of third shift register units included in each shift register unit group 310 are not limited in the embodiments of the present disclosure.

It is also to be noted that in the embodiments of the present disclosure, the connection line may be constituted of multiple signal line segments. Each signal line segment is one straight line. The signal line segments are connected one by one to constitute the connection line which may be a straight line or a folded line. On the premise of reducing the space occupied by the connection lines in the non-display region, the shape of the connection line is not limited in the embodiments of the present disclosure.

In some embodiments, the connection line may include first connection lines. A signal input terminal of each shift register unit in the same shift register unit group is electrically connected to the same first connection line. The first connection lines extend in a first direction and is insulated from first connection lines electrically connected to shift register units in different shift register unit groups. In the first direction, first connection lines electrically connected to each shift register unit in the i-th shift register unit group overlaps at least two of first connection lines electrically connected to each shift register unit in a j-th shift register unit group. i and j are both positive integers and i≠j. The first direction Y intersects a row direction of the multiple display units.

Figure 9:
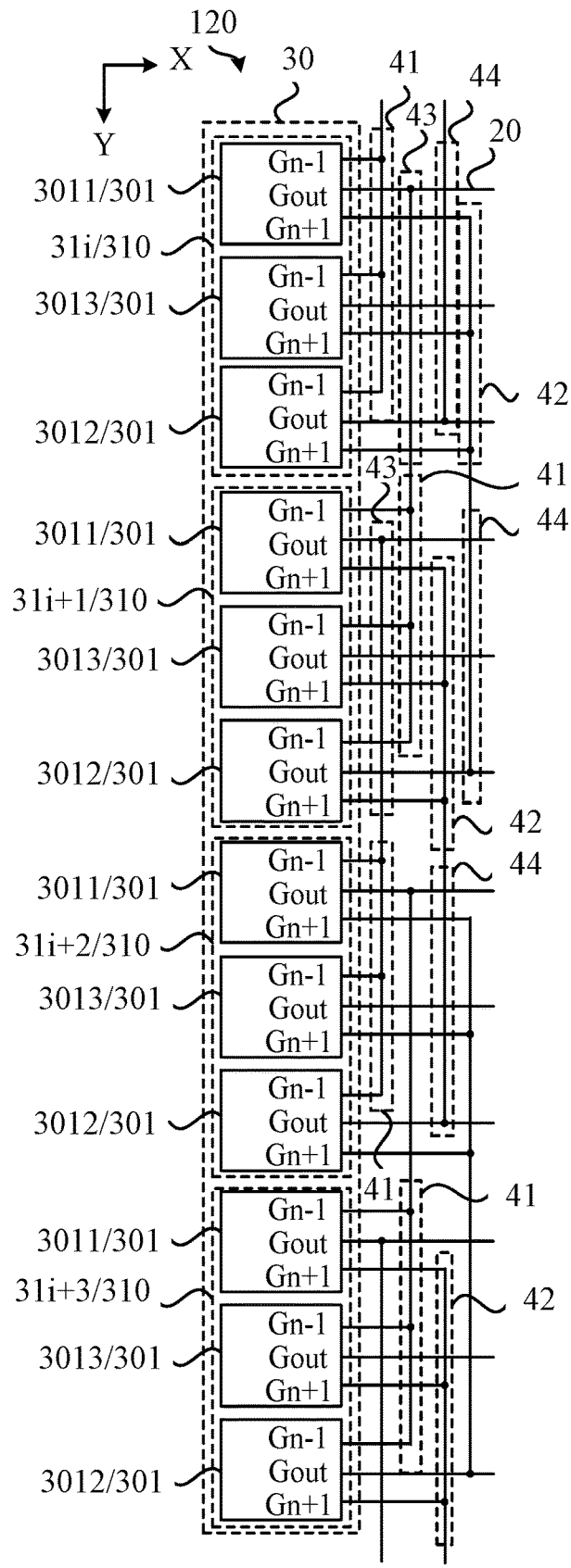
FIG. 9 is another partial schematic diagram of a non-display region in a display panel according to an embodiment of the present disclosure.

In an example, FIG. 9 is another partial schematic diagram of a non-display region in a display panel according to an embodiment of the present disclosure. As shown in FIG. 9, signal input terminals Gn−1 of shift register units 301 in the same shift register unit group 310 are electrically connected to the same first connection line 41 while signal input terminals Gn−1 of shift register units 301 in different shift register unit groups 310 are electrically connected to different first connection lines 41. In a first direction Y, first connection lines 41 electrically connected to shift register units 301 in the i-th shift register unit group 31i overlaps first connection lines 41 electrically connected to shift register units 301 in the (i+2)-th shift register unit group 31i+2. That is, when the first connection line 41 electrically connected to the shift register units 301 in the i-th shift register unit group 31i extends in the first direction Y towards the first connection line 41 electrically connected to the shift register units 301 in the (i+2)-th shift register unit group 31i+2, part of the extension line of the first connection line 41 electrically connected to the shift register units 301 in the i-th shift register unit group 31i overlaps the first connection line 41 electrically connected to the shift register units 301 in the (i+2)-th shift register unit group 31i+2. In other words, the first connection line 41 electrically connected to the shift register units 301 in the i-th shift register unit group 31i is in a same line with the first connection line 41 electrically connected to the shift register units 301 in the (i+2)-th shift register unit group 31i+2. In this way, the first connection line 41 electrically connected to the shift register units 301 in the i-th shift register unit group 31i and the first connection line 41 electrically connected to the shift register units 301 in the (i+2)-th shift register unit group 31i+2 occupy an area of only one line width in the non-display region 120 so that the size of the non-display region 120 can be effectively reduced in the width direction of the first connection line 41, thereby facilitating the narrow bezel of the display panel.

In some embodiments, the connection lines may also include second connection lines. A reset control terminal of each shift register unit in the same shift register unit group is electrically connected to the same second connection line. The second connection line extends in the first direction, is insulated from second connection lines electrically connected to the shift register units in different shift register unit groups, and is insulated from the first connection line and the second connection line that are electrically connected to the shift register units in the same shift register unit group. In the first direction, second connection lines electrically connected to the shift register units in the i-th shift register unit group overlaps at least two of second connection lines electrically connected to shift register units in a j-th shift register unit group. i and j are both positive integers and i≠j. The first direction intersects a row direction of the multiple display units.

In an example, referring to FIG. 9, reset control terminals Gn+1 of the shift register units 301 in the same shift register unit group 310 are electrically connected to the same second connection line 42 while reset control terminals Gn+1 of the shift register units 301 in different shift register unit groups 310 are electrically connected to different second connection lines 42. In the first direction Y, second connection lines 42 electrically connected to the shift register units 301 in the i-th shift register unit group 31i overlaps second connection lines 42 electrically connected to the shift register units 301 in the (i+2)-th shift register unit group 31i+2. That is, when the second connection line 42 electrically connected to the shift register units 301 in the i-th shift register unit group 31i extends in the first direction Y towards the second connection line 42 electrically connected to the shift register units 301 in the (i+2)-th shift register unit group 31i+2, part of the extension line of the second connection line 42 electrically connected to the shift register units 301 in the i-th shift register unit group 31i overlaps the second connection line 42 electrically connected to the shift register units 301 in the (i+2)-th shift register unit group 31i+2. In other words, the second connection line 42 electrically connected to the shift register units 301 in the i-th shift register unit group 31i is in a same line with the second connection line 42 electrically connected to the shift register units 301 in the (i+2)-th shift register unit group 31i+2. In this way, the first connection line 41 electrically connected to the shift register units 301 in the i-th shift register unit group 31i and the second connection line 42 electrically connected to the shift register units 301 in the (i+2)-th shift register unit group 31i+2 occupy an area of only one line width in the non-display region 120 so that the size of the non-display region 120 can be effectively reduced in the width direction of the second connection line 42, thereby facilitating the narrow bezel of the display panel.

It is to be noted that, FIG. 9 only in an example shows the case where j=i+2, the overlapping situation of each first connection line in the first direction, and the overlapping situation of each second connection line in the first direction. However, in the embodiments of the present disclosure, the overlapping situation of each first connection line, and the overlapping situation of each second connection line are not limited thereto. The embodiments of the present disclosure are described hereinafter by using typical examples.

In some embodiments, referring to FIG. 9, in the same shift register unit group 310, the scan signal enable level output from each shift register unit 301 is sequentially shifted. In the same shift register unit group 310, a start time of the scan signal enable level output from the first shift register unit is before a start time of the scan signal enable level output from the other shift register unit rather than the first shift register unit, and a start time of the scan signal enable level output from the second shift register unit is after a start time of the scan signal enable level output from the other shift register unit rather than the second shift register unit. In this case, in the same shift register unit group 310, the first shift register unit 3011 and the second shift register unit 3012 are different shift register units, respectively.

Figure 10:
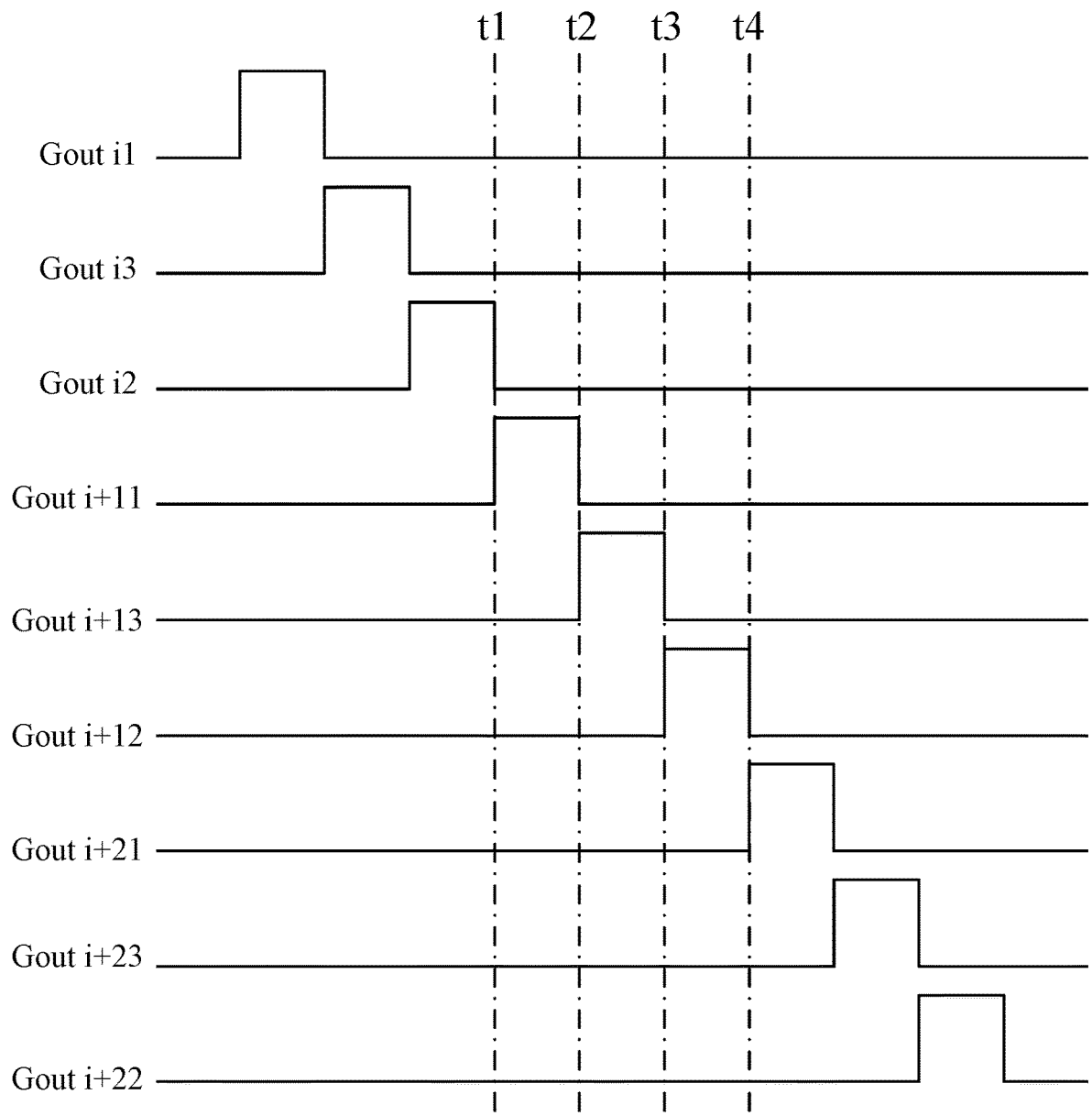
FIG. 10 is a timing diagram of a scan signal of a shift register circuit corresponding to FIG. 9.

In an example, FIG. 10 is a timing diagram of a scan signal of a shift register circuit corresponding to FIG. 9. Referring to FIGS. 9 and 10, in the (i+1)-th shift register unit group 31i+1, at time t1, a scan signal Gouti+11 output from a first shift register unit 3011 jumps from a disable level to an enable level. However, a scan signal Gouti+12 output from a second shift register unit 3012 and a scan signal Gouti+13 output from a third shift register unit 3013 remain at the disable level. In this case, display units electrically connected to a scan signal line 20 corresponding to the first shift register unit 3011 can be scanned. At time t2, the scan signal Gouti+11 output from the first shift register unit 3011 jumps from the enable level to the disable level. Meanwhile, the scan signal Gouti+13 output from the third shift register unit 3013 jumps from the disable level to the enable level. However, the scan signal Gouti+12 output from the second shift register unit 3012 remains at the disable level. In this case, display units electrically connected to a scan signal line 20 corresponding to the third shift register unit 3013 can be scanned. At time t3, the scan signal Gouti+13 output from the third shift register unit 3013 jumps from the enable level to the disable level. Meanwhile, the scan signal Gouti+12 output from the second shift register unit 3012 jumps from the disable level to the enable level. However, the scan signal Gouti+11 output from the first shift register unit 3011 remains at the disable level. In this case, display units electrically connected to a scan signal line 20 corresponding to the second shift register unit 3012 can be scanned. At time t4, the scan signal Gouti+12 output from the second shift register unit 3012 jumps from the enable level to the disable level, the scan signals (Gouti+11, Gouti+13, and Gouti+12) output from the shift register units 301 in the (i+1)-th shift register unit group 31i+1 start continuously remaining at the disable level until the display units electrically connected to the scan signal line 20 corresponding to the first shift register unit 3011 requires to be scanned again in a next scanning cycle.

In addition, the scan signal Gouti+11 output from the first shift register unit 3011 in the (i+1)-th shift register unit group 31*i*+1 can control period of the scan signal (Gouti+21, Gouti+23, and Gouti+22) enable level output from shift register units 301 in the (i+2)-th shift register unit group 31*i*+2. That is, when the scan signal (Gouti+11, Gouti+13, and Gouti+12) output from the shift register units 301 in the (i+1)-th shift register unit group 31*i*+1 is at the enable level, correspondingly, period of the scan signal (Gouti+21, Gouti+23, and Gouti+22) disable level output from the shift register units 301 in the (i+2)-th shift register unit group 31*i*+2 may be controlled until the scan signal Gouti+22 output from the second shift register unit 3012 in the (i+1)-th shift register unit group 31*i*+1 jumps from the enable level to the disable level, the scan signal output from the first shift register unit 3011 in the (i+2)-th shift register unit group 31*i*+2 may be controlled to jump from the disable level to the enable level, and the period of the scan signal (Gouti+21, Gouti+23, and Gouti+22) enable level output from the shift register units 301 in the (i+2)-th shift register unit group 31*i*+2 may be controlled. Similarly, the scan signal Gouti+12 output from the second shift register unit 3012 in the (i+1)-th shift register unit group 31*i*+1 can control periods of the disable level of scan signals output from shift register units 301 in the i-th shift register unit group 31*i*. That is, before the scan signal enable level Gouti+11 output from the first shift register unit 3011 in the (i+1)-th shift register unit group 31*i*+1, each shift register unit 301 in the i-th shift register unit group 31*i* sequentially outputs the scan signal (Gouti1, Gouti3, and Gouti2) enable level. However, when the scan signal output from the first shift register unit 3011 in the (i+1)-th shift register unit group 31*i*+1 jumps from the disable level to the enable level, the period of the scan signal disable level output from the shift register units 301 in the i-th shift register unit group 31*i* may be controlled until to the next scanning cycle.

Figure 11:
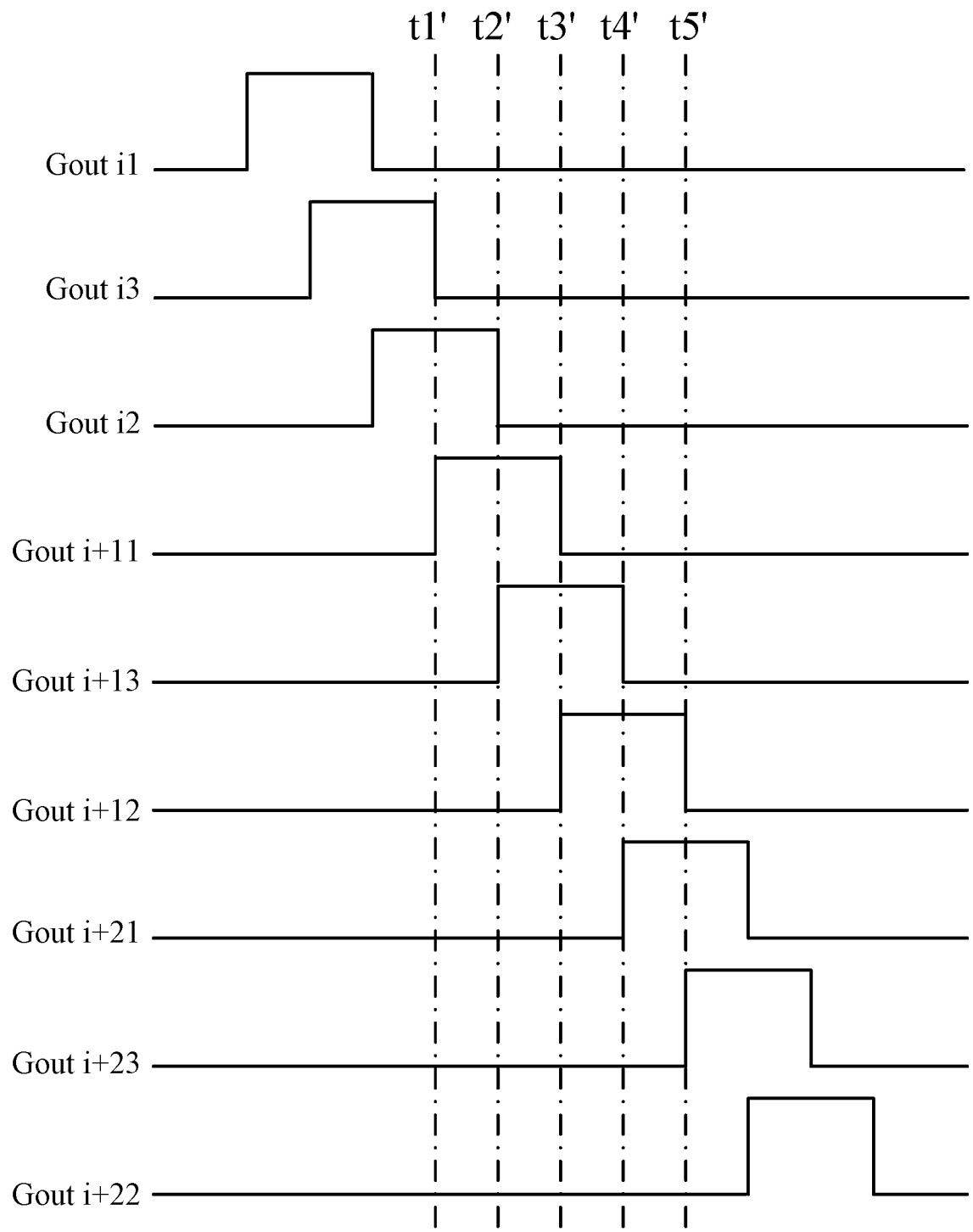
FIG. 11 is another timing diagram of a scan signal of a shift register circuit corresponding to FIG. 9.

It is to be noted that the above only in an example describes the case where the scan signal enable level output from each shift register unit does not overlap each other. However, in the embodiments of the present disclosure, the scan signal enable level output from each shift register unit may partially overlap. FIG. 11 is another timing diagram of a scan signal of a shift register circuit corresponding to FIG. 9. Referring to FIGS. 11 and 9, the case of scan signals output from shift register units 301 in the (i+1)-th shift register unit group 31*i*+1 is taken as an example. At time t1, the scan signal Gouti+11 output from the first shift register unit 3011 jumps from a disable level to an enable level. The scan signal Gouti+12 output from the second shift register unit 3012 and the scan signal Gouti+13 output from the third shift register unit 3013 remain at the disable level. At time t2, the scan signal Gouti+13 output from the third shift register unit 3013 jumps from the disable level to the enable level. The scan signal Gouti+11 output from the first shift register unit 3011 remains at the enable level. The scan signal Gouti+12 output from the second shift register unit 3012 remains at the disable level. At time t3, the scan signal Gouti+11 output from the first shift register unit 3011 jumps from the enable level to the disable level. The scan signal Gouti+12 output from the second shift register unit 3012 jumps from the disable level to the enable level. The scan signal Gouti+13 output from the third shift register unit 3013 remains at the enable level. At time t4, the scan signal Gouti+13 output from the third shift register unit 3013 jumps from the enable level to the disable level. The scan signal Gouti+12 output from the second shift register unit 3012 remains at the enable level. The scan signal Gouti+11 output from the first shift register unit 3011 remains at the disable level. At time t5, the scan signal Gouti+12 output from the second shift register unit 3012 jumps from the enable level to the disable level. The scan signal Gouti+11 output from the first shift register unit 3011 and the scan signal Gouti+13 output from the third shift register unit 3013 remains at the disable level. Meanwhile, a period of the scan signal Gouti+11 enable level output from the first shift register unit 3011 in the (i+1)-th shift register unit group 31*i*+1 may also overlap a period of the scan signal enable level Gouti2 output from the second shift register unit 3012 in the i-th shift register unit group 31*i*. A period of the scan signal Gouti+12 enable level output from the second shift register unit 3012 in the (i+1)-th shift register unit group 31*i*+1 may also overlap a period of the scan signal enable level Gouti+21 output from the first shift register unit 3011 in the (i+2)-th shift register unit group 31*i*+2.

It is to be understood that whether or not the scan signal enable level output from each shift register unit 301 overlaps may be designed according to actual requirements and is not limited in the embodiments of the present disclosure.

In some embodiments, referring to FIG. 9, when in the same shift register unit group 310, the first shift register unit 3011 and the second shift register unit 3012 are different shift register units, respectively, the connection lines may include first connection lines 41, second connection lines 42, third connection lines 43, and fourth connection lines 44. In this case, in the same shift register unit group 310, the signal input terminals Gn−1 of the shift register units 301 are electrically connected to the same first connection line 41, and the reset control terminals of the shift register units are electrically connected to the same second connection line 42. The signal output terminal Gout of the first shift register unit 3011 in the (i+1)-th shift register unit group 31*i*+1 is electrically connected to the first connection line 41 electrically connected to the shift register units 301 in the (i+2)-th shift register unit group 31*i*+2 through the third connection line 43. The signal output terminal Gout of the second shift register unit 3012 in the (i+1)-th shift register unit group 31*i*+1 is electrically connected to the second connection line 42 electrically connected to the shift register units 301 in the i-th shift register unit group 31*i* through the fourth connection line 44. The first connection line 41, the second connection line 42, the third connection line 43, and the fourth connection line 44 all extend in the first direction Y. The first connection line 41, the second connection line 42, the third connection line 43, and the fourth connection line 44 electrically connected to the shift register units 301 in the same shift register unit group 310 are arranged in a second direction X and are insulated from each other. The second direction X intersects the first direction Y and is parallel to a row direction of the multiple display units.

Specifically, the signal input terminals Gn−1 of the shift register units 301 in the same shift register unit group 310 are electrically connected to the same first connection line 41 while the signal input terminals Gn−1 of the shift register units 301 in different shift register unit groups 310 are electrically connected to different first connection lines 41 and the first connection lines 41 are insulated from each other. In this manner, signals at the signal input terminals Gn−1 of the shift register units 301 in different shift register unit groups 310 do not affect each other. Correspondingly, the reset control terminals Gn+1 of the shift register units 301 in the same shift register unit group 310 are electrically connected to the same second connection line 42 while the reset control terminals Gn+1 of the shift register units 301 in different shift register unit groups 310 are electrically connected to different second connection lines 42 and the second connection lines 42 are insulated from each other. In this manner, signals at the reset control terminals Gn+1 of the shift register units 301 in different shift register unit groups 310 do not affect each other. Meanwhile, signal output terminals Gout of first shift register units 3011 in different shift register unit groups 310 are electrically connected to different third connection lines 43. Signal output terminals Gout of second shift register units 3012 in different shift register unit groups are electrically connected to different fourth connection lines 44. In this manner, scan signals output from the signal output terminals Gout of the first shift register units 3011 in different shift register unit groups 310 do not affect each other. Scan signals output from the signal output terminals Gout of the second shift register units 3012 in different shift register unit groups do not affect each other. In addition, the first connection line 41, the second connection line 42, the third connection line 43, and the fourth connection line 44 electrically connected to the shift register units 301 in the same shift register unit group 310 are insulated from each other so that signals at the signal input terminal Gn−1, the reset control terminal Gn+1, and the signal output terminal Gout of the shift register units do not affect each other. Such an arrangement can, on the premise of simplifying the connection relationship among the shift register units and reducing the number of connection lines, prevent the crosstalk from being generated among the signals transmitted by the first connection lines 41, the second connection lines 42, the third connections 43, and the fourth connection lines 44 and from affecting the accuracy of the scan signals output from the shift register units 301 in the shift register circuit 30, i.e., make the shift register units 301 in the shift register circuit accurately provide the scan signals to the display units in the display region in the display panel, and make the display units accurately display light, thereby improving the display effect of the display panel.

In addition, the first connection line 41, the second connection line 42, the third connection line 43, and the fourth connection line 44 electrically connected to the shift register units 301 in the same shift register unit group 310 are arranged in the second direction X so that the design requirements of the shift register unit groups 310 can be satisfied when in the second direction X, the size of the area for the connection lines corresponding to each shift register unit group 310 to be arranged in is the sum of line widths of the four connection lines and gap sizes among the four connection lines, thereby facilitating reducing the size of the non-display region 120 in the second direction X, and facilitating the narrow bezel of the display panel.

In some embodiments, referring to FIG. 9, in the first direction Y, the first connection line 41 electrically connected to signal input terminals Gn−1 of the shift register units 301 in the i-th shift register unit group 31$i$ overlaps the first connection line 41 electrically connected to signal input terminals Gn−1 of the shift register units 301 in the (i+2)-th shift register unit group 31$i$+2. That is, the extension line of the first connection line 41 electrically connected to the shift register units 301 in the i-th shift register unit group 31$i$ in the first direction Y can overlay the first connection line 41 electrically connected to the shift register units 301 in the (i+2)-th shift register unit group 31$i$+2. In other words, in the first direction Y, the first connection line 41 electrically connected to the shift register units 301 in the i-th shift register unit group 31$i$ is in a same line with the first connection line 41 electrically connected to the shift register units 301 in the (i+2)-th shift register unit group 31$i$+2.

Similarly, in the first direction Y, the second connection line 42 electrically connected to reset control terminals Gn+1 of the shift register units 301 in the i-th shift register unit group 31$i$ overlaps the second connection line 42 electrically connected to reset control terminals Gn+1 of the shift register units 301 in the (i+2)-th shift register unit group 31$i$+2. That is, the extension line of the second connection line 42 electrically connected to the shift register units 301 in the i-th shift register unit group 31$i$ in the first direction Y can overlay the second connection line 42 electrically connected to the shift register units 301 in the (i+2)-th shift register unit group 31$i$+2. In other words, the second connection line 42 electrically connected to the shift register units 301 in the i-th shift register unit group 31$i$ is in a same line with the second connection line 42 electrically connected to the shift register units 301 in the (i+2)-th shift register unit group 31$i$+2.

In addition, in the first direction Y, the first connection line 41 and the third connection line 43 that are electrically connected to each other overlap each other. That is, in the first connection line 41 and the third connection line 43 that are electrically connected to each other, the extension line of the first connection line 41 can overlay the third connection line 43. In other words, the first connection line 41 and the third connection line 43 that are electrically connected to each other are in a same line. The second connection line 42 and the fourth connection line 44 that are electrically connected to each other overlap each other. That is, in the second connection line 42 and the fourth connection line 44 that are electrically connected to each other, the extension line of the second connection line 42 can overlay the fourth connection line 44. In other words, the second connection line 42 and the fourth connection line 44 that are electrically connected to each other are in a same line.

In this way, the design requirements of the shift register unit groups 310 can be satisfied when in the second direction X, the size of the area for the connection lines to be arranged in is only the sum of line widths of the four connection lines and gap sizes among the four connection lines, thereby facilitating reducing the size of the non-display region 120 in the second direction X, and facilitating the narrow bezel of the display panel.

It is to be understood that i is a positive integer, so i may be an odd number or an even number. Therefore, in the first direction Y, the first connection line 41 and the second connection line 42 electrically connected to the shift register units 301 in the (i+1)-th shift register unit group 31$i$+1 may also overlap first connection lines 41 and second connection lines 42 electrically connected to shift register units 301 in an (i+3)-th shift register unit group 31$i$+3. The arrangement manner is the same as the first connection line 41 and the second connection line 42 corresponding to the shift register units 301 in the i-th shift register unit group 31$i$ overlapping the first connection line 41 and the second connection line 42 corresponding to the shift register units 301 in the (i+2)-th shift register unit group 31$i$+2, and details are not described herein.

Figure 12:
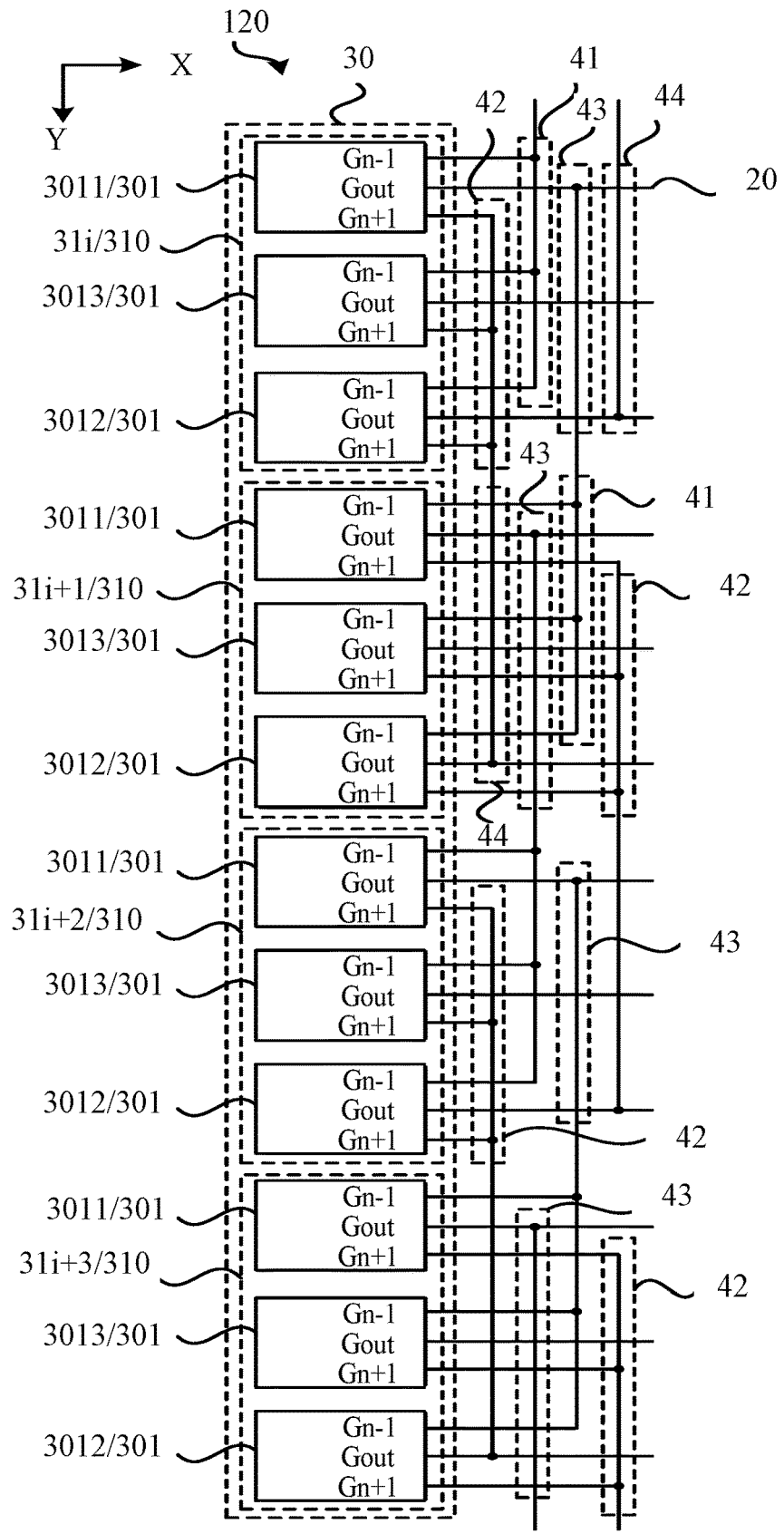
FIG. 12 is another partial schematic diagram of a non-display region in a display panel according to an embodiment of the present disclosure.

Referring to FIG. 9, the first connection line 41, the third connection line 43, the fourth connection line 44, and the second connection line 42 corresponding to the i-th shift register unit group 31$i$ may be sequentially arranged in the second direction. The first connection line 41, the third connection line 43, the fourth connection line 44, and the second connection line 42 corresponding to the (i+2)-th shift register unit group 31$i$+2 may be sequentially arranged in the second direction. That is, the first connection line 41 and the fourth connection line 44 are located on two opposite sides of the third connection line 43, respectively. The second connection line 42 is located on a side of the fourth connection line 44 away from the third connection line 43. The third connection line 43, the first connection line 41, the second connection line 42, and the fourth connection line 44 corresponding to the (i+1)-th shift register unit group 31$i$+1 may be sequentially arranged in the second direction. The third connection line 43, the first connection line 41, the second connection line 42, and the fourth connection line 44 corresponding to the (i+3)-th shift register unit group 31$i$+3 may be sequentially arranged in the second direction. That is, the third connection line 43 and the second connection line 42 are located on two opposite sides of the first connection line 41, respectively. The fourth connection line 44 is located on one side of the second connection line 42 away from the first connection line 41. In some embodiments, as shown in FIG. 12, the second connection line 42, the first connection line 41, the third connection line 43, and the fourth connection line 44 corresponding to the i-th shift register unit group 31$i$ may be sequentially arranged in the second direction. The second connection line 42, the first connection line 41, the third connection line 43, and the fourth connection line 44 corresponding to the (i+2)-th shift register unit group 31$i$+2 may be sequentially arranged in the second direction. That is, the second connection line 42 and the third connection line 43 are located on two opposite sides of the first connection line 41, respectively. The fourth connection line 44 is located on one side of the third connection line 43 away from the first connection line 41. The fourth connection line 44, the third connection line 43, the first connection line 41, and the second connection line 42 corresponding to the (i+1)-th shift register unit group 31$i$+1 may be sequentially arranged in the second direction. The fourth connection line 44, the third connection line 43, the first connection line 41, and the second connection line 42 corresponding to the (i+3)-th shift register unit group 31$i$+3 may be sequentially arranged in the second direction. That is, the fourth connection line 43 and the first connection line 41 are located on two opposite sides of the third connection line 43, respectively. The second connection line 42 is located on one side of the first connection line 41 away from the third connection line 43.

It is to be noted that FIGS. 9 and 12 are only exemplary drawings of the embodiments of the present disclosure. In the case where the first shift register unit 3011 and the second shift register unit 3012 in the same shift register unit group 310 are different shift register units, respectively, on the premise that the size of the non-display region 120 occupied by the first connection line 41, the second connection line 42, the third connection line 43, and the fourth connection line 44 corresponding to each shift register unit group 310 is minimum, the arrangement order of the first connection line 41, the second connection line 42, the third connection line 43, and the fourth connection line 44 corresponding to each shift register unit group 310 in the second direction is not limited in the embodiments of the present disclosure. In addition, FIGS. 9 and 12 only show that the case where when in the same shift register unit group 310, the first shift register unit 3011 and the second shift register unit 3012 are different shift register units, respectively, the first connection line 41 and the third connection line 43 that are electrically connected to each other constitute a straight line, and the second connection line 42 and the fourth connection line 44 that are electrically connected to each other constitute a straight line, in an example. However, in the embodiments of the present disclosure, the first connection line 41 and the third connection line 43 that are electrically connected to each other and/or the second connection line 42 and the fourth connection line 44 that are electrically connected to each other may also constitute a folded line.

Figure 13:
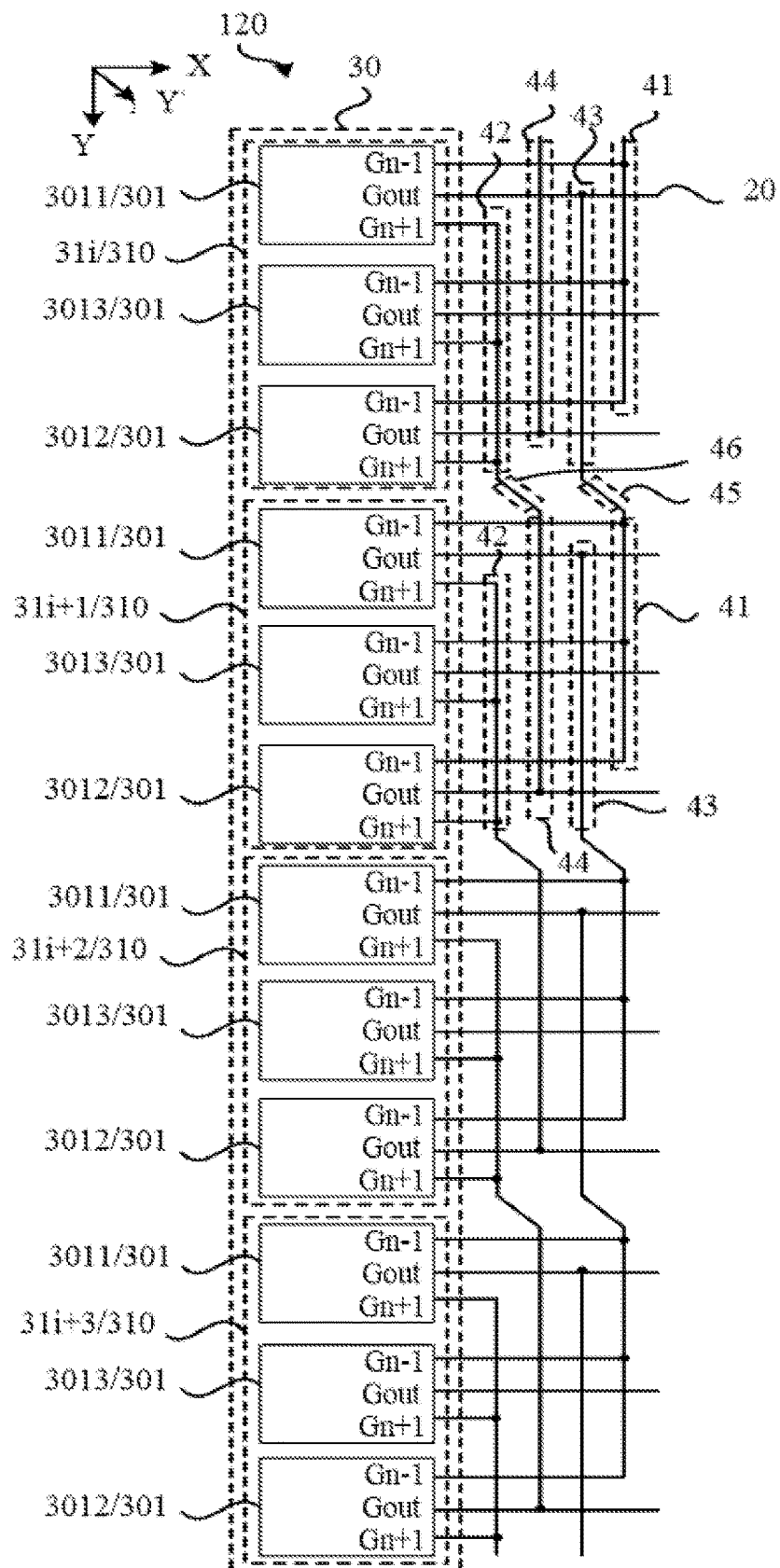
FIG. 13 is another partial schematic diagram of a non-display region in a display panel according to an embodiment of the present disclosure.

In some embodiments, FIG. 13 is another partial schematic diagram of a non-display region in a display panel according to an embodiment of the present disclosure. As shown in FIG. 13, when in the same shift register unit group 310, the first shift register unit 3011 and the second shift register unit 3012 are different shift register units, respectively, the connection lines include fifth connection lines 45 and sixth connection lines 46. In the thickness direction of the display panel, the fifth connection line 45 and the sixth connection line 46 do not overlap each other. The fifth connection line 45 and the sixth connection line 46 both extend in a third direction Y'. The third direction Y' intersects both a first direction Y and a second direction X. The first connection line 41 is electrically connected to the third connection line 43 through the fifth connection line 45. In the first direction Y, the first connection lines 41 and the third connection lines 43 that are electrically connected to each other do not overlap each other. the second connection line 42 is electrically connected to the fourth connection line 44 through the sixth connection line 46. In the first direction Y, the second connection line 42 and the fourth connection line 44 that are electrically connected to each other do not overlap each other. Such an arrangement can make the extension line of the first connection line 41 in the first direction Y not intersect the third connection line 43. That is, the first connection line 41 and the third connection line 43 are located on different straight lines parallel to each other. In the first direction Y, the extension line of the second connection line 42 does not intersect the fourth connection line 44. That is, the second connection line 42 and the fourth connection line 44 are located on different straight lines parallel to each other. In this case, the connection line constituted by the first connection line 41, the fifth connection line 45, and the third connection line 43 that are electrically connected to each other is a folded line. The connection line constituted by the second connection line 42, the sixth connection line 46, and the fourth connection line 44 that are electrically connected to each other is also a folded line.

In some embodiments, referring to FIG. 13, in the first direction Y, the first connection lines 41 electrically connected to shift register units 301 in different shift register unit groups 310 overlap each other. That is, the first connection lines 41 corresponding to different shift register unit groups 310 may be located on a same line. The second connection lines 42 electrically connected to the shift register units 301 in different shift register unit groups 310 overlap each other. That is, the second connection lines 42 corresponding to different shift register unit groups 310 may be located on a same line. The third connection lines 43 electrically connected to first shift register units 3011 in different shift register unit groups 310 overlap each other. That is, the third connection lines 43 corresponding to different shift register unit groups 310 may be located on a same line. The fourth connection lines 44 electrically connected to second shift register units 3012 in different shift register unit groups 310 overlap each other. That is, the fourth connection lines 44 corresponding to different shift register unit groups 310 may be located on a same line.

In this way, when the connection line constituted by the first connection line 41, the fifth connection line 45, and the third connection line 43 that are electrically connected to each other is a folded line, and the connection line constituted by the second connection line 42, the sixth connection line 46, and the fourth connection line 44 that are electrically connected to each other is also a folded line, in the second direction X, the size of the area for all of the connection lines to be arranged in may also be only the sum of line widths of the four connection lines and gap sizes among the four connection lines, thereby facilitating reducing the size of the non-display region 120 in the second direction X, and facilitating the narrow bezel of the display panel.

In addition, referring to FIG. 13, the first connection line 41, the third connection line 43, the fourth connection line 44, and the second connection line 42 electrically connected to each shift register unit 301 in the same shift register unit group 310 are sequentially arranged in the second direction. That is, the first connection line 41 and the fourth connection line 44 are located on two opposite sides of the third connection line 43, respectively. The second connection line 42 is located on one side of the fourth connection line 44 away from the third connection line 43. In this way, the first connection line 41, the second connection line 42, the third connection line 43, and the fourth connection line 44 corresponding to each shift register unit group 310 are arranged in the same manner, thereby facilitating simplifying the design of the shift register circuit 30 and the connection lines (41, 42, 43, and 44) of the shift register circuit 30, simplifying the preparation mode of the display panel, and also facilitating the low cost of the display panel 100.

It is to be understood that the above shows the case where the first shift register unit and the second shift register unit in the same shift register unit group are different shift register units, in an example. However, in the embodiments of the present disclosure, the first shift register unit and the second shift register unit in the same shift register unit group may also be the same shift register unit.

Figure 14:
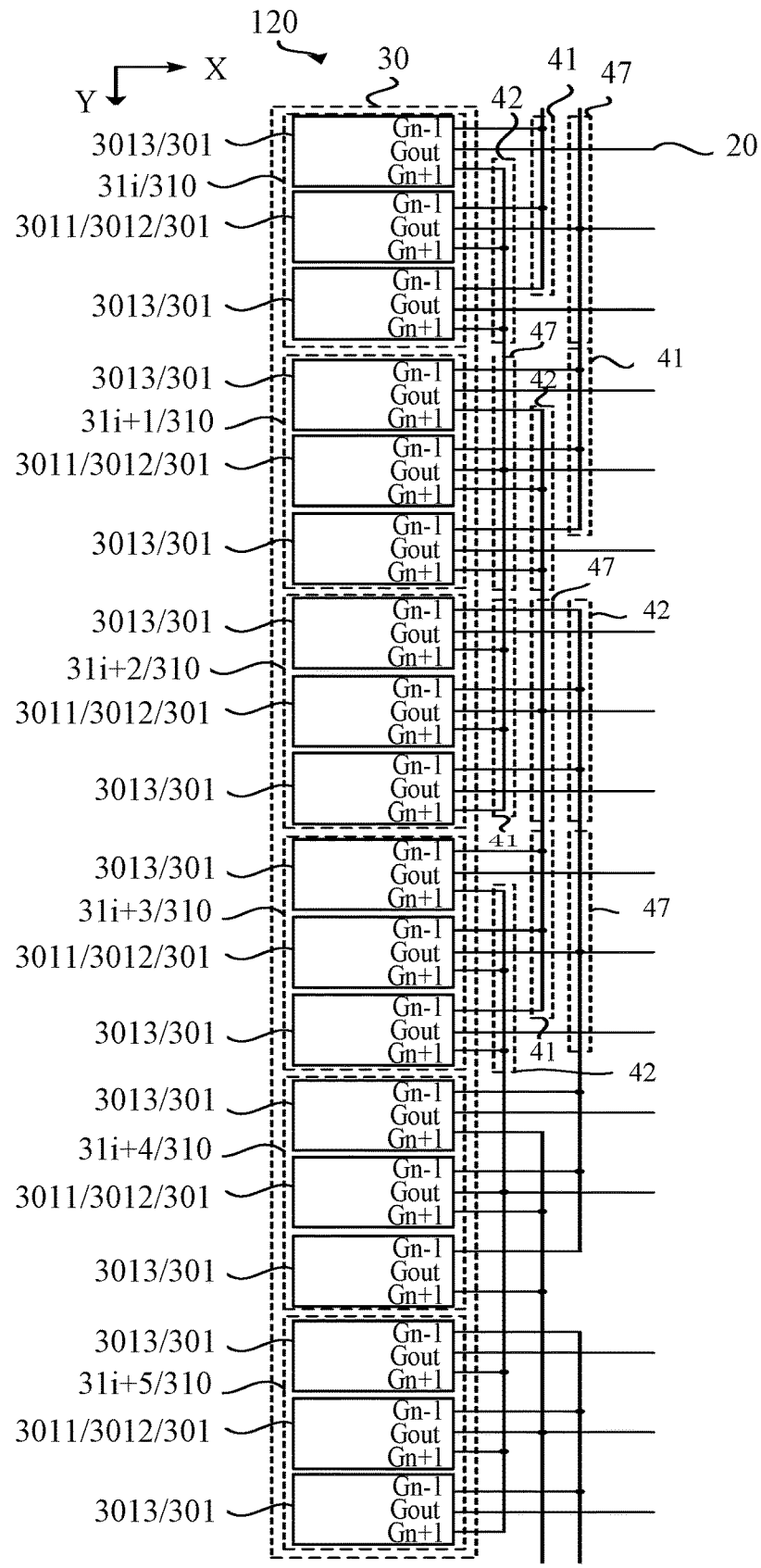
FIG. 14 is another partial schematic diagram of a non-display region in a display panel according to an embodiment of the present disclosure.

In some embodiments, FIG. 14 is another partial schematic diagram of a non-display region in a display panel according to an embodiment of the present disclosure. As shown in FIG. 14, in the same shift register unit group 310, the first shift register unit 3011 is also served as the second shift register unit 3012. In this way, each shift register unit group 310 is required to include only one first shift register unit electrically connected to shift register units in the other shift register unit groups, thereby simplifying the connection relationship among the shift register units.

In some embodiments, when the scan signal enable level output from each shift register unit in the same shift register unit group is sequentially shifted, and when in the same shift register unit group, the first shift register unit is also served as the second shift register unit, for the case where each shift register unit group includes N shift register units, the first shift register unit in each shift register unit group is a M-th shift register unit that outputs the scan signal enable level. N is a positive integer greater than or equal to 2. M is a natural number less than N. If N is an even number, M=(N/2) or M=(N/2+1). Alternatively, if N is an odd number, M=(N+1)/2.

In an example embodiment, as shown in FIG. 14, in the case where N is an odd number, if N=3, then, M=2. The first shift register unit 3011 of each shift register unit group 310 is a shift register unit that outputs the second scan signal enable level. That is, in the same shift register unit group 310, a start time of the scan signal enable level output from the first shift register unit 3011 is after a start time of the scan signal enable level output from one of third shift register units 3013 and is before a start time of the scan signal enable level output from the other one of third shift register units 3013. In this case, the first shift register unit 3011 in the shift register unit group 310 is a shift register unit at an intermediate position in the shift register unit group 310. In this way, the first shift register unit 3011 in the (i+1)-th shift register unit group 31i+1 can control a period of the scan signal disable level output from each shift register unit 301 in the i-th shift register unit group 31i and a period of the scan signal enable level output from each shift register unit 301 in the (i+2)-th shift register unit group 31i+2. In this manner, the scan signal enable level output from each shift register unit 301 in the shift register circuit 30 is sequentially shifted, thereby scanning the display units in the display region row by row, and making the display panel display corresponding images.

Figure 15:
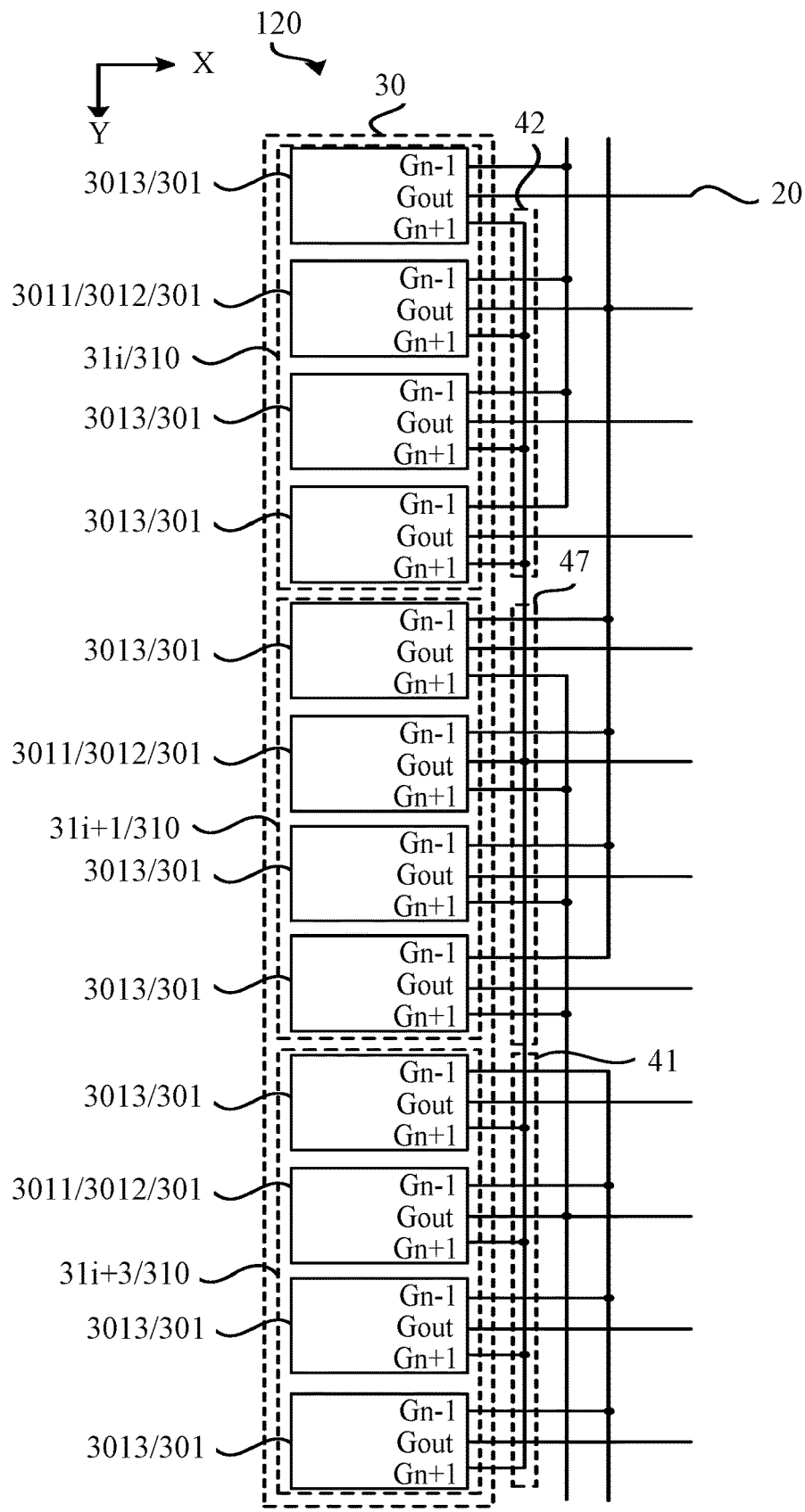
FIG. 15 is another partial schematic diagram of a non-display region in a display panel according to an embodiment of the present disclosure.

In another example embodiment, as shown in FIG. 15, in the case where N is an even number, and M=(N/2), if N=4, then, M=2. The first shift register unit 3011 of each shift register unit group 310 is a shift register unit that outputs the second scan signal enable level. That is, in the same shift register unit group 310, a start time of the scan signal enable level output from the first shift register unit 3011 is after a start time of the scan signal enable level output from one of third shift register units 3013 and is before a start time of the scan signal enable level output from each of the other two of third shift register units 3013. In this case, the first shift register unit 3011 in the (i+1)-th shift register unit group 31i+1 can control a period of the scan signal disable level output from each shift register unit 301 in the i-th shift register unit group 31i and a period of the scan signal enable level output from each shift register unit 301 in the (i+2)-th shift register unit group 31i+2. In this manner, the scan signal enable level output from each shift register unit 301 in the shift register circuit 30 is sequentially shifted, so that scanning the display units in the display region row by row is implemented, and that the display panel can display corresponding images.

Figure 16:
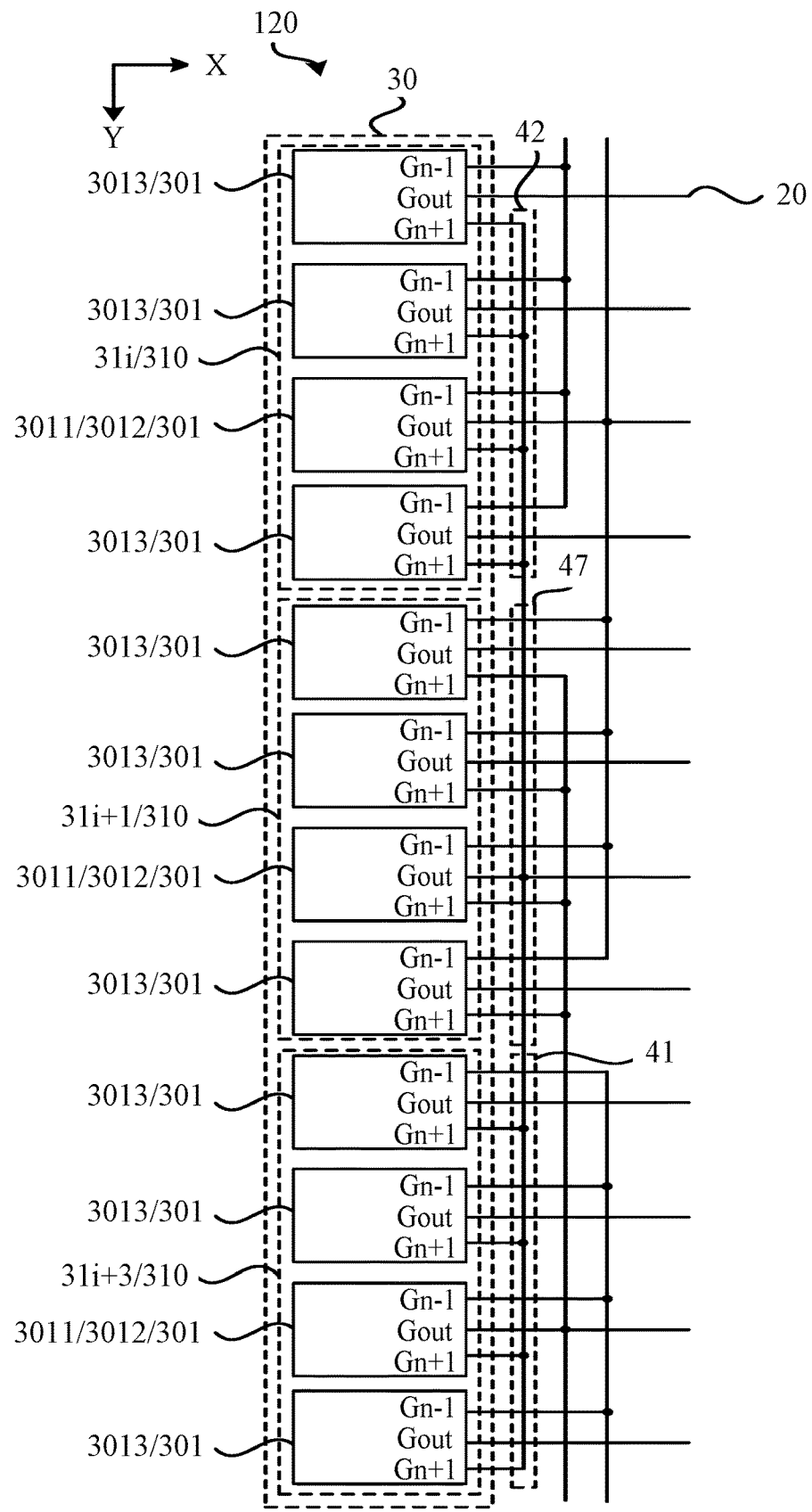
FIG. 16 is another partial schematic diagram of a non-display region in a display panel according to an embodiment of the present disclosure.

In another example embodiment, as shown in FIG. 16, in the case where N is an even number, and M=(N/2+1), if N=4, then, M=3. The first shift register unit 3011 of each shift register unit group 310 is a shift register unit that outputs the third scan signal enable level. That is, in the same shift register unit group 310, a start time of the scan signal enable level output from the first shift register unit 3011 is after a start time of the scan signal enable level output from each of two of third shift register units 3013 and is before a start time of the scan signal enable level output from the other one of third shift register units 3013. In this case, the first shift register unit 3011 in the (i+1)-th shift register unit group 31i+1 can control a period of the scan signal disable level output from each shift register unit 301 in the i-th shift register unit group 31i and a period of the scan signal enable level output from each shift register unit 301 in the (i+2)-th shift register unit group 31i+2. In this manner, the scan signal enable level output from each shift register unit 301 in the shift register circuit 30 is sequentially shifted, so that scanning the display units in the display region row by row is implemented, and that the display panel can display corresponding images.

It is to be noted that FIGS. 14 to 16 are only exemplary drawings of the embodiments of the present disclosure. In the embodiments of the present disclosure, the number of shift register units in each shift register unit group may be any odd number or even number greater than or equal to 2. On the premise that the embodiments of the present disclosure can be implemented, the number of shift register units is not limited in the embodiments of the present disclosure. For ease of description, the case where each shift register unit group includes three shift register units, and in the same shift register unit group 310, the first shift register unit 3011 is the shift register unit that outputs the second scan signal enable level is taken as an example to describe the solutions of the embodiments of the present disclosure.

In some embodiments, referring to FIG. 14, when in the same shift register unit group 310, the first shift register unit 3011 is also served as the second shift register unit 3012, the connection lines may include first connection lines 41, second connection lines 42, and seventh connection lines 47. In the same shift register unit group 310, signal input terminals Gn−1 of shift register units 301 are electrically connected to the same first connection line 41, and reset control terminals Gn+1 of the shift register units 301 are electrically connected to the same second connection line 42. The first shift register unit 3011 in the (i+1)-th shift register unit group 31$i$+1 is electrically connected to first connection lines 41 electrically connected to shift register units 301 in the (i+2)-th shift register unit group 31$i$+2 through the seventh connection line 47. The first shift register unit 3011 in the (i+1)-th shift register unit group 31$i$+1 is also electrically connected to second connection lines 42 electrically connected to shift register units 301 in the i-th shift register unit group 31$i$ through the seventh connection line 47. The first connection line 41, the second connection line 42, and the seventh connection line 47 all extend in a first direction Y. The first connection line 41, the second connection line 42, and the seventh connection line 47 that are electrically connected to each shift register unit 301 in the same shift register unit group 310 are arranged in a second direction X and are insulated from each other. The second direction X intersects the first direction Y and is parallel to a row direction of the multiple display units.

In some embodiments, the signal input terminals Gn−1 of the shift register units 301 in the same shift register unit group 310 are electrically connected to the same first connection line 41 while the signal input terminals Gn−1 of the shift register units 301 in different shift register unit groups 310 are electrically connected to different first connection lines 41 and the first connection lines 41 are insulated from each other. In this manner, signals at the signal input terminals Gn−1 of the shift register units 301 in different shift register unit groups 310 do not affect each other. Correspondingly, the reset control terminals Gn+1 of the shift register units 301 in the same shift register unit group 310 are electrically connected to the same second connection line 42 while the reset control terminals Gn+1 of the shift register units 301 in different shift register unit groups 310 are electrically connected to different second connection lines 42 and the second connection lines 42 are insulated from each other. In this manner, signals at the reset control terminals Gn+1 of the shift register units 301 in different shift register unit groups 310 do not affect each other. Meanwhile, signal output terminals Gout of first shift register units 3011 in different shift register unit groups 310 are electrically connected to different seventh connection lines 47. The first connection line 41, the second connection line 42, and the seventh connection line 47 electrically connected to the shift register units 301 in the same shift register unit group 310 are insulated from each other so that signals at the signal input terminal Gn−1, the reset control terminal Gn+1, and the signal output terminal Gout of the shift register units do not affect each other. Such an arrangement can, on the premise of simplifying the connection relationship among the shift register units and reducing the number of connection lines, improve the accuracy of the scan signals output from the shift register units 301, and make the display units display and emit light accurately, thereby improving the display effect of the display panel.

In addition, the first connection line 41, the second connection line 42, and the seventh connection line 47 electrically connected to the shift register units 301 in the same shift register unit group 310 are arranged in the second direction X so that the design requirements of each shift register unit group 310 can be satisfied when in the second direction X, the size of the area for the connection lines corresponding to each shift register unit group 310 to be arranged in is the sum of line widths of the three connection lines and gap sizes among the three connection lines, thereby facilitating reducing the size of the non-display region 120 in the second direction X, and facilitating the narrow bezel of the display panel.

In some embodiments, referring to FIG. 14, in the first direction Y, the first connection line 41 electrically connected to signal input terminals Gn−1 of the shift register units 301 in the i-th shift register unit group 31$i$ overlaps first connection lines 41 electrically connected to shift register units 301 in an (i+3)-th shift register unit group 31$i$+3. That is, the extension line of the first connection line 41 electrically connected to the shift register units 301 in the i-th shift register unit group 31$i$ in the first direction Y can overlay the first connection line 41 electrically connected to the shift register units 301 in the (i+3)-th shift register unit group 31$i$+3. In other words, in the first direction Y, the first connection line 41 electrically connected to the shift register units 301 in the i-th shift register unit group 31$i$ is in a same line with the first connection line 41 electrically connected to the shift register units 301 in the (i+3)-th shift register unit group 31$i$+3.

Similarly, in the first direction Y, the second connection line 42 electrically connected to reset control terminals Gn+1 of the shift register units 301 in the i-th shift register unit group 31$i$ overlaps second connection lines 42 electrically connected to reset control terminals Gn+1 of the shift register units 301 in the (i+3)-th shift register unit group 31$i$+3. That is, the extension line of the second connection line 42 electrically connected to the shift register units 301 in the i-th shift register unit group 31$i$ in the first direction Y can overlay the second connection line 42 electrically connected to the shift register units 301 in the (i+3)-th shift register unit group 31$i$+3. In other words, the second connection line 42 electrically connected to the shift register units 301 in the i-th shift register unit group 31$i$ is in a same line with the second connection line 42 electrically connected to the shift register units 301 in the (i+3)-th shift register unit group 31$i$+3.

In addition, in the first direction Y, the first connection line 41, the seventh connection line 47, and the second connection line 42 that are electrically connected to each other overlap each other. That is, in the first connection line 41, the seventh connection line 47, and the second connection line 42 that are electrically connected to each other, the extension line of the seventh connection line 47 can overlay the first connection line 41 and the second connection line 42. In other words, the first connection line 41, the seventh connection line 47, and the second connection line 42 that are electrically connected to each other are in a same line.

In this way, the design requirements of the shift register unit groups 310 can be satisfied when in the second direction X, the size of the area for the connection lines to be arranged in is only the sum of line widths of the three connection lines and gap sizes among the three connection lines, thereby facilitating reducing the size of the non-display region 120 in the second direction X, and facilitating the narrow bezel of the display panel.

It is to be understood that i is a positive integer, so in the first direction Y, the first connection line 41 and the second connection line 42 electrically connected to the shift register units 301 in the (i+1)-th shift register unit group 31i+1 may also overlap first connection lines 41 and second connection lines 42 electrically connected to shift register units 301 in an (i+4)-th shift register unit group 31i+4. The first connection line 41 and the second connection line 42 electrically connected to the shift register units 301 in the (i+2)-th shift register unit group 31i+2 may also overlap first connection lines 41 and second connection lines 42 corresponding to shift register units 301 in an (i+5)-th shift register unit group 31i+5. The arrangement manner is the same as the first connection line 41 and the second connection line 42 corresponding to the shift register units 301 in the i-th shift register unit group 31i overlapping the first connection line 41 and the second connection line 42 corresponding to the shift register units 301 in the (i+3)-th shift register unit group 31i+3, and details are not described herein.

Referring to FIG. 14, the second connection line 42, the first connection line 41, and the seventh connection line 47 corresponding to the i-th shift register unit group 31i may be sequentially arranged in the second direction. The second connection line 42, the first connection line 41, and the seventh connection line 47 corresponding to the (i+3)-th shift register unit group 31i+3 may be sequentially arranged in the second direction. That is, the second connection line 42 and the seventh connection line 47 are located on two opposite sides of the first connection line 41, respectively. The seventh connection line 47, the second connection line 42, and the first connection line 41 corresponding to the (i+1)-th shift register unit group 31i+1 are sequentially arranged in the second direction. The seventh connection line 47, the second connection line 42, and the first connection line 41 corresponding to the (i+4)-th shift register unit group 31i+4 are sequentially arranged in the second direction. That is, the seventh connection line 47 and the first connection line 41 are located on two opposite sides of the second connection line 42, respectively. The first connection line 41, the seventh connection line 47, and the second connection line 42 corresponding to the (i+2)-th shift register unit group 31i+2 are sequentially arranged in the second direction. The first connection line 41, the seventh connection line 47, and the second connection line 42 corresponding to the (i+5)-th shift register unit group 31i+5 are sequentially arranged in the second direction. That is, the first connection line 41 and the second connection line 42 are located on two opposite sides of the seventh connection line 47, respectively.

It is to be noted that FIG. 14 is only an exemplary drawing of the embodiments of the present disclosure. In the case where in the same shift register unit group 310, the first shift register unit 3011 is also served as the second shift register unit 3012, on the premise that the size of the non-display region 120 occupied by the first connection line 41, the second connection line 42, and the seventh connection line 47 corresponding to each shift register unit group 310 is minimum, the arrangement order of the first connection line 41, the second connection line 42, and the seventh connection line 47 corresponding to each shift register unit group 310 in the second direction is not limited in the embodiments of the present disclosure. In addition, FIG. 14 only in an example shows the case where in the same shift register unit group 310, the first shift register unit 3011 is also served as the second shift register unit 3012, and the first connection line 41, the seventh connection line 47, and the second connection line 42 that are electrically connected to each other constitute a straight line in the embodiments of the present disclosure, the first connection line 41, the seventh connection line 47, and the second connection line 42 that are electrically connected to each other may also constitute a folded line.

Figure 17:
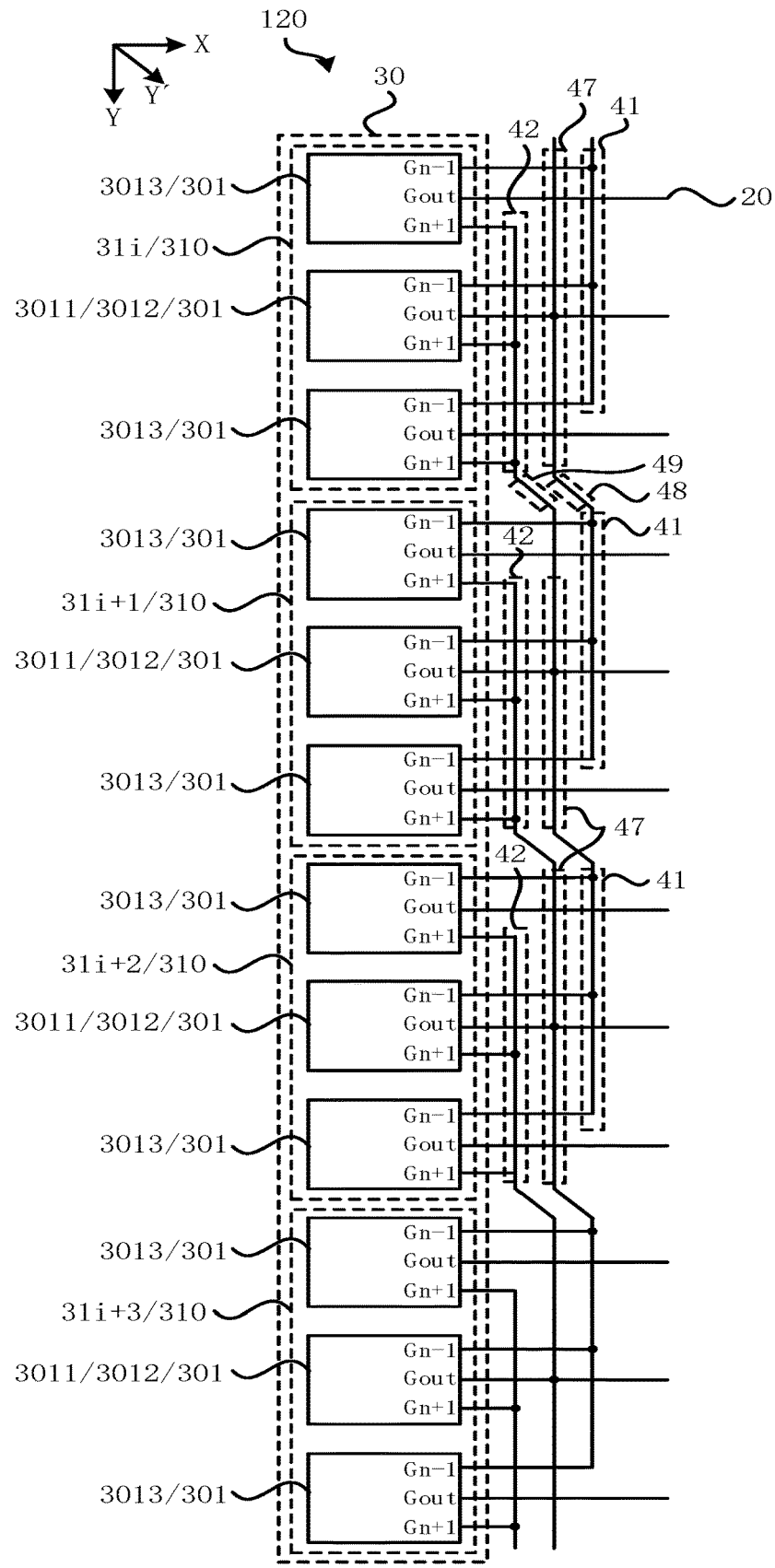
FIG. 17 is another partial schematic diagram of a non-display region in a display panel according to an embodiment of the present disclosure.

In some embodiments, FIG. 17 is another partial schematic diagram of a non-display region in a display panel according to an embodiment of the present disclosure. As shown in FIG. 17, when in the same shift register unit group, the first shift register unit 3011 and the second shift register unit 3012 are the same shift register unit, the connection lines may also include an eighth connection line 48 and a ninth connection line 49. In the thickness direction of the display panel, the eighth connection line 48 and the ninth connection line 49 do not overlap each other. The eighth connection line 48 and the ninth connection line 49 both extend in a third direction Y'. The third direction Y' intersects both a first direction Y and a second direction X. The first connection line 41 is electrically connected to the seventh connection line 47 through the eighth connection line 48. The seventh connection line 47 is electrically connected to the second connection line 42 through the ninth connection line 49. In a first direction Y, the first connection line 41, the seventh connection line 47, and the second connection line 42 that are electrically connected to each other do not overlap each other. Such an arrangement can ensure that the extension line of the seventh connection line 47 in the first direction Y does not intersect the first connection line 41 or the second connection line 42, and that the extension line of the first connection line 41 in the first direction Y does not intersect the second connection line 42. That is, the first connection line 41 and the second connection line 42 are located on different straight lines parallel to each other. In this case, the connection line constituted by the first connection line 41, the second connection line 42, and the seventh connection line 47 that are electrically connected to each other is a folded line.

In some embodiments, referring to FIG. 17, in the first direction Y, the first connection lines 41 electrically connected to shift register units 301 in different shift register unit groups 310 overlap each other. That is, the first connection lines 41 corresponding to different shift register unit groups 310 may be located on a same line. The second connection lines 42 electrically connected to the shift register units 301 in different shift register unit groups 310 overlap each other. That is, the second connection lines 42 corresponding to different shift register unit groups 310 may be located on a same line. The seventh connection lines 47 electrically connected to first shift register units 3011 in different shift register unit groups 310 overlap each other. That is, the seventh connection lines 47 corresponding to different shift register unit groups 310 may be located on a same line.

In this way, when the connection line constituted by the first connection line 41, the eighth connection line 48, the seventh connection line 47, the ninth connection line 49, and the second connection line 42 that are electrically connected to each other is a folded line, in the second direction X, the size of the area for all of the connection lines to be arranged in may also be only the sum of line widths of the three connection lines and gap sizes among the three connection lines, thereby facilitating reducing the size of the non-display region 120 in the second direction X, and facilitating the narrow bezel of the display panel.

Referring to FIG. 13, the second connection line 42, the seventh connection line 47, and the first connection line 41 electrically connected to each shift register unit 301 in the same shift register unit group 310 are sequentially arranged in the second direction. That is, the second connection line 42 and the first connection line 41 are located on two opposite sides of the seventh connection line 47, respectively. In this way, the first connection line 41, the second connection line 42, and the seventh connection line 47 corresponding to each shift register unit group 310 are arranged in the same manner, thereby facilitating simplifying the design of the shift register circuit 30 and the connection lines (41, 42, and 47) of the shift register circuit 30, simplifying the preparation mode of the display panel, and also facilitating the low cost of the display panel 100.

It is to be understood that, in the embodiments of the present disclosure, the first shift register unit 3011 and the second shift register unit 3012 in the same shift register unit group 310 may be the same or different shift register units. In this case, on the premise that the scan signal enable level output from each shift register unit 301 in the shift register circuit 30 is sequentially shifted, the arrangement of the first shift register unit 3011 and the second shift register unit 3012 is not limited in the embodiments of the present disclosure. For ease of description, the connection manner of the shift register units in the shift register circuit shown in FIGS. 13 and 17 is taken as an example to describe the solutions of the embodiments of the present disclosure.

Figure 18:
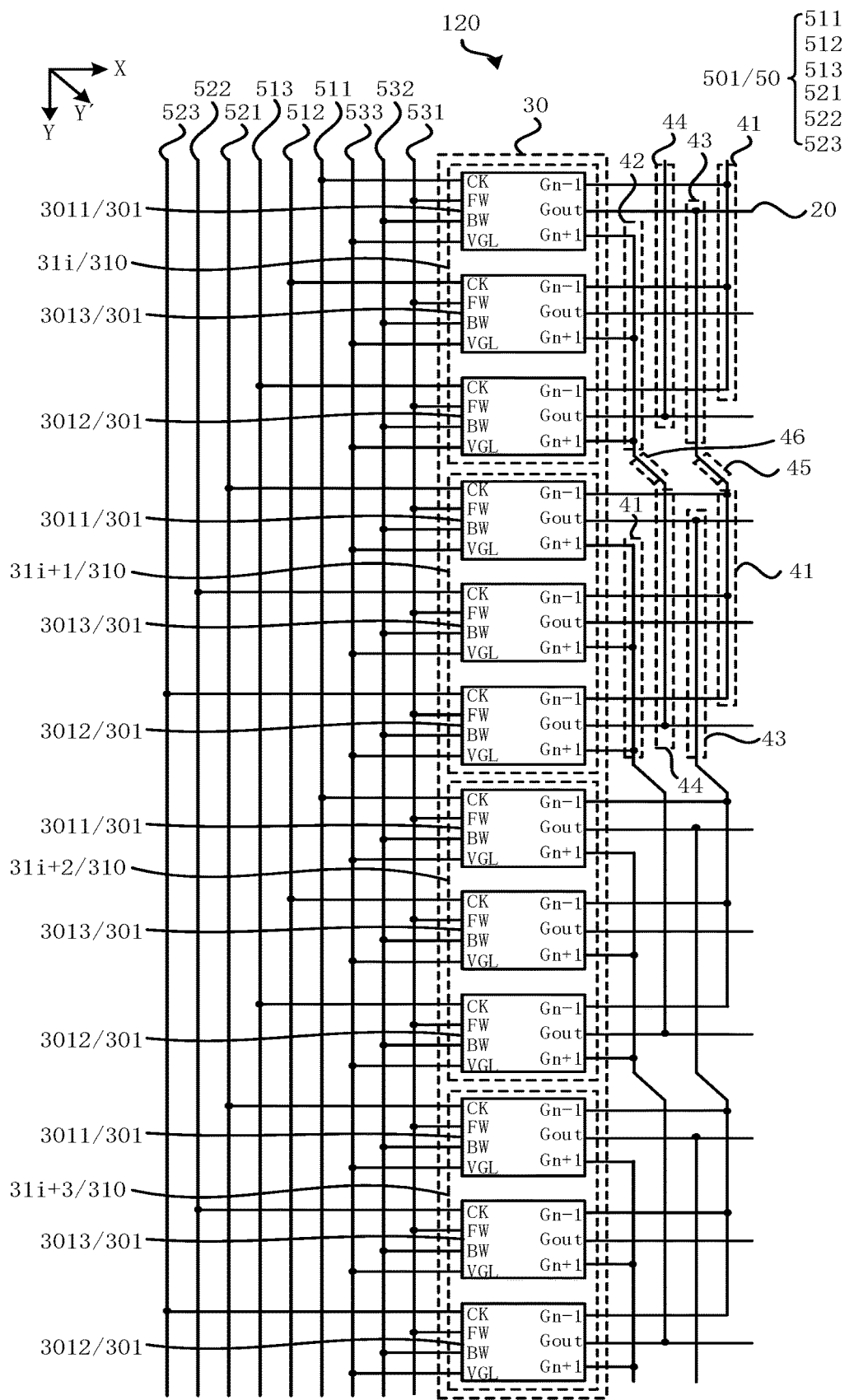
FIG. 18 is another partial schematic diagram of a non-display region in a display panel according to an embodiment of the present disclosure.
Figure 19:
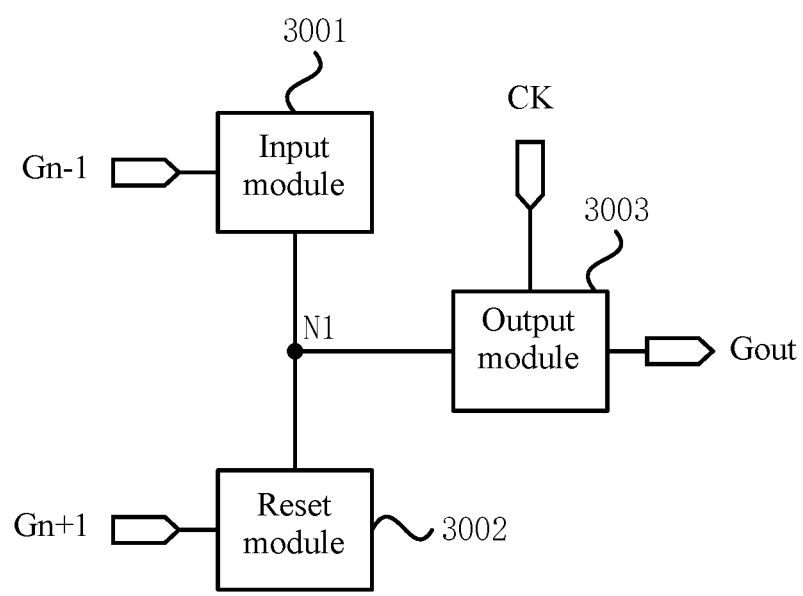
FIG. 19 is another schematic diagram of a shift register unit according to an embodiment of the present disclosure.
Figure 20:
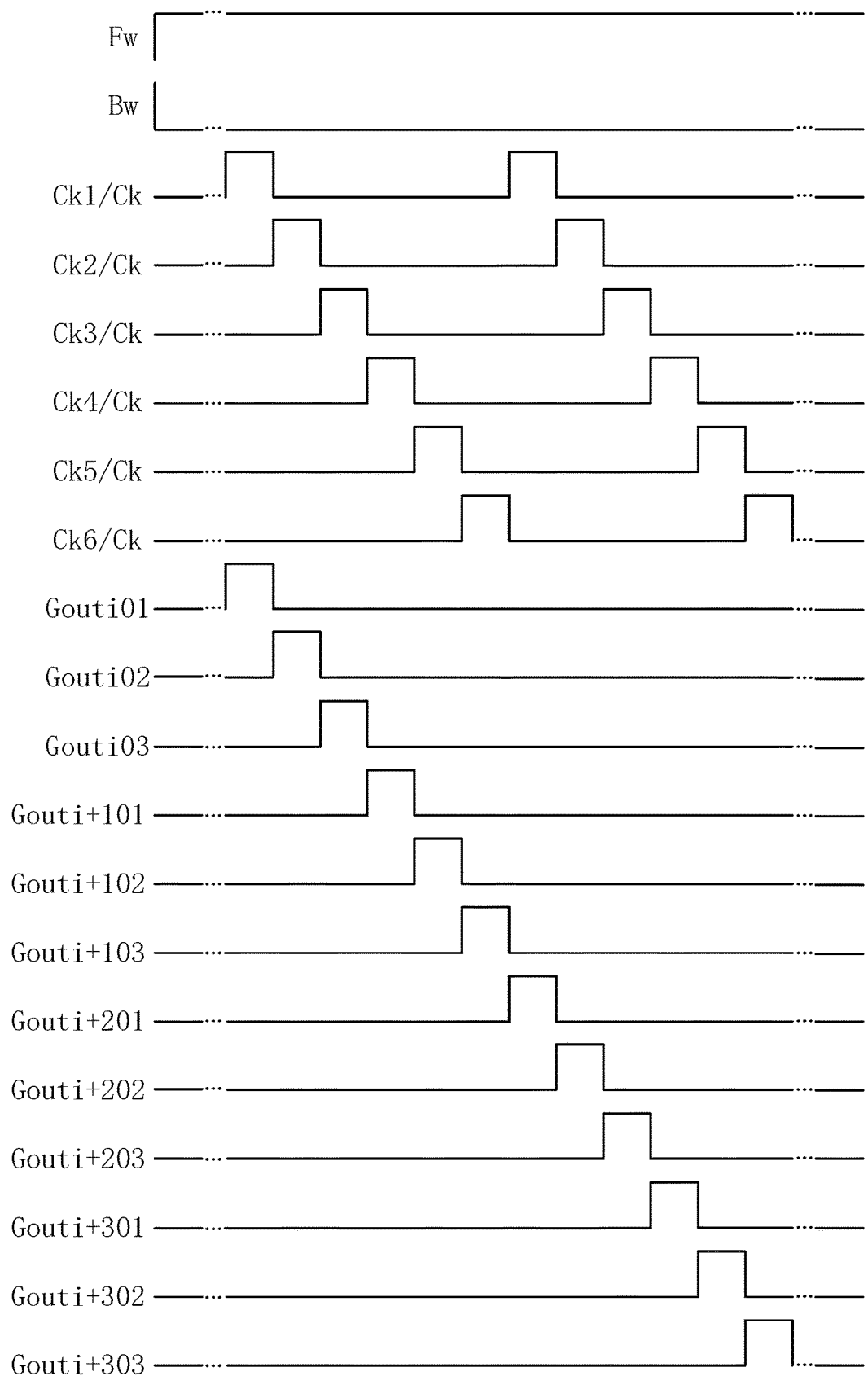
FIG. 20 is a drive timing diagram of a shift register circuit according to an embodiment of the present disclosure.

In some embodiments, FIG. 18 is another partial schematic diagram of a non-display region in a display panel according to an embodiment of the present disclosure. FIG. 19 is another schematic diagram of a shift register unit according to an embodiment of the present disclosure. FIG. 20 is a drive timing diagram of a shift register circuit according to an embodiment of the present disclosure. Referring to FIGS. 18, 19, and 20, each shift register unit 301 also includes a clock signal terminal CK. In the same shift register unit 301, when an input signal from the signal input terminal Gn−1 is at an enable level, a clock signal Ck from the clock signal terminal CK is transmitted to the signal output terminal Gout; and when a reset control signal from the reset control terminal Gn+1 is at an enable level, the clock signal Ck from the clock signal terminal CK is not transmitted to the signal output terminal Gout. In one clock cycle, an enable level of the clock signal Ck received by each shift register unit 301 in the same shift register unit group 310 is sequentially shifted.

In an example, when the first shift register unit 3011 and the second shift register unit 3012 in the same shift register unit group 310 are different shift register units, a scan signal Gouti+101 output from the signal output terminal Gout of the first shift register unit 3011 in the (i+1)-th shift register unit group 31i+1 is a signal from the signal input terminal Gn−1 of each shift register unit 301 in the (i+2)-th shift register unit group 31i+2 so that the scan signal Gouti+101 output from the first shift register unit 3011 in the (i+1)-th shift register unit group 31i+1 can control each shift register unit 301 in the (i+2)-th shift register unit group 31i+2 to simultaneously transmit the clock signal Ck from the clock signal terminal CK of each shift register unit 301 in the (i+2)-th shift register unit group 31i+2 to the signal output terminal Gout of each shift register unit 301 in the (i+2)-th shift register unit group 31i+2. A scan signal Gouti+103 output from the signal output terminal Gout of the second shift register unit 3012 in the (i+1)-th shift register unit group 31i+1 is a signal from the reset control terminal Gn+1 of each shift register unit 301 in the i-th shift register unit group 31i so that the scan signal Gouti+103 output from the signal output terminal Gout of the second shift register unit 3012 in the (i+1)-th shift register unit group 31i+1 can control each shift register unit 301 in the i-th shift register unit group 31i to simultaneously stop transmitting the clock signal Ck from the clock signal terminal CK of each shift register unit 301 in the (i+1)-th shift register unit group 31i+1 to the signal output terminal Gout of each shift register unit 301 in the (i+1)-th shift register unit group 31i+1. In this case, in one clock cycle, the enable level of the clock signal Ck received by each shift register unit 301 in the same shift register unit group 310 is sequentially shifted. In this manner, the scan signal enable level output from each shift register unit 301 in the same shift register unit group 310 can be sequentially shifted, so that scanning the display units in the display region of the display panel row by row is implemented.

Figure 21:
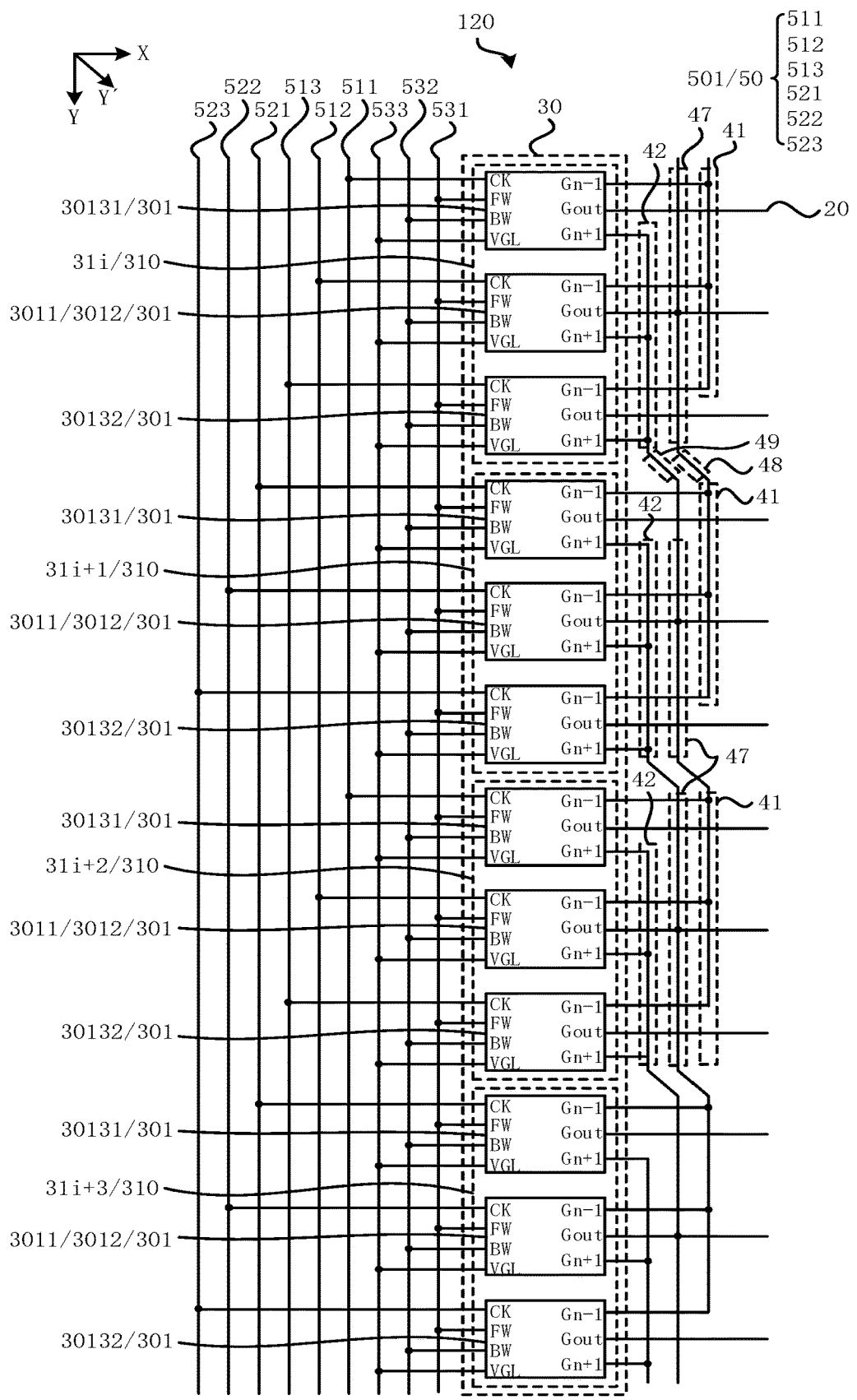
FIG. 21 is another partial schematic diagram of a non-display region in a display panel according to an embodiment of the present disclosure.

It is to be understood that the one clock cycle is from a start time of the enable level of the clock signal Ck to a next start time of the enable level of the clock signal Ck received by the clock signal terminal CK of one of the shift register units. Meanwhile, FIG. 18 only in an example shows the case where the first shift register unit 3011 and the second shift register unit 3012 in the same shift register unit group 310 are different shift register units. For the case where in the same shift register unit group 310, the first shift register unit 3011 is also served as the second shift register unit 3012 (as shown in FIG. 21), the scan signal enable level output from each shift register unit 301 in the same shift register unit group 310 can also be sequentially shifted, so that scanning the display units in the display region of the display panel row by row is implemented. The technical principles thereof are similar to that shown in FIG. 18 and details are not described herein.

It is to be noted that FIG. 19 only shows the structure of one shift register unit 301 in an example That is, one shift register unit 301 may also include an input module 3001, a reset module 3002, and an output module 3003. In the same shift register unit 301, the input module 3001 is electrically connected to the signal input terminal Gn−1 and the output module 3003 separately. The reset module 3002 is electrically connected to the reset control terminal Gn+1 and the output module 3003 separately. The output module 3003 is electrically connected to the clock signal Ck and the signal output terminal Gout separately. In this case, the signal from the signal input terminal Gn−1 may control the input module 3001 to provide the enable level to the output module 3003. The signal from the reset control terminal Gn+1 may control the reset module 3002 to provide the disable level to the output module 3003. The output module 3003 may control the clock signal Ck from the clock signal terminal CK to be transmitted to the signal output terminal Gout when receiving the enable level provided by the input module 3001, and control the clock signal Ck from the clock signal terminal CK to stop being transmitted to the signal output terminal Gout when receiving the disable level provided by the reset module 3002. In the embodiments of the present disclosure, the shift register unit 301 may also include other modules and signal terminals. The arrangement of the shift register unit is not limited in the embodiments of the present disclosure.

Figure 22:
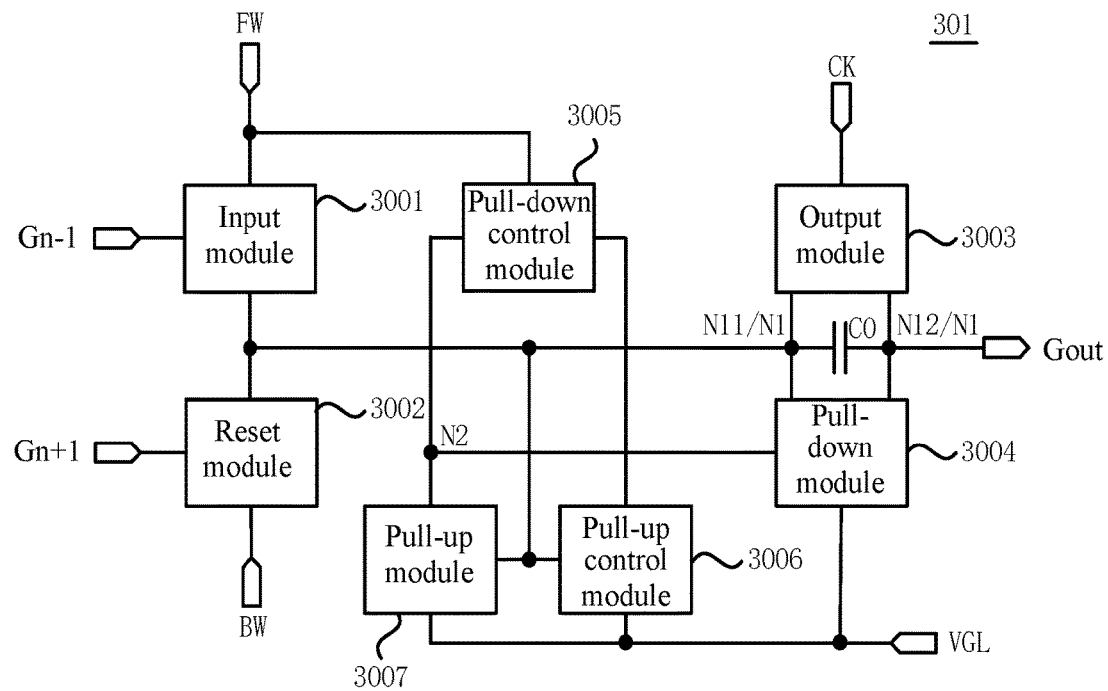
FIG. 22 is another schematic diagram of a shift register unit according to an embodiment of the present disclosure.

In some embodiments, FIG. 22 is another schematic diagram of a shift register unit according to an embodiment of the present disclosure. As shown in FIG. 22, the one shift register unit 301 may also include a scan enable terminal FW, a rereset signal terminal BW, a disable level terminal VGL, a pull-down module 3004, and a pull-down control module 3005. In this case, an input module 3001 is also electrically connected to the scan enable terminal FW. A reset module 3002 is also electrically connected to the rereset signal terminal BW. The pull-down module 3004 is electrically connected to the pull-down control module 3005, the disable level terminal VGL, and the signal output terminal Gout separately. The pull-down module 3004 and the pull-down control module 3005 are electrically connected to a second node N2 separately. In the same shift register unit 301, a signal from the signal input terminal Gn−1 can control the input module 3001 to transmit a scan enable signal Fw from the scan enable terminal FW to a first node N1. A signal from the reset control terminal Gn−1 can control the reset module 3002 to transmit a reset signal Bw from the rereset signal terminal BW to the first node N1. A pull-down control module 3005 can control the scan enable signal Fw to be transmitted from the scan enable terminal FW to the second node N2. The pull-down module 3004 can transmit a disable level signal Vgl from the disable level terminal VGL to the signal output terminal Gout according to the potential at the second node N2. In this way, when the signal output terminal Gout of the shift register unit 301 is required to output the scan signal enable level, the signal from the signal input terminal Gn−1 can control the input module 3001 to transmit the scan enable signal Fw to the first node N1 so that the clock signal Ck from the clock signal terminal CK is output from the signal output terminal Gout. That is, the scan signal and the clock signal Ck are consistent. Moreover, when the clock signal Ck from the clock signal terminal CK is needed to stop being output from the signal output terminal Gout, the signal from the reset control terminal Gn−1 can control the reset module 3002 to transmit the reset signal Bw to the first node N1, and at the same time, the pull-down control module 3005 can control the scan enable signal Fw from the scan enable terminal FW to be transmitted to the second node N2 so that the signal output terminal Gout outputs the disable level signal Vgl from the disable level terminal VGL. That is, the scan signal and the disable level signal Vgl are consistent.

In some embodiments, referring to FIG. 22, on the basis of the preceding embodiments, the shift register unit 301 may also include a pull-up control module 3006 and a pull-up module 3007. The pull-up module 3007 is electrically connected to the pull-up control module 3006, the disable level terminal VGL, and the second node N2 separately. The pull-up module 3007 and the pull-up control module 3006 are electrically connected to the first node N1 separately. The pull-up control module 3006 is also electrically connected to the pull-down control module 3005 and the disable level terminal VGL separately. In this case, the pull-up control module 3006 controls, under the control of the potential at the first node N1, the pull-down control module 3005 to decide whether to transmit the scan enable signal Fw from the scan enable terminal FW to the second node N2. Meanwhile, the pull-up module 3007 also controls the potential at the second node N2 according to the potential at the first node N1 so that the pull-down control module 3005, the pull-up control module 3006, and the pull-up module 3007 cooperate to determine the potential at the first node N1 to control whether the pull-down module 3004 transmits the disable level signal Vgl from the disable level terminal VGL to the signal output terminal Gout, thereby controlling the period of the scan signal disable level output from the shift register unit 301.

In addition, referring to FIG. 22, the shift register unit 301 may also include a capacitor C0. The presence of the capacitor C0 divides the first node N1 into a first sub-node N11 and a second sub-node N22. The presence of the capacitor C0 can separate the signal output terminal Gout from the input modules 3001, the reset module 3002, the pull-up control module 3006, and the pull-up module 3007 lest the signal from the signal output terminal Gout affects the normal working of each module, or the signal provided by each module to the first sub-node N11 affects the accuracy of the scan signal output from the signal output terminal Gout.

It is to be noted that FIG. 22 is only an exemplary drawing of the embodiments of the present disclosure, and the shift register unit may also be of another structure. Similarly, each module in the shift register unit may be constituted by an active device and/or a passive device. The active device may include a transistor. The passive device may include a capacitor, a resistor, and an inductor. On the premise that the core invention points of the embodiments of the present disclosure can be implemented, the structure of the shift register unit is not limited in the embodiments of the present disclosure.

Figure 23:
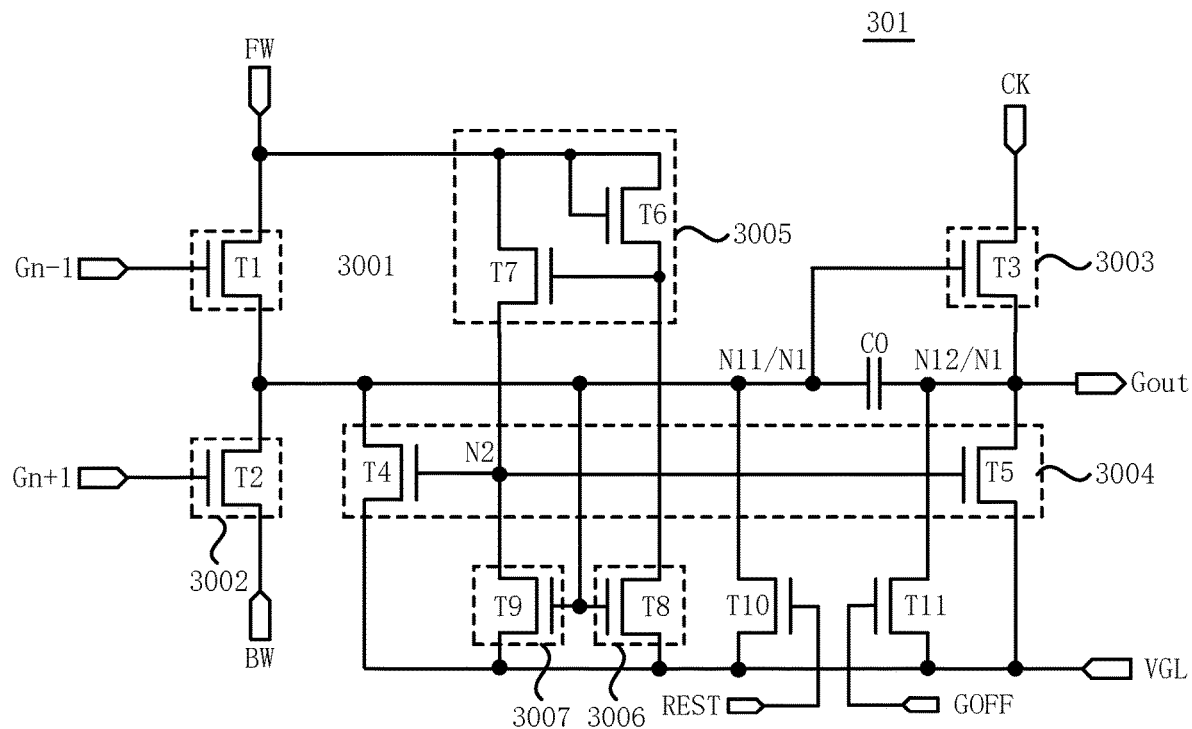
FIG. 23 is a circuit diagram of a shift register unit according to an embodiment of the present disclosure.

In an example, FIG. 23 is a circuit diagram of a shift register unit according to an embodiment of the present disclosure. As shown in FIG. 23, the input module 3001 may include a first transistor T1. The reset module 3002 may include a second transistor T2. The output module 3003 may include a third transistor T3. The pull-down module 3004 may include a fourth transistor T4 and a fifth transistor T5. The pull-down control module 3005 may include a sixth transistor T6 and a seventh transistor T7. The pull-up control module 3006 may include an eighth transistor T8. The pull-up module 3007 may include a ninth transistor T9. The gate, the first electrode, and the second electrode of the first transistor T1 are electrically connected to the signal input terminal Gn−1, the scan enable terminal FW, and the first node N1, respectively. The gate, the first electrode, and the second electrode of the second transistor T2 are electrically connected to the reset control terminal Gn+1, the rereset signal terminal BW and the first node N1, respectively. The gate, the first electrode, and the second electrode of the third transistor T3 are electrically connected to the first sub-node N11, the clock signal terminal CK, and the second sub-node N12, respectively. The gate, the first electrode, and the second electrode of the fourth transistor T4 are electrically connected to the second node N2, the disable level terminal VGL, and the first sub-node N11, respectively. The gate, the first electrode, and the second electrode of the fifth transistor T5 are electrically connected to the second node N2, the disable level terminal VGL, and the signal output terminal Gout, respectively. The gate and the first electrode of the sixth transistor T6 are both electrically connected to the scan enable terminal FW. The second electrode of the sixth transistor T6 is electrically connected to the gate of the seventh transistor T7. The first electrode, and the second electrode of the seventh transistor T7 are electrically connected to the scan enable terminal FW and the second node N2, respectively. The gate, the first electrode, and the second electrode of the eighth transistor T8 are electrically connected to the first sub-node N11, the disable level terminal VGL, and the gate of the seventh transistor T7, respectively. The gate, the first electrode, and the second electrode of the ninth transistor T9 are electrically connected to the first sub-node N11, the disable level terminal VGL, and the second node N2, respectively. The signal output terminal Gout is electrically connected to the second sub-node N12. In this way, when the gate of each transistor receives the enable level, the transistor is ON. When the gate of each transistor receives the disable level, the transistor is OFF, thereby controlling the working process of each shift register unit.

It is to be noted that FIG. 23 only shows the circuit schematic diagram of the shift register unit according to an embodiment of the present disclosure in an example and is not intended to limit the embodiments of the present disclosure. For ease of description, the circuit structure of the shift register unit shown in FIG. 23 is taken as an example to describe the solutions in the embodiments of the present disclosure.

In some embodiments, referring to FIGS. 18 and 20, a period of the enable level of a clock signal Ck (Ck4) received by the first shift register unit 3011 in the (i+1)-th shift register unit group 31i+1 does not overlap periods of the enable level of clock signals Ck (Ck1, Ck2, and Ck3) received by the shift register units 301 in the (i+2)-th shift register unit group 31i+2. A period of the enable level of a clock signal Ck (Ck6) received by the second shift register unit 3012 in the (i+1)-th shift register unit group 31i+1 does not overlap periods of the enable level of clock signals Ck (Ck1, Ck2, and Ck3) received by the shift register units 301 in the i-th shift register unit group 31i.

In an example, referring to FIGS. 18, 20, and 23, when the first shift register unit 3011 in the (i+1)-th shift register unit group 31i+1 outputs the scan signal enable level Gouti+101, that is, the scan signal Gouti+101 output from the first shift register unit 3011 in the (i+1)-th shift register unit group 31i+1 is consistent with the clock signal Ck from the clock signal terminal CK of the first shift register unit 3011 in the (i+1)-th shift register unit group 31i+1, and the clock signal Ck from the clock signal terminal CK is at enable level, the first transistor T1 of each shift register unit 301 in the (i+2)-th shift register unit group 31i+2 is ON. In this manner, the scan enable signal Fw from the scan enable terminal FW of each shift register unit 301 in the (i+2)-th shift register unit group 31i+2 can be transmitted to a respective first sub-node N11 to control the third transistor T3 of each shift register unit 301 in the (i+2)-th shift register unit group 31i+2 to be ON. In this manner, scan signals (Gouti+201, Gouti+202, and Gouti+203) output from signal output terminals Gout of the shift register units 301 in the (i+2)-th shift register unit group 31i+2 are consistent with the clock signals Ck (Ck1, Ck2, and Ck3) at respective clock signal terminals CK. Meanwhile, the period of the enable level of the clock signal Ck (Ck4) received by the first shift register unit 3011 in the (i+1)-th shift register unit group 31i+1 does not overlap the periods of the enable level of the clock signals Ck (Ck1, Ck2, and Ck3) received by the shift register units 301 in the (i+2)-th shift register unit group 31i+2. In this manner, when the first shift register unit 3011 in the (i+1)-th shift register unit group 31i+1 outputs the scan signal enable level Gouti+101, the shift register units 301 in the (i+2)-th shift register unit group 31i+2 do not output the scan signal enable levels (Gouti+201, Gouti+202, and Gouti+203). Thus, on the premise of ensuring that the scan signals output from the shift register units 301 in the same shift register unit group 310 are sequentially shifted, it can be ensured that the scan signals output by all of the shift register units in different shift register circuits are sequentially shifted, so that scanning the display units in the display region row by row is implemented.

Similarly, when the second shift register unit 3012 in the (i+1)-th shift register unit group 31i+1 outputs the scan signal enable level Gouti+102, that is, the scan signal Gouti+102 output from the second shift register unit 3012 in the (i+1)-th shift register unit group 31i+1 is consistent with the clock signal Ck from the clock signal terminal CK of the second shift register unit 3012 in the (i+1)-th shift register unit group 31i+1, and the clock signal Ck from the clock signal terminal CK is at enable level, a second transistor T2 of each shift register unit 301 in the i-th shift register unit group 31i is ON. In this manner, the reset signal Bw from the rereset signal terminal BW of each shift register unit 301 in the i-th shift register unit group 31i can be transmitted to a respective first sub-node N11 to control the third transistor T3 of each shift register unit 301 in the (i+1)-th shift register unit group 31i+1 to be OFF. In this manner, scan signals (Gouti+201, Gouti+202, and Gouti+203) output from signal output terminals Gout of the shift register units 301 in the i-th shift register unit group 31i are consistent with the clock signals Ck (Ck1, Ck2, and Ck3) at the respective clock signal terminals CK. Meanwhile, when the first sub-node N11 of each shift register unit 301 in the i-th shift register unit group 31i is the reset signal Bw, the potential of the first sub-node N11 controls the eighth transistor T8 and the ninth transistor T9 to be OFF while the sixth transistor T6 and the seventh transistor T7 remain ON. In this manner, the scan enable signal Fw from the scan enable terminal FW is transmitted to the second node N2 of each shift register unit 301 in the i-th shift register unit group 31i so that the fourth transistor T4 and the fifth transistor T5 of each shift register unit 301 in the i-th shift register unit group 31i are ON. The disable level signal Vgl from the disable level terminal VGL of each shift register unit 301 in the i-th shift register unit group 31i is transmitted to the first sub-node N11 and the second sub-node N12 separately. In this manner, scan signals (Gouti01, Gouti02, and Gouti03) output from the signal output terminals Gout of the shift register units 301 in the i-th shift register unit group 31i are consistent with the disable level signal Vgl from the disable level terminal VGL. That is, the signal output terminals Gout of the shift register units 301 in the i-th shift register unit group 31i keeps outputting the scan signal disable levels (Gouti01, Gouti02, and Gouti03). The period of the enable level of the clock signal Ck (Ck6) received by the second shift register unit 3012 in the (i+1)-th shift register unit group 31i+1 does not overlap the period of the enable level of the clock signals Ck (Ck1, Ck2, and Ck3) received by the shift register units 301 in the (i+1)-th shift register unit group 31i. In this manner, the second shift register unit 3012 in the (i+1)-th shift register unit group 31i+1 does not output the scan signal enable level Gouti+203 when the first shift register unit 3011 in the (i+1)-th shift register unit group 31i outputs the scan signal enable level Gouti01, thereby ensuring the accuracy of the scan signal output from each shift register unit.

In addition, referring to FIG. 23, each shift register unit 301 may also include a tenth transistor T10, an eleventh transistor T11, a set signal terminal REST, and a clear signal terminal GOFF. In the same shift register unit 301, the gate of the tenth transistor T10 is electrically connected to the set signal terminal REST. The gate of the eleventh transistor T11 is electrically connected to the clear signal terminal GOFF. The first electrode of the tenth transistor T10 and the first electrode of the eleventh transistor T11 are both electrically connected to the disable level terminal VGL. The second electrode of the tenth transistor T10 is electrically connected to the first sub-node N11. The second electrode of the eleventh transistor T11 is electrically connected to the signal output terminal Gout to the second sub-node N12. In this way, before each shift register unit 301 in the first shift register unit group outputs the scan signal enable level, a set signal Rest from the set signal terminal REST can control tenth transistors T10 in all of the shift register units 301 to be turned on so that the disable level signal Vgl from the disable level terminal VGL is transmitted to the first sub-node N11 through the tenth transistor T10 to prevent the potential of the first sub-node N11 in a previous drive cycle from affecting the working process of the current drive cycle. Meanwhile, before each shift register unit 301 in the first shift register unit group outputs the scan signal enable level, a clear signal Goff at the clear signal terminal GOFF may also control the eleventh transistor T11 in all of the shift register units 301 to be turned on so that a disable level signal Vgl from a disable level terminal VGL is transmitted to the signal output terminal Gout through the eleventh transistor T11 to clear the scan signal output from the signal output terminal Gout of each shift register unit 301, preventing the signal output from the signal output terminal Gout from being affected by the interference of other signals, thereby improving the accuracy of the scan signal output from each shift register unit 301.

In some embodiments, referring to FIGS. 18 and 20, in the same shift register unit group 310, the shift amount of the enable level of the clock signal Ck received by each shift register unit 301 is greater than or equal to the width of the enable level of the clock signal Ck. End times of the enable level of the clock signals Ck (Ck1, Ck2, and Ck3) received by the shift register units 301 in the i-th shift register unit group 31i are before start times of the enable level of clock signals Ck (Ck4, Ck5, and Ck6) received by the shift register units 301 in the (i+1)-th shift register unit group 31i+1. In this way, when the potential of the first sub-node N11 of each shift register unit 301 in the same shift register unit group 310 is the enable level, each shift register unit 301 in the shift register unit group 310 can sequentially output the scan signal enable level. Meanwhile, when the first shift register unit 3011 in the i-th shift register unit group 31i outputs the scan signal enable level Gouti01, the potential of the first sub-node N11 of each shift register unit 301 in the (i+1)-th shift register unit group 31i+1 becomes the enable level. In this case, after the shift register units 301 in the i-th shift register unit group 31i output the scan signal enable levels (Gouti01, Gouti02, and Gouti03), the shift register units 301 in the (i+1)-th shift register unit group 31i+1 start sequentially outputting the scan signal enable levels (Gouti+101, Gouti+102, and Gouti+103), ensuring that the scan signals output from the shift register units 301 in any two adjacent shift register unit groups 310 do not interfere with each other.

It is to be understood that for the scan signals (Gouti+102, Gouti+202, and Gouti+203) output from the shift register units 301 in the (i+2)-th shift register unit group 31i+2 and the scan signals (Gouti+301, Gouti+302, and Gouti+303) output from the shift register units 301 in the (i+3)-th shift register unit group 31i+3, reference can be made to the description of the scan signals (Gouti01, Gouti02, and Gouti+103) output from the shift register units 301 in the i-th shift register unit group 31i and the scan signals (Gouti+101, Gouti+102, and Gouti+103) output from the shift register units 301 in the (i+1)-th shift register unit group 31i+1, and details are not repeated herein.

It is to be noted that the case where the clock signal from the clock signal terminal of each shift register unit in any two adjacent shift register unit groups does not overlap each other is also applicable to the case where in the same shift register unit group, the first shift register unit is also served as the second shift register unit. Similarities may be understood with reference to the preceding description and are not repeated herein.

Figure 24:
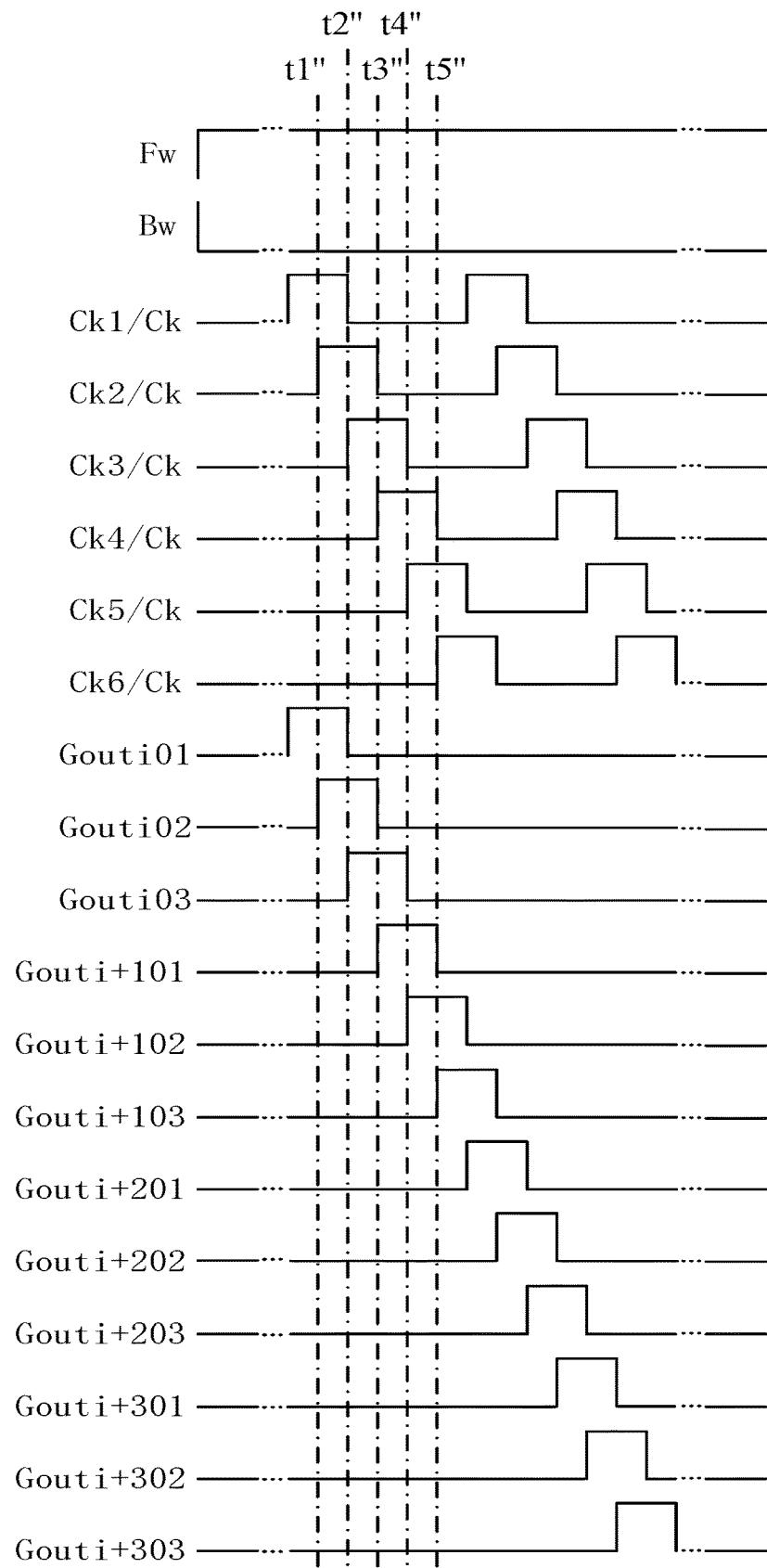
FIG. 24 is another drive timing diagram of a shift register circuit according to an embodiment of the present disclosure.

In some embodiments, FIG. 24 is another drive timing diagram of a shift register circuit according to an embodiment of the present disclosure. Referring to FIGS. 21 and 24, in the same shift register unit group 310, the shift amount of the enable level of the clock signal Ck received by each shift register unit 301 is less than the width of the enable level of the clock signal Ck. In an example, taking the clock signals Ck (Ck1, Ck2, and Ck3) received by the shift register units 301 in the i-th shift register unit group 31i as an example, a shift amount Δt of the enable level of the clock signal Ck1 received by a shift register unit 3011 that second outputs the scan signal enable level in the i-th shift register unit group 31i with respect to the enable level of the clock signal Ck2 received by a shift register unit 30131 that outputs the first scan signal enable level in the i-th shift register unit group 31i is t2"–t1". The shift amount Δt is less than the width (t3"–t1") of the enable level of the clock signal Ck (Ck1, Ck2, or Ck3). In this case, compared with the scan signal enable level Gouti01 output from the shift register unit 30131 in the i-th shift register unit group 31i, the scan signal enable level Gouti02 output from the shift register unit 3011 in the i-th shift register unit group 31i also has the shift amount of Δt. In this manner, the scan signal enable level output from each shift register unit 301 in the same shift register unit group 310 can be sequentially shifted.

In addition, referring to FIGS. 21 and 24, when in the same shift register unit group 310, the shift register unit 3011 that outputs the first scan signal enable level is a first shift register unit 30131, and the shift register unit 301 that outputs the last scan signal enable level is a second shift register unit 30132, an end time t4" of the enable level of the clock signal Ck3 received by the second shift register unit 30132 in the i-th shift register unit group 31i is after a start time t3" of the enable level of the clock signal Ck4 received by the first shift register unit 30131 in the (i+1)-th shift register unit group 31i+1. The end time t4" of the enable level Ck3 of the clock signal Ck3 received by the second shift register unit 30132 in the i-th shift register unit group 31i is before an end time t5" of the enable level of the clock signal Ck4 received by the first shift register unit 30131 in the (i+1)-th shift register unit group 31i+1. In this way, the enable level of the clock signal Ck received by each shift register unit 301 in any adjacent two shift register unit groups 310 can be sequentially shifted so that the scan signal output from each shift register unit 301 in any adjacent two shift register unit groups 310 can be sequentially shifted.

It is to be noted that the case where the clock signal from the clock signal terminal of each shift register unit in any adjacent two shift register unit groups is sequentially shifted, and the shift amount is less than the width of the enable level of the clock signal is also applicable to the case where the first shift register unit and the second shift register unit in the same shift register unit group are different shift register units. Similarities may be understood with reference to the preceding description and are not repeated herein.

In some embodiments, referring to FIG. 18 or 21, when the shift register unit 301 includes the clock signal terminals CK, the non-display region 120 also includes multiple clock signal line groups 50. Each clock signal line group 50 includes multiple clock signal lines 501. The clock signal terminal CK of each shift register unit 301 in the same shift register unit group 310 is electrically connected to a respective clock signal line 501 in the same clock signal line group 50 in a one to one correspondence. Clock signal lines (511, 512, and 513) electrically connected to the shift register units 301 in the i-th shift register unit group 31i are also served as clock signal lines electrically connected to the shift register units 301 in the (i+2)-th shift register unit group 31i+2. Each shift register unit 301 in the i-th shift register unit group 301 and each shift register unit 301 in the (i+1)-th shift register unit group 31i+1 are electrically connected to different ones of the multiple clock signal lines, respectively.

The clock signals Ck (Ck1, Ck2, and Ck3) of the shift register units 301 in the i-th shift register unit group 31i are transmitted through the clock signal lines (511, 512, and 513) electrically connected to the shift register units 301 in the i-th shift register unit group 31i, respectively. The clock signals Ck (Ck4, Ck5, Ck6) of the shift register units 301 in the (i+1)-th shift register unit group 31i+1 are transmitted through the clock signal lines (521, 522, and 523) electrically connected to the shift register units 301 in the (i+1)-th shift register unit group 31i+1 transmit, respectively.

In some embodiments, when the clock signal lines (511, 512, and 513) electrically connected to the shift register units 301 in the i-th shift register unit group 31i are also served as the clock signal lines electrically connected to the shift register units 301 in the (i+2)-th shift register unit group 31i+2, the clock signals Ck (Ck1, Ck2, and Ck3) of the shift register units 301 in the (i+2)-th shift register unit group 31i+2 are the same as the clock signals Ck (Ck1, Ck2, and Ck3) from the clock signal terminals CK of the shift register units 301 in the i-th shift register unit group 31i, and the clock signals Ck (Ck1, Ck2, and Ck3) of the shift register units 301 in the (i+2)-th shift register unit group 31i+2 are different from the clock signals Ck (Ck4, Ck5, and Ck6) from the clock signal terminals CK of the shift register units 301 in the (i+1)-th shift register unit group 31i+1. In this case, when the first shift register unit 3011 in the (i+1)-th shift register unit group 31i+1 outputs the scan signal enable level, the clock signal Ck from the clock signal terminal CK of each shift register unit 301 in the (i+2)-th shift register unit group 31i+2 is transmitted to a respective signal output terminal Gout. The scan signal enable level output from the first shift register unit 3011 in the (i+1)-th shift register unit group 31i+1 is the enable level of the clock signal terminal CK of the first shift register unit 3011, so even if the clock signal Ck from the clock signal terminal CK of each shift register unit 301 in the (i+2)-th shift register unit group 31i+2 is transmitted to a respective signal output terminal Gout, the signal output terminal Gout of each shift register unit 301 in the (i+2)-th shift register unit group 31i+2 keeps outputting the scan signal disable level, ensuring that the scan signal enable level output from each shift register unit in the shift register circuit 30 is sequentially shifted.

Meanwhile, similar to the case where the clock signal lines (511, 512, and 513) electrically connected to the shift register units 301 in the i-th shift register unit group 31i are also served as the clock signal lines electrically connected to the shift register units 301 in the (i+2)-th shift register unit group 31i+2, the clock signal lines (521, 522, and 523) electrically connected to the shift register units 301 in the (i+1)-th shift register unit group 31i+1 are also served as clock signal lines electrically connected to the shift register units 301 in the (i+3)-th shift register unit group 31i+3. In this way, the requirement of providing the clock signal Ck to the clock signal terminal CK of each shift register unit 301 in each shift register unit group 310 can be satisfied by providing only two clock signal line groups 50 in the non-display region 120, reducing the area occupied by the clock signal lines (511, 512, 513, 521, 522, and 523) in the non-display area 120, and facilitating the narrow bezel of the display panel.

It is to be noted that FIGS. 18 and 23 only show that the clock signal lines for transmitting the clock signals and the connection lines corresponding to the shift register unit groups are respectively located on two opposite sides of the shift register circuit, in an example. However, in the embodiments of the present disclosure, the clock signal lines for transmitting the clock signals and the connection lines corresponding to the shift register unit groups may also be located on one side of the shift register circuit. In this case, the clock signal lines and the connection lines may be located on one side of the shift register circuit facing to or facing away from the display region and are not limited in the embodiments of the present disclosure.

In addition, referring to FIG. 18 or 21, when each shift register unit 301 also includes the scan enable terminal FW, the reset signal terminal BW, and the disable level terminal VGL. The non-display region 120 shall also include a first level line 531, a second level line 532, and a third level line 533. The first level line 531 is configured to transmit the scan enable signal Fw from the scan enable terminal FW in each shift register unit 301. The second level line 532 is configured to transmit the reset signal BW from the reset signal terminal BW in each shift register unit 301. The third level line 533 is configured to transmit the disable level signal Vgl from the disable level terminal VGL in each shift register unit 301. The first level line 531, the second level line 532, and the third level line 533 may be adaptively disposed according to the proximity principle and are not limited in the embodiments of the present disclosure.

Figure 25:
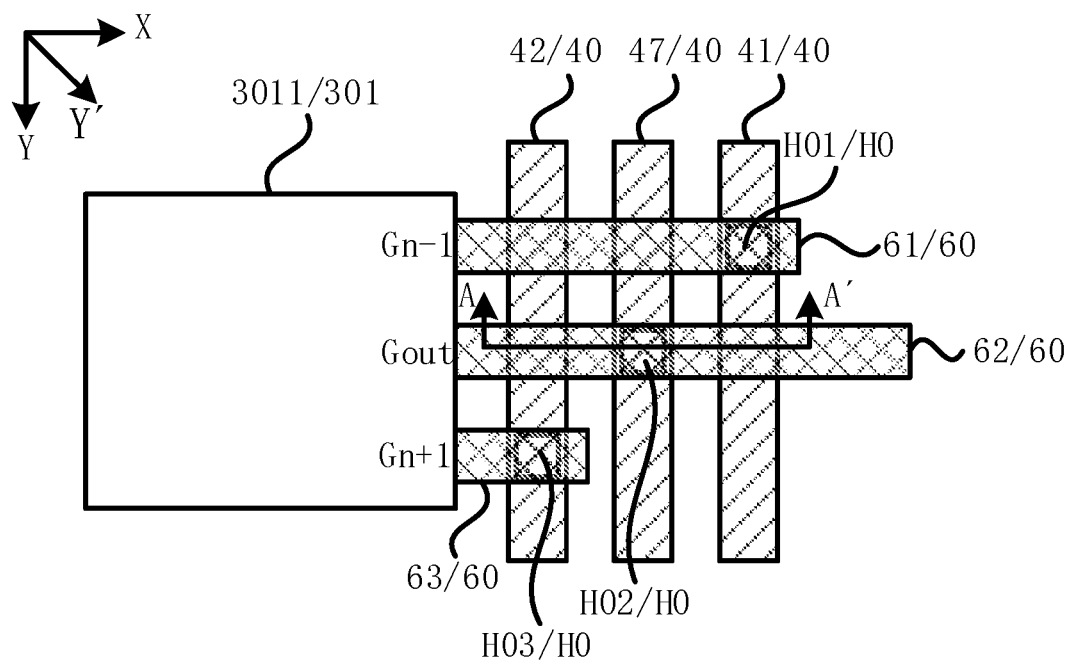
FIG. 25 is a partial top view illustrating a non-display region according to an embodiment of the present disclosure.

In some embodiments, FIG. 25 is a partial top view illustrating a non-display region according to an embodiment of the present disclosure. As shown in FIG. 25, each shift register unit 301 includes a lead-out line group 60. The lead-out line group 60 includes a first lead-out line 61, a second lead-out line 62, and a third lead-out line 63. The first lead-out line 61, the second lead-out line 62, and the third lead-out line 63 are arranged in a first direction Y and each extends in a second direction X. The second direction X intersects the first direction Y and is parallel to a row direction of the multiple display units. The first lead-out line 61 is served as the signal input terminal Gn−1 of the shift register unit 301. The second lead-out line 62 is served as the signal output terminal Gout of the shift register unit 301, and the third lead-out line 63 is served as the reset control terminal Gn+1 of the shift register unit 301. In this way, the signal input terminal Gn−1, the signal output terminal Gout, and the reset control terminal Gn+1 of the shift register unit 301 are led out by the lead-out lines 60 to facilitate the electrical connection among the signal input terminal Gn−1, the signal output terminal Gout, and the reset control terminal Gn+1 of the shift register unit 301 and the connection lines 40.

Figure 26:
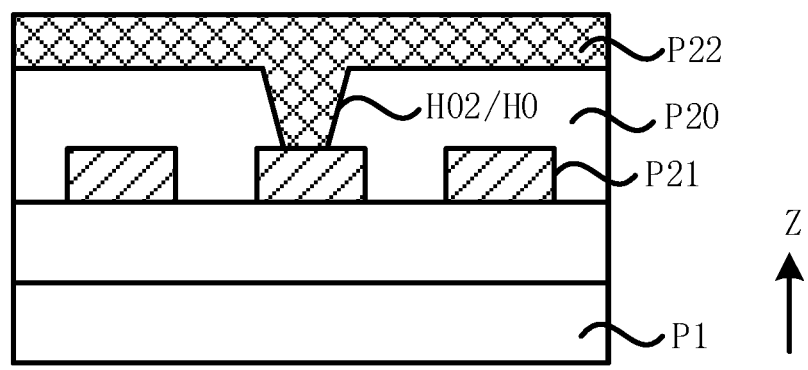
FIG. 26 is a section view of the non-display region in FIG. 25 taken along section A-A'.

In some embodiments, FIG. 26 is a section view of the non-display region in FIG. 25 taken along a section A-A'. Referring to FIGS. 26 and 25, the display panel also includes a base substrate P1, a first metal layer P21, and a second metal layer P22 insulated from and spaced apart from the first metal layer P21. The first metal layer P21 and the second metal layer P22 are located on a side of the base substrate P1. The first metal layer P21 includes the multiple connection lines 40. The second metal layer P22 includes the lead-out lines 60. A lead-out line 62 is electrically connected to a respective connection line 40 through a via H0.

In an example, the case where in the same shift register unit group, the first shift register unit 3011 is also served as the second shift register unit is taken as an example, the signal input terminal Gn−1, the signal output terminal Gout, and the reset control terminal Gn+1 of the first shift register unit 3011 in the (i+1)-th shift register unit group 31i+1 correspond to the first lead-out line 61, the second lead-out line 62, and the third lead-out line 63, respectively. In this case, the second connection line 42, the seventh connection line 47, and the first connection line 41 corresponding to the first shift register unit 3011 are arranged in the second direction X and each extends in the first direction Y. The connection lines 40 and the lead-out lines 60 are located at different metal layers (P21 and P22) insulated from each other, respectively. An insulating layer P20 is disposed between the first metal layer P21 and the second metal layer P22. Therefore, among the lead-out lines 60 and the connection lines 40 in the same shift register unit 301, in a thickness direction Z of the display panel, the second connection line 42 overlaps the first lead-out line 61 and the second lead-out line 62 that are not connected to the second lead-out line 62, the seventh connection line 47 overlaps the first lead-out line 61 and the third lead-out line 63 that are not connected to the seventh connection line 47, and the first connection line 41 overlaps the second lead-out line 62 and the third lead-out line 63 that are not electrically connected to the first connection line 41 so that the signals transmitted therethrough are not affected. When the first lead-out line 61 and the first connection line 41 that are electrically connected to each other are located in different films, the first lead-out line 61 may be electrically connected to the first connection line 41 through a via H01. The second lead-out line 62 may be electrically connected to the seventh connection line 47 through a via H02. The third lead-out line 63 may be electrically connected to the second connection line 42 through a via H03.

Figure 27:
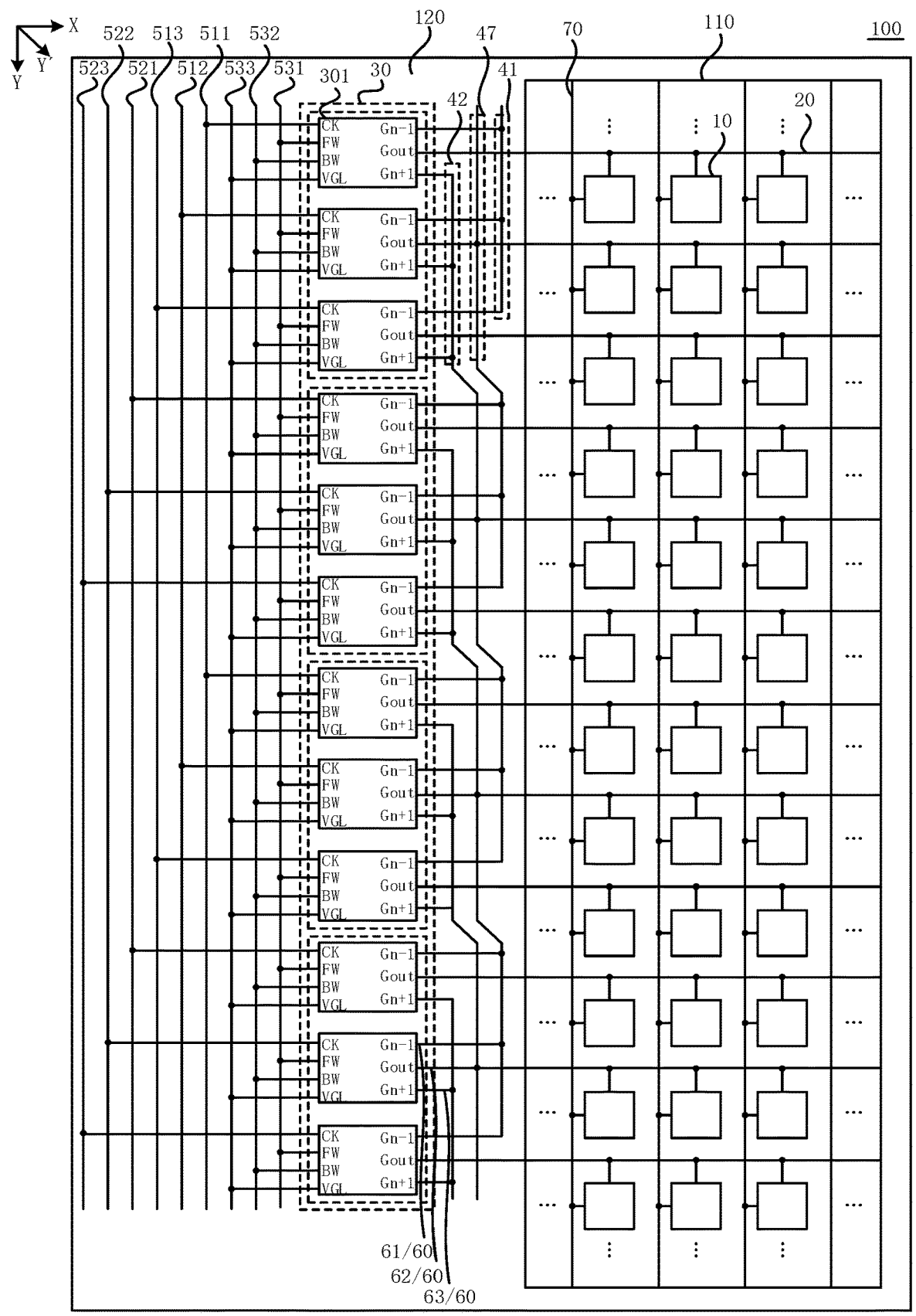
FIG. 27 is another schematic diagram of a display panel according to an embodiment of the present disclosure.

In some embodiments, FIG. 27 is another schematic diagram of a display panel according to an embodiment of the present disclosure. As shown in FIG. 27, the display region 120 also includes multiple data signal lines 70. At least two of the multiple display units 10 located in the same column share a respective data signal line 70. In this case, in the scan signal line 20 and the data signal line 70 electrically connected to the same display unit 10, when the scan signal line 20 transmits the scan signal enable level, a data signal transmitted by the data signal line 70 can be written into the display unit 10 so that the display unit 10 can display and emit light according to the data signal. In this way, the display units 10 electrically connected to the same scan signal line 20 may be electrically connected to different data signal lines 70. The display units 10 electrically connected to the same data signal line 70 may be electrically connected to different scan signal lines 20 so that when each shift register unit 301 in the shift register circuit 30 provides the scan signal to the respective scan signal line 20 and the display units 10 are scanned row by row, data signals transmitted by the data signal lines 70 can be written to the display units 10 in one-to-one correspondence.

It is to be understood that when the display panel 100 includes both the scan signal lines 20 and the data signal lines 70, the display unit 10 may include at least one switch transistor. The gate of the at least one switch transistor is electrically connected to the scan signal line 20. The first electrode of the at least one switch transistor is electrically connected to the data signal line 70. The second electrode of the at least one switch transistor is electrically connected to another device. In this manner, when the scan signal line 20 transmits the scan signal enable level, the switch transistor can be controlled to be ON so that the data signal in the data signal line 70 electrically connected to the first electrode is transmitted to the second electrode of the switch transistor, thereby achieving the writing of the data signal. The first electrode of the switch transistor may be the source. The second electrode may be the drain. In other embodiments, the first electrode of the switch transistor may be the drain. The second electrode source of the switch transistor may be the source. The arrangement can be determined according to the transmitted signals and the characteristics of the switch transistor and is not limited in the embodiments of the present disclosure.

Figure 28:
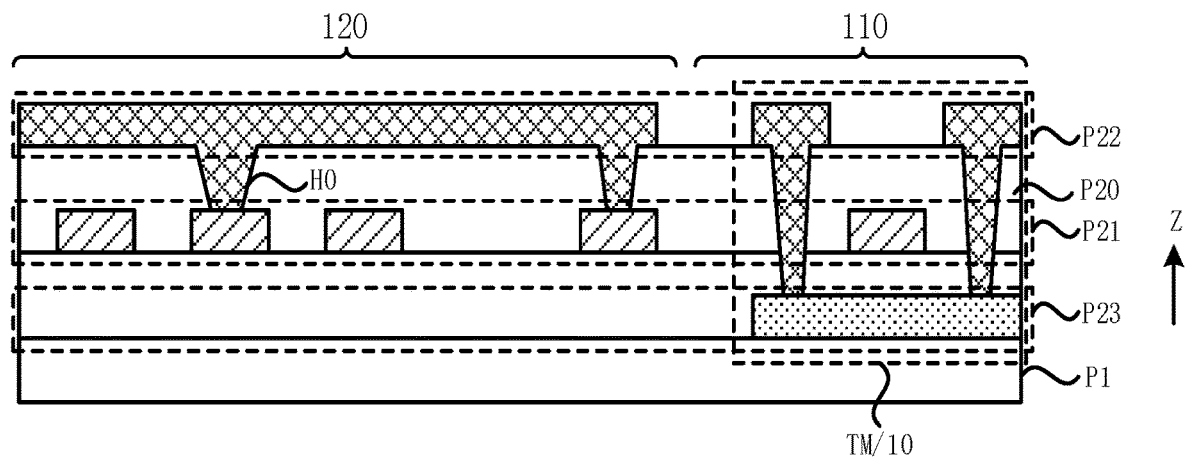
FIG. 28 is a schematic diagram of films of a display panel according to an embodiment of the present disclosure.

Correspondingly, FIG. 28 is a schematic diagram of films of a display panel according to an embodiment of the present disclosure. Referring to FIGS. 27 and 28, a first metal layer P21 may also include the scan signal lines 20. a second metal layer P21 may also include the data signal lines 70.

In an example, referring to FIGS. 25, 27, and 28, the case where the structure of the switch transistor TM represents the structure of the display unit 10 is taken as an example. The gate of the switch transistor TM is electrically connected to the scan signal line 20. The first electrode of the switch transistor TM is electrically connected to the data signal line 70. Therefore, to simplify the design, the first electrode and the second electrode of the switch transistor TM are disposed in the same layer as the data signal lines 70. The gate of the switch transistor TM is disposed in the same layer as the scan signal lines 20. In this case, the scan signal lines 20 are disposed in the same layer as the connection lines 40. The data signal lines 30 are disposed in the same layer as the lead-out lines 60. In this manner, the scan signal lines 20 and the connection lines 40 can be made of the same material in the same process. The data signal lines 70 and the lead-out lines 60 can be made of the same material in the same process. Thus, it is feasible to simplify the manufacturing process of the display panel 100 and facilitate the low cost and miniaturization of the display panel 100.

Figure 29:
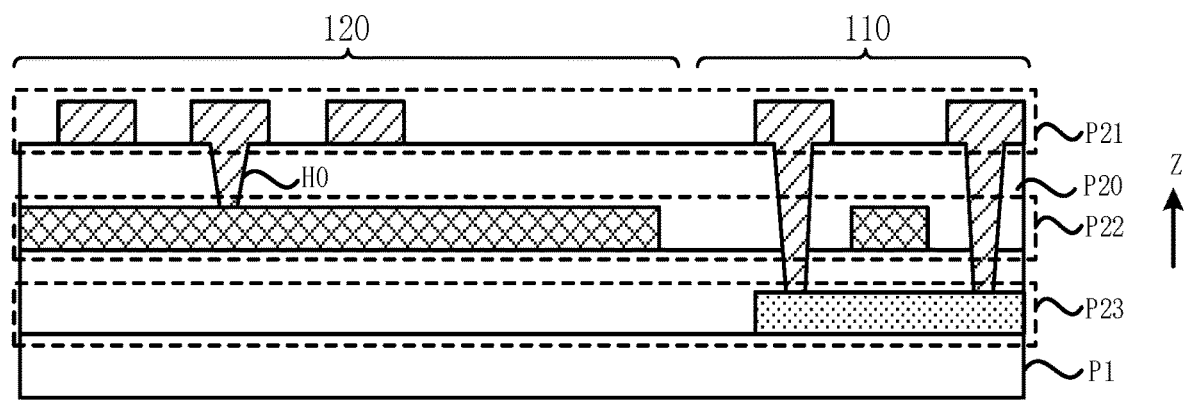
FIG. 29 is another schematic diagram of films of a display panel according to an embodiment of the present disclosure.

In another embodiment, FIG. 29 is another schematic diagram of films of a display panel according to an embodiment of the present disclosure. Referring to FIGS. 25, 27, and 29, a first metal layer P21 includes the connection lines 40 and the data signal lines 70. A second metal layer P22 includes the lead-out lines 60 and the scan signal lines 20. In this case, the data signal lines 70 and the connection lines 40 can be made of the same material in the same process. The scan signal lines 20 and the lead-out lines 60 can be made of the same material in the same process. In this way, it is also feasible to simplify the manufacturing process of the display panel 100 and facilitate the low cost and miniaturization of the display panel 100.

Correspondingly, referring to any one of FIGS. 28 and 29, the display panel 100 shall also include a semiconductor layer P23. The semiconductor layer P23 includes an active layer of the switch transistor TM and is insulated from both the first metal layer P21 and the second metal layer P22.

It is to be noted that the above in an example shows the case where the connection lines and the lead-out lines are located in different films. However, in the embodiments of the present disclosure, the lead-out lines may also be disposed in the same layer as the connection lines. In this case, a lead-out line is electrically connected to a respective connection line through a respective jumper.

Figure 30:
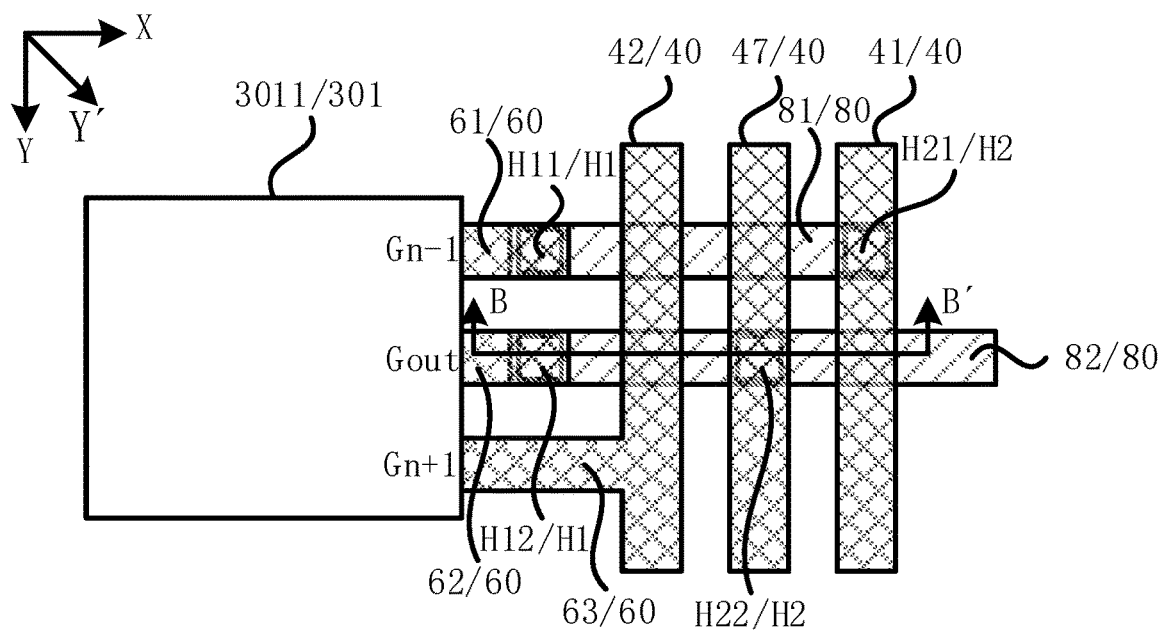
FIG. 30 is a partial another partial top view illustrating a non-display region according to an embodiment of the present disclosure.
Figure 31:
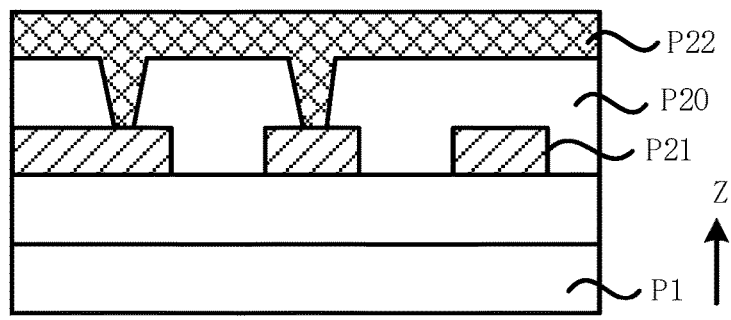
FIG. 31 is a section view of the non-display region in FIG. 30 taken along a section B-B'.

In some embodiments, FIG. 30 is a partial another partial top view illustrating a non-display region according to an embodiment of the present disclosure. FIG. 31 is a section view of the non-display region in FIG. 30 taken along a section B-B'. Referring to FIGS. 30 and 31, the non-display region also includes multiple jumpers 80 extending in a second direction X. In this case, the display panel also includes a base substrate P1, a first metal layer P21, and a second metal layer P22 insulatedly spaced apart from the first metal layer P21. The first metal layer P21 and the second metal layer P22 are located on a side of the base substrate P1. The first metal layer P21 includes the connection lines 40 and the lead-out lines 60. The second metal layer P22 includes the jumpers 80. At least two of the lead-out lines 60 are electrically connected to the connection lines 40 through the jumpers 80. Moreover, a lead-out line 60 of the at least two of the lead-out lines 60 is electrically connected to a respective jumper 80 through a first via H1. The respective jumper 80 is electrically connected to a respective connection line 40 through a second via H2.

In an example, the case where in the same shift register unit group, the first shift register unit 3011 is also served as the second shift register unit is taken as an example, the signal input terminal Gn−1, the signal output terminal Gout, and the reset control terminal Gn+1 of the first shift register unit 3011 in the (i+1)-th shift register unit group 31$i$+1 correspond to the first lead-out line 61, the second lead-out line 62, and the third lead-out line 63, respectively. In this case, the second connection line 42, the seventh connection line 47, and the first connection line 41 corresponding to the first shift register unit 3011 are arranged in the second direction X and each extends in the first direction Y. Among the lead-out lines 60 and the connection lines 40 corresponding to the same shift register unit 301, the first connection line 41 is electrically connected to the first lead-out line 61. The second connection line 42 is electrically connected to the third lead-out line 63. The seventh connection line 47 is electrically connected to the second lead-out line 62. In this case, the second connection line 42 and the third lead-out line 63 may be of an integral structure. The first lead-out line 61 is electrically connected to a jumper 81 through a first via H11. The jumper 81 is electrically connected to the first connection line 41 through a second via H21. In this manner, in a thickness direction Z of the display panel, the jumper 81 overlaps the second connection line 42 and the seventh connection line 47. The first lead-out line 61 is electrically connected to neither the second connection line 42 nor the seventh connection line. The second lead-out line 62 is electrically connected to a jumper 82 through a first via H12. The jumper 82 is electrically connected to the seventh connection line 47 through a second via H22. In this manner, in the thickness direction Z of the display panel, the jumper 82 overlaps the second connection line 42 and the first connection line 41 while the second lead-out line 62 is electrically connected to neither the second connection line 42 nor the first connection line 41. Such an arrangement can also make the connection line 40 and the lead-out line 60 accurately transmit signals.

Figure 32:
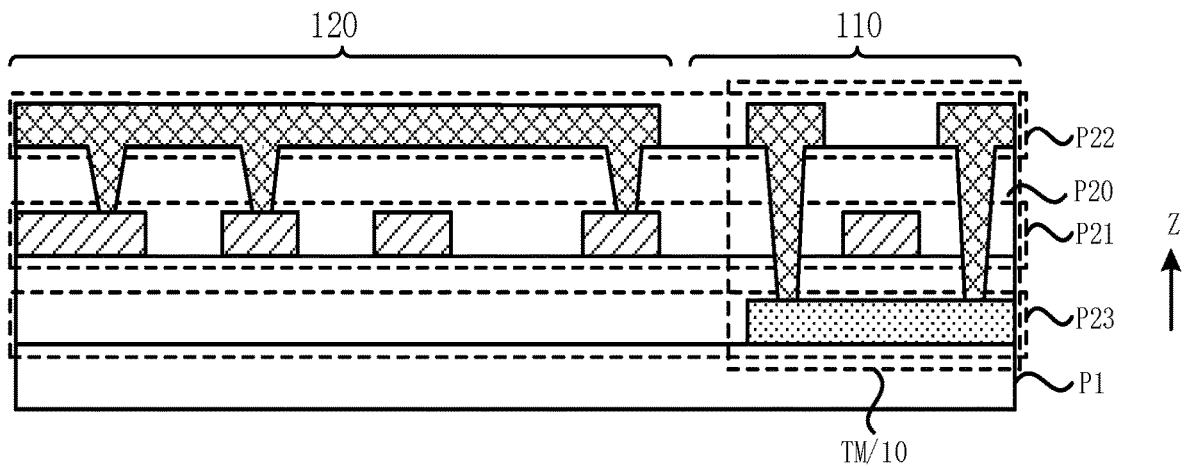
FIG. 32 is another schematic diagram of films of a display panel according to an embodiment of the present disclosure.
Figure 33:
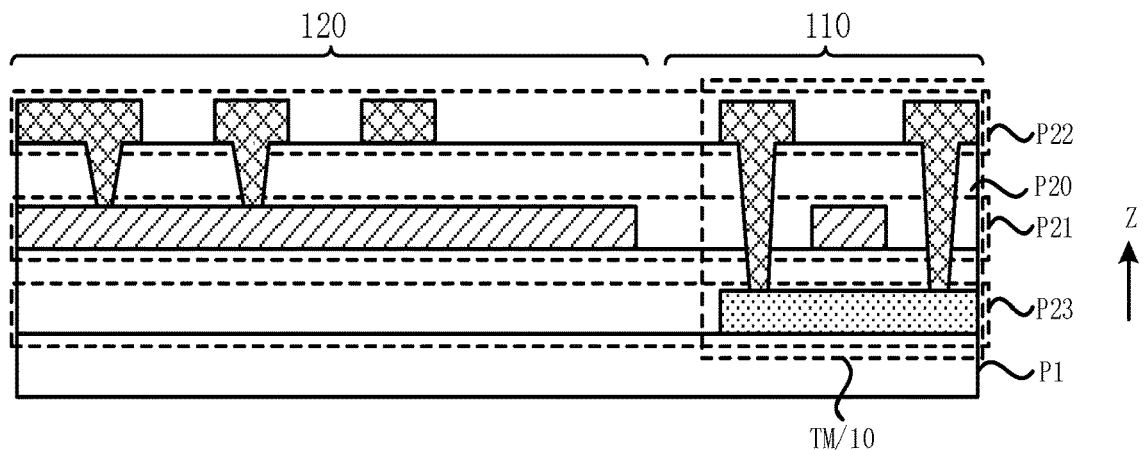
FIG. 33 is another schematic diagram of films of a display panel according to an embodiment of the present disclosure.

In an embodiment, FIG. 32 is another schematic diagram of films of a display panel according to an embodiment of the present disclosure. Referring to FIGS. 27 and 32, when the display panel 100 also includes the data signal lines 70, a first metal layer P21 may include lead-out lines 60, connection lines 40, and scan signal lines 20, and a second metal layer P21 may include jumpers 80 and data signal lines 70. In this way, it is feasible to simplify the manufacturing process of the display panel 100 and facilitate the low cost and miniaturization of the display panel 100. In some embodiments, FIG. 33 is another schematic diagram of films of a display panel according to an embodiment of the present disclosure. Referring to FIGS. 27 and 33, when the display panel 100 also includes the data signal lines 70, a first metal layer P21 may include both jumpers 80 and scan signal lines 20, and a second metal layer P21 may include lead-out lines 60, connection lines 40 and data signal lines 70. In this way, it is feasible to simplify the manufacturing process of the display panel 100 and facilitate the low cost and miniaturization of the display panel 100.

It is to be understood that various forms of the display panel shown above may be used, and structures known to those skilled in the art may be recombined, added, or deleted. For example, the display panel described in the present disclosure may also include multiple reset signal lines and multiple power signal lines as long as the desired results of the solutions of the present disclosure can be achieved, and no limitation is imposed herein.

Embodiments of the present disclosure also provide a display device. The display device includes the display panel described in any embodiment of the present disclosure. Therefore, the display device has the technical features of the display panel provided in the embodiments of the present disclosure and can achieve the beneficial effects of the display panel provided in the embodiments of the present disclosure. Similarities may be referred to the preceding description of the display panel provided in the embodiments of the present disclosure and are not repeated herein.

Figure 34:
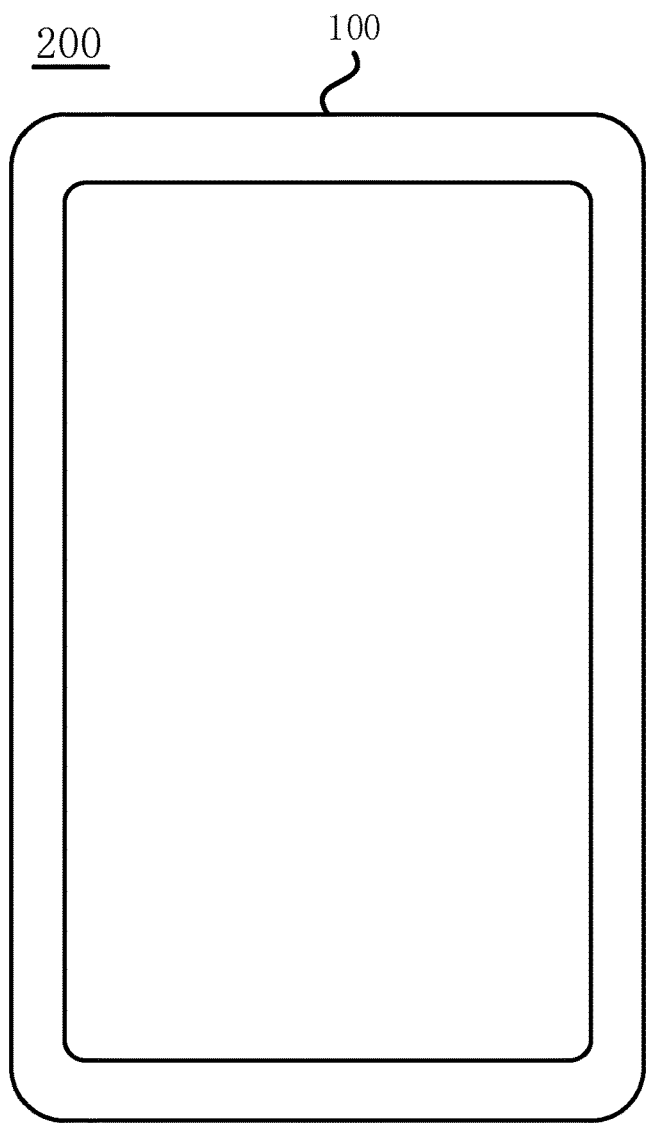
FIG. 34 is a schematic diagram of a display device according to an embodiment of the present disclosure.

In an example, FIG. 34 is a schematic diagram of a display device according to an embodiment of the present disclosure. As shown in FIG. 34, the display device 200 includes a display panel 100. The display device 200 provided in the embodiments of the present disclosure may be any electronic product with a display function, including but not limited to: a phone, a television, a laptop, a desktop display, a tablet computer, a digital camera, a smart bracelet, smart glasses, an in-vehicle display, industry-controlling equipment, a medical display, a touch interactive terminal, etc. No special limitations are made thereto in the embodiments of the present disclosure.

What is claimed is:
1. A display panel, comprising:
a display region and a non-display region,
wherein the display region comprises a plurality of display units arranged in an array and a plurality of scan signal lines, wherein at least two of the plurality of display units in a same row share a respective one of the plurality of scan signal lines; and
the non-display region comprises a shift register circuit and a plurality of connection lines, wherein the shift register circuit comprises a plurality of cascaded shift register unit groups; each of the plurality of shift register unit groups comprises at least two shift register units; and each of the at least two shift register units comprises a signal input terminal, a reset control terminal, and a signal output terminal,
wherein each of the plurality of shift register unit groups comprises a first shift register unit and a second shift register unit, wherein among three consecutive shift register unit groups of the plurality of shift register unit groups, a signal output terminal of a first shift register unit in an (i+1)-th shift register unit group is electrically connected to a signal input terminal of each shift register unit in an (i+2)-th shift register unit group through a same connection line of the plurality of connection lines, and a signal output terminal of a second shift register unit in the (i+1)-th shift register unit group is electrically connected to a reset control terminal of each shift register unit in an i-th shift register unit group through a same connection line of the plurality of connection lines, and wherein i is a positive integer; and
wherein the signal output terminal of each of the at least two shift register units is electrically connected to a respective one of the plurality of scan signal lines, and a scan signal enable level output from the signal output terminal of each of the at least two shift register units is sequentially shifted.

2. The display panel according to claim 1, wherein a signal input terminal of each shift register unit in a first shift register unit group is configured to receive a start pulse signal through a same connection line of the plurality of connection lines, and a signal output terminal of a first shift register unit in the first shift register unit group is electrically connected to a signal input terminal of each shift register unit in a second shift register unit group through a same connection line of the plurality of connection lines; and

- a reset control terminal of each shift register unit in a last shift register unit group is configured to receive a reset pulse signal through a same connection line of the plurality of connection lines, and a signal output terminal of a second shift register unit in the last shift register unit group is electrically connected to a reset control terminal of each shift register unit in a previous shift register unit group through a same connection line of the plurality of connection lines.

3. The display panel according to claim 1, wherein each of the plurality of shift register unit groups comprises at least one third shift register unit, and a signal output terminal of each of the at least one third shift register unit is electrically connected to a respective one of the plurality of scan signal lines and is not electrically connected to a respective one of the plurality of connection lines.

4. The display panel according to claim 1, wherein the plurality of connection lines comprises first connection lines, and a signal input terminal of each shift register unit in a same shift register unit group is electrically connected to a same first connection line, wherein the first connection lines extend in a first direction and the first connection lines each electrically connected to each shift register unit in different shift register unit groups are insulated from each other; in the first direction, first connection lines electrically connected to each shift register unit in the i-th shift register unit group overlaps at least two of first connection lines electrically connected to each shift register unit in a j-th shift register unit group, wherein i and j are both positive integers and i≠j; and the first direction intersects a row direction of the plurality of display units.

5. The display panel according to claim 1, wherein the plurality of connection lines comprises second connection lines; and a reset control terminal of each shift register unit in a same shift register unit group is electrically connected to a same second connection line, wherein the second connection lines extends in a first direction, and the second connection lines each electrically connected to each shift register unit in different shift register unit groups are insulated from each other, and each of the second connection lines and each of the first connection lines, connected to each shift register unit in a same shift register unit group, are insulated from each other; in the first direction, second connection lines electrically connected to each shift register unit in the i-th shift register unit group overlaps at least two of second connection lines electrically connected to each shift register unit in a j-th shift register unit group, wherein i and j are both positive integers and i≠j; and the first direction intersects a row direction of the plurality of display units.

6. The display panel according to claim 1, wherein in a same shift register unit group, the scan signal enable level output from each shift register unit is sequentially shifted; and in the same shift register unit group, a start time of the enable level of a scan signal output from the first shift register unit is before a start time of the enable level of a scan signal output from other shift register units of the at least two shift register units, and a start time of the enable level of a scan signal output from the second shift register unit is after a start time of the scan signal enable level output from other shift register units of the at least two shift register units.

7. The display panel according to claim 6, wherein the plurality of connection lines comprise first connection lines, second connection lines, third connection lines, and fourth connection lines;

in the same shift register unit group, the signal input terminal of each of the at least two shift register units is electrically connected to a same first connection line, and the reset control terminal of each of the at least two shift register units is electrically connected to a same second connection line; and the signal output terminal of the first shift register unit in the (i+1)-th shift register unit group is electrically connected to a first connection line electrically connected to each shift register unit in the (i+2)-th shift register unit group through a third connection line; and the signal output terminal of the second shift register unit in the (i+1)-th shift register unit group is electrically connected to second connection lines electrically connected to each shift register unit in the i-th shift register unit group through the fourth connection line, wherein the first connection lines, the second connection lines, the third connection lines, and the fourth connection lines all extend in a first direction; the first connection line, the second connection line, the third connection line, and the fourth connection line electrically connected to each shift register unit in a same shift register unit group are arranged in a second direction and are insulated from each other; and the second direction intersects the first direction and is parallel to a row direction of the plurality of display units.

8. The display panel according to claim 7, wherein in the first direction, a first connection line electrically connected to a signal input terminal of each shift register unit in the i-th shift register unit group overlaps a first connection line electrically connected to a signal input terminal of each shift register unit in the (i+2)-th shift register unit group;

in the first direction, a second connection line electrically connected to the reset control terminal of each shift register unit in the i-th shift register unit group overlaps a second connection line electrically connected to a reset control terminal of each shift register unit in the (i+2)-th shift register unit group; and in the first direction, a first connection line and a third connection line that are electrically connected to each other overlap, and a second connection line and a fourth connection that are electrically connected to each other overlap each other.

9. The display panel according to claim 7, wherein the plurality of connection lines further comprise fifth connection lines and sixth connection lines, wherein in a thickness direction of the display panel, the fifth connection lines and the sixth connection lines do not overlap each other, the fifth connection lines and the sixth connection lines both extend in a third direction, and the third direction intersects both the first direction and the second direction;

a first connection line is electrically connected to a third connection line through a fifth connection line, and in the first direction, the first connection line and the third connection line that are electrically connected to each other do not overlap each other; and a second connection line is electrically connected to a fourth connection line through a sixth connection line, and in the first direction, the second connection line and the fourth connection line that are electrically connected to each other do not overlap each other.

10. The display panel according to claim 9, wherein in the first direction, first connection lines electrically connected to each shift register unit in different shift register unit groups overlap each other, second connection lines electrically connected to each shift register units in different shift register unit groups overlap each other, third connection lines electrically connected to first shift register units in different shift register unit groups overlap each other, and fourth connection lines electrically connected to second shift register units in different shift register unit groups overlap each other.

11. The display panel according to claim 1, wherein in a same shift register unit group, the first shift register unit is also served as the second shift register unit.

12. The display panel according to claim 11, wherein the plurality of connection lines comprise first connection lines, second connection lines, and seventh connection lines;

in the same shift register unit group, the signal input terminal of each shift register unit is electrically connected to a same first connection line, and the reset control terminal of each of the at least two shift register units is electrically connected to a same second connection line; and the first shift register unit in the (i+1)-th shift register unit group is electrically connected to the first connection line electrically connected to each shift register unit in the (i+2)-th shift register unit group through a seventh connection line, and the first shift register unit in the (i+1)-th shift register unit group is electrically connected to a second connection line electrically connected to each shift register unit in the i-th shift register unit group through a seventh connection line, wherein the first connection lines, the second connection lines, and the seventh connection lines all extend in a first direction; and first connection lines, second connection lines, and seventh connection lines that are electrically connected to each shift register unit in a same shift register unit group are arranged in a second direction and are insulated from each other, wherein the second direction intersects the first direction and is parallel to a row direction of the plurality of display units.

13. The display panel according to claim 12, wherein in the first direction, a first connection line electrically connected to a signal input terminal of each shift register unit in the i-th shift register unit group overlaps a first connection line electrically connected to a signal input terminal of each shift register unit in an (i+3)-th shift register unit group;

in the first direction, a second connection line electrically connected to the reset control terminal of each shift register unit in the i-th shift register unit group overlaps a second connection line electrically connected to a reset control terminal of each shift register unit in the (i+3)-th shift register unit group; and in the first direction, the first connection lines, the seventh connection lines, and the second connection lines that are electrically connected to each other overlap each other.

14. The display panel according to claim 12, wherein the plurality of connection lines comprise eighth connection lines and ninth connection lines;

in a thickness direction of the display panel, the eighth connection lines and the ninth connection lines do not overlap each other, the eighth connection lines and the ninth connection lines both extend in a third direction, and the third direction intersects both the first direction and the second direction; and a first connection line is electrically connected to a seventh connection line through an eighth connection line, and a seventh connection line is electrically connected to a second connection line through a ninth connection line; and in the first direction, the first connection lines, the seventh connection lines, and the second connection lines that are electrically connected to each other do not overlap each other.

15. The display panel according to claim 14, wherein in the first direction, first connection lines electrically connected to each shift register unit in different shift register unit groups overlap each other, second connection lines electrically connected to each shift register unit in different shift register unit groups overlap each other, and seventh connection lines electrically connected to first shift register units in different shift register unit groups overlap each other.

16. The display panel according to claim 11, wherein the scan signal enable level output from each shift register unit in the same shift register unit group is sequentially shifted;

in a case where each of the shift register unit groups comprises N shift register units, the first shift register unit in a shift register unit group is a M-th shift register unit that outputs the scan signal enable level, wherein N is a positive integer greater than or equal to 2, and M is a natural number less than N; and in response to N being an even number, M=(N/2) or M=(N/2+1); or in response to N being an odd number, M=(N+1)/2.

17. The display panel according to claim 1, wherein each shift register unit comprises a clock signal terminal;

in a same shift register unit, in a case where an input signal from the signal input terminal is an enable level, a clock signal from the clock signal terminal is transmitted to the signal output terminal; and in a case where a reset control signal from the reset control terminal is an enable level, the clock signal from the clock signal terminal is not transmitted to the signal output terminal; and in one clock cycle, an enable level of the clock signal received by each shift register unit in a same shift register unit group is sequentially shifted.

18. The display panel according to claim 17, wherein a period of the enable level of the clock signal received by the first shift register unit in the (i+1)-th shift register unit group does not overlap a period of the enable level of the clock signal received by each shift register unit in the (i+2)-th shift register unit group, and a period of the enable level of the clock signal received by the second shift register unit in the (i+1)-th shift register unit group does not overlap a period of the enable level of the clock signal received by each shift register unit in the i-th shift register unit group.

19. The display panel according to claim 17, wherein in the same shift register unit group, a shift amount of the enable level of the clock signal received by each shift register unit is greater than or equal to a width of the enable level of the clock signal; and an end time of the enable level of the clock signal received by each shift register unit in the i-th shift register unit group is before a start time of the enable level of the clock signal received by each shift register unit in the (i+1)-th shift register unit group.

20. The display panel according to claim 17, wherein in the same shift register unit group, a shift amount of the enable level of the clock signal received by each shift register unit is less than a width of the enable level of the clock signal;
in the same shift register unit group, a shift register unit that first outputs the scan signal enable level is a first shift register unit, and a shift register unit that last outputs the scan signal enable level is a second shift register unit; and
an end time of the enable level of the clock signal received by a second shift register unit in the i-th shift register unit group is after a start time of the enable level of the clock signal received by a first shift register unit in the (i+1)-th shift register unit group and the end time of the enable level of the clock signal received by the second shift register unit in the i-th shift register unit group is before an end time of the enable level of the clock signal received by the first shift register unit in the (i+1)-th shift register unit group.

21. The display panel according to claim 17, wherein the non-display region comprises a plurality of clock signal line groups, and each of the plurality of clock signal line groups comprises a plurality of clock signal lines;
the clock signal terminal of each shift register unit in the same shift register unit group is electrically connected to each of the plurality of clock signal lines in a same clock signal line group of the plurality of clock signal line groups in a one to one correspondence; and
a clock signal line electrically connected to each shift register unit in the i-th shift register unit group is also served as a clock signal line electrically connected to each shift register unit in the (i+2)-th shift register unit group, and each shift register unit in the i-th shift register unit group and each shift register unit in the (i+1)-th shift register unit group are electrically connected to different ones of the plurality of clock signal lines, respectively.

22. The display panel according to claim 1, wherein each of the at least two shift register units comprises one lead-out line group, wherein each lead-out line group comprises a first lead-out line, a second lead-out line, and a third lead-out line; the first lead-out line, the second lead-out line, and the third lead-out line are arranged in a first direction and each extends in a second direction; and the second direction intersects the first direction and is parallel to a row direction of the plurality of display units; and
the first lead-out line is served as the signal input terminal of the shift register unit, the second lead-out line is served as the signal output terminal of the shift register unit, and the third lead-out line is served as the reset control terminal of the shift register unit.

23. The display panel according to claim 22, comprising:
a base substrate; and
a first metal layer and a second metal layer insulatedly spaced apart from each other and located on a side of the base substrate,
wherein the first metal layer comprises the plurality of connection lines; the second metal layer comprises the lead-out lines; and a lead-out line of the lead-out lines is electrically connected to a respective one of the plurality of connection lines through a via.

24. The display panel according to claim 22, wherein the non-display region comprises a plurality of jumpers extending in the second direction; and
the display panel comprises:
a base substrate; and
a first metal layer and a second metal layer insulatedly spaced apart from each other and located on a side of the base substrate,
wherein the first metal layer comprises the plurality of connection lines and the lead-out lines; the second metal layer comprises the plurality of jumpers; and at least two of lead-out lines and at least two of connection lines are electrically connected through the plurality of jumpers, a lead-out line of the at least two of the lead-out lines is electrically connected to a respective one of the plurality of jumpers through a first via, and the respective one of the plurality of jumpers is electrically connected to a respective one of the at least two of the connection lines through a second via.

25. The display panel according to claim 23, wherein the display region comprises a plurality of data signal lines, wherein at least two of the plurality of display units located in a same column share a respective one of the plurality of data signal lines;
the first metal layer comprises the plurality of scan signal lines, and the second metal layer comprises the plurality of data signal lines; or
the first metal layer comprises the plurality of data signal lines, and the second metal layer comprises the plurality of scan signal lines.

* * * * *